United States Patent
Jinbo et al.

(10) Patent No.: US 8,823,023 B2
(45) Date of Patent: Sep. 2, 2014

(54) METHOD FOR MANUFACTURING SEMICONDUCTOR DEVICE

(75) Inventors: Yasuhiro Jinbo, Atsugi (JP); Masafumi Morisue, Kawasaki (JP); Hajime Kimura, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/542,693

(22) Filed: Jul. 6, 2012

(65) Prior Publication Data

US 2012/0274879 A1    Nov. 1, 2012

Related U.S. Application Data

(63) Continuation of application No. 11/705,828, filed on Feb. 14, 2007, now Pat. No. 8,222,116.

(30) Foreign Application Priority Data

Mar. 3, 2006 (JP) ................................ 2006-058513

(51) Int. Cl.
*H01L 29/18* (2006.01)
*H01L 33/00* (2010.01)
*H01L 27/12* (2006.01)

(52) U.S. Cl.
CPC ........ *H01L 27/1266* (2013.01); *H01L 27/1214* (2013.01)
USPC .................... 257/88; 257/81; 438/28; 438/66

(58) Field of Classification Search
USPC ................ 257/88, 99, 676, 81, 431; 315/291; 438/455, 28, 66
See application file for complete search history.

(56) References Cited

U.S. PATENT DOCUMENTS 4,409,134 A    10/1983    Yamazaki
5,670,797 A    9/1997    Okazaki
(Continued)

FOREIGN PATENT DOCUMENTS

CN    2415462 Y    1/2001
CN    1558451    12/2004
(Continued)

OTHER PUBLICATIONS

Ian French et al., "Thin Plastic Electrophoretic Displays Fabricated by a Novel Process," SID Digest '05, 2005, pp. 1634-1637.

(Continued)

*Primary Examiner* — Errol Fernandes
(74) *Attorney, Agent, or Firm* — Eric J. Robinson; Robinson Intellectual Property Law Office, P.C.

(57) ABSTRACT

The present invention provides a manufacturing technique of a semiconductor device and a display device using a peeling process, in which a transfer process can be conducted with a good state in which a shape and property of an element before peeling are kept. Further, the present invention provides a manufacturing technique of more highly reliable semiconductor devices and display devices with high yield without complicating the apparatus and the process for manufacturing. According to the present invention, an organic compound layer including a photocatalyst substance is formed over a first substrate having a light-transmitting property, an element layer is formed over the organic compound layer including a photocatalyst substance, the organic compound layer including a photocatalyst substance is irradiated with light which has passed through the first substrate, and the element layer is peeled from the first substrate.

30 Claims, 39 Drawing Sheets

(56) References Cited

U.S. PATENT DOCUMENTS

| | | |
|---|---|---|
| 5,814,837 A | 9/1998 | Okazaki |
| 5,826,162 A | 10/1998 | Aral et al. |
| 5,834,327 A | 11/1998 | Yamazaki et al. |
| 5,882,949 A | 3/1999 | Okazaki |
| 6,100,166 A | 8/2000 | Sakaguchi et al. |
| 6,127,199 A | 10/2000 | Inoue et al. |
| 6,335,479 B1 | 1/2002 | Yamada et al. |
| 6,372,608 B1 | 4/2002 | Shimoda et al. |
| 6,379,792 B1 | 4/2002 | Isshiki et al. |
| 6,521,511 B1 | 2/2003 | Inoue et al. |
| 6,627,518 B1 | 9/2003 | Inoue et al. |
| 6,645,830 B2 | 11/2003 | Shimoda et al. |
| 6,700,631 B1 | 3/2004 | Inoue et al. |
| 6,814,832 B2 | 11/2004 | Utsunomiya |
| 6,818,530 B2 | 11/2004 | Shimoda et al. |
| 6,825,099 B2 | 11/2004 | Yanagita et al. |
| 6,867,067 B2 | 3/2005 | Ghyselen et al. |
| 6,878,607 B2 | 4/2005 | Inoue et al. |
| 6,885,389 B2 | 4/2005 | Inoue et al. |
| 6,887,650 B2 | 5/2005 | Shimoda et al. |
| 6,947,321 B2 | 9/2005 | Tanabe |
| 7,067,392 B2 | 6/2006 | Yamazaki et al. |
| 7,084,045 B2 | 8/2006 | Takayama et al. |
| 7,094,665 B2 | 8/2006 | Shimoda et al. |
| 7,147,740 B2 | 12/2006 | Takayama et al. |
| 7,169,652 B2 | 1/2007 | Kimura |
| 7,202,597 B2 | 4/2007 | Sakurai |
| 7,341,924 B2 | 3/2008 | Takayama et al. |
| 7,420,208 B2 | 9/2008 | Yamazaki et al. |
| 7,575,965 B2 | 8/2009 | Kuwabara et al. |
| 2003/0087073 A1 | 5/2003 | Kobayashi |
| 2003/0217805 A1 | 11/2003 | Takayama et al. |
| 2004/0063294 A1* | 4/2004 | Durocher et al. ............ 438/382 |
| 2004/0075399 A1* | 4/2004 | Hall ............................. 315/291 |
| 2004/0079941 A1 | 4/2004 | Yamazaki et al. |
| 2004/0129960 A1 | 7/2004 | Maruyama et al. |
| 2005/0127371 A1 | 6/2005 | Yamazaki et al. |
| 2006/0055309 A1* | 3/2006 | Ono et al. .................... 313/492 |
| 2006/0231527 A1 | 10/2006 | Takayama et al. |
| 2007/0171142 A1 | 7/2007 | Ikarashi et al. |
| 2007/0207571 A1 | 9/2007 | Morisue et al. |
| 2009/0279012 A1 | 11/2009 | Kuwabara et al. |

FOREIGN PATENT DOCUMENTS

| | | |
|---|---|---|
| EP | 0924769 | 6/1999 |
| EP | 1014452 | 6/2000 |
| EP | 1 381 054 | 1/2004 |
| EP | 1686626 A | 8/2006 |
| JP | 07-311391 A | 11/1995 |
| JP | 10-125929 | 5/1998 |
| JP | 10-125931 | 5/1998 |
| JP | 11-026733 A | 1/1999 |
| JP | 11-312811 A | 11/1999 |
| JP | 2001-127149 A | 5/2001 |
| JP | 2001-148517 A | 5/2001 |
| JP | 2001-260597 | 9/2001 |
| JP | 2002-026282 | 1/2002 |
| JP | 2003-098977 | 4/2003 |
| JP | 2004-047791 | 2/2004 |
| JP | 2004-214281 | 7/2004 |
| JP | 2004-253483 A | 9/2004 |
| JP | 2006-011239 A | 1/2006 |
| KR | 2005-0020936 A | 3/2005 |
| WO | WO 2005/059990 | 6/2005 |

OTHER PUBLICATIONS

Office Action (Application No. 200710084421.7) dated Dec. 4, 2009.
Chinese Office Action (Application No. 201110044298.2) dated Mar. 6, 2012.
Chinese Office Action (Application No. 201110044298.2) Dated Nov. 5, 2012.
Korean Office Action (Application No. 2013-01082101) Dated Dec. 10, 2013.
Korean Office Action (Application No. 2013-0108210) Dated Dec. 10, 2013.
Korean Office Action (Application No. 2007-0020977) Dated Jul. 11, 2013.

* cited by examiner

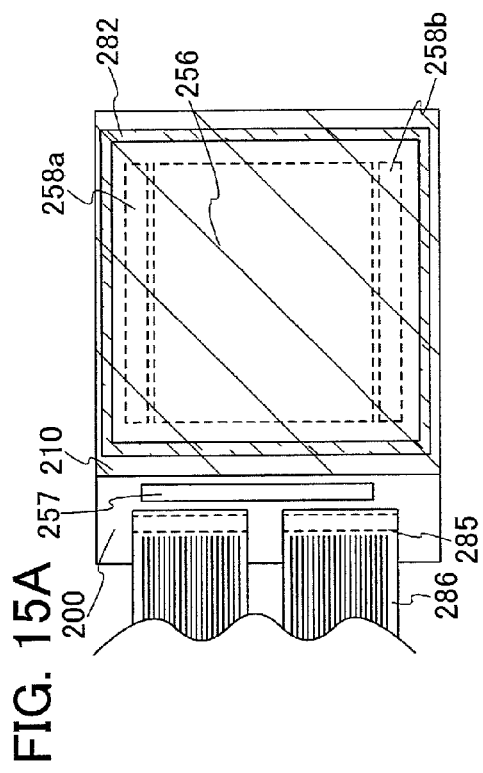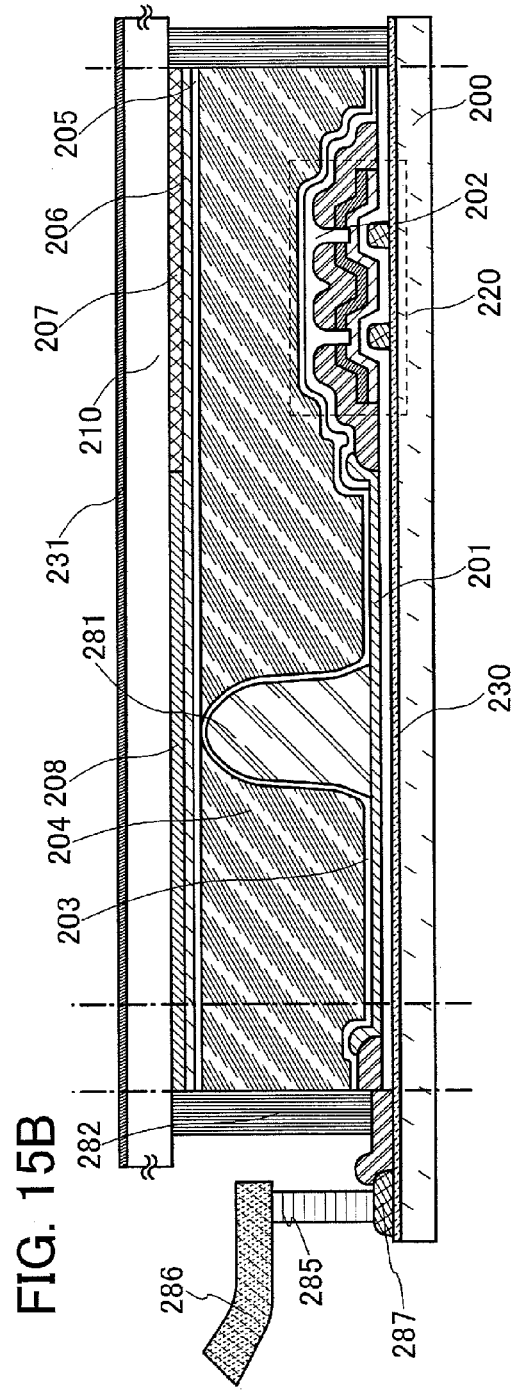
FIG. 15A
FIG. 15B

190

191

197

193

196

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

In recent years, individual recognition technology has attracted attention. For example, there is a technology which is used for production and management, in which an ID (an individual recognition code) is given to an individual object to clarify information such as a history of the object. Above all, the development of semiconductor devices that can send and receive data without contact has been advanced. As such semiconductor devices, in particular, an RFID (Radio Frequency Identification) tag (also referred to as an ID tag, an IC tag, IC chip, an RF (Radio Frequency) tag, a wireless tag, an electronic tag, or a wireless chip) has begun to be used in companies, markets, and the like.

Many of such semiconductor devices each have a circuit using a semiconductor substrate such as a Si substrate (also referred to as an IC (Integrated Circuit) chip) and an antenna, and the IC chip includes a memory circuit (also referred to as a memory), a control circuit, or the like.

In addition, semiconductor devices such as a liquid crystal display device and an electroluminescent display device, in which thin film transistors (hereinafter also referred to as TFTs) are integrated over a glass substrate, have been developed. In each of such semiconductor devices, a thin film transistor is formed over a glass substrate by using a technique for forming a thin film, and a liquid crystal element or a light-emitting element (an electroluminescent element, hereinafter also referred to as an EL element) is formed as a display element over various circuits composed of the thin film transistors, so that the device functions as a semiconductor device.

In a manufacturing process of such semiconductor devices, in order to reduce manufacturing cost, a process of transferring an element, a peripheral circuit, or the like manufactured over a glass substrate onto an inexpensive substrate such as a plastic substrate has been performed (e.g., see Reference 1: Japanese Published Patent Application No. 2002-26282).

SUMMARY OF THE INVENTION

There is, however, a problem in that an element may be broken in an element layer to be transferred, because the element layer is not peeled off well from a glass substrate due to the low adhesiveness between thin films forming the element. In other words, it is difficult to transfer the element layer with a good state in which a shape and property of the element before peeling are kept.

The present invention has been made in view of the above described problems. The present invention provides a manufacturing technique of a semiconductor device and a display device using a peeling process, in which a transfer process can be conducted with a good state in which a shape and property of the element before peeling are kept. Therefore, it is an object of the present invention to provide a manufacturing technique of more highly reliable semiconductor devices and display devices with high yield without complicating the apparatus and the process for manufacturing.

According to the present invention, when an element layer is feinted over a substrate, an organic compound layer including a substance having a photocatalyst function (hereinafter, also referred to as a photocatalyst substance) is provided between the substrate and the element layer. The photocatalyst substance absorbs light, and thus, the photocatalyst substance is activated by the light. The activation energy acts on peripheral organic compound, and as a result, changes and modifies properties of the organic compound. In other words, by the energy of the activated photocatalyst substance (oxidizability), a carbon-hydrogen bond and a carbon-carbon bond of such organic compound are separated, and a part of the organic compound becomes carbon dioxide and water, and is degassed. Consequently, the organic compound layer including a photocatalyst substance becomes rough and is separated (sectioned) to the element layer side and the substrate side within the layer. Accordingly, the element layer can be peeled from the substrate.

According to the present invention, by dispersing a photocatalyst substance in an organic compound layer, the organic compound is decomposed (broken) by a photocatalyst function of the photocatalyst substance and the organic compound layer is made rough, thereby peeling the element layer from the substrate. Thus, since it is unnecessary to apply a large amount of power to the element layer in order to peel it, there are no problems in that a film is peeled at an interface between layers in the peeling process and the element is broken, and transferring the element is not conducted in a good shape. In this specification, "good shape" indicates a state in which a shape before peeling is kept and damages in appearance such as film peeling or remaining portion are not caused, or a state in which properties before peeling are kept without causing reduction in electric characteristics or reliability of the element. Also in this specification, "transfer" means to peel an element layer formed over a first substrate from the first substrate and to transpose it over a second substrate. In other words, it can also indicate that a place provided with the element layer is moved to another substrate.

In the present invention, a flexible counter substrate to be transferred may be attached after irradiating a photocatalyst substance with light, or the photocatalyst substance may be irradiated with light after attaching the substrate to be transferred to the element layer.

Note that in the present invention, "semiconductor device" indicates general devices which can function using semiconductive properties. In accordance with the present invention, devices including a circuit including a semiconductor element (such as a transistor or a diode) or semiconductor devices such as processor chips can be manufactured.

The present invention can be used for a display device that is a device having a display function. The display device using the present invention includes, in its category, a light-emitting display device where a TFT is connected to a light-emitting element in which a layer containing an organic material, an inorganic material or a mixture of organic and inorganic materials which exhibits light emission called electroluminescence (hereinafter also referred to as "EL"), is interposed between electrodes, a liquid crystal display device using a liquid crystal element including a liquid crystal material as a display element, and the like. In the present invention, a "display device" means devices having display elements (e.g., liquid crystal elements or light-emitting elements). Note that the display device also includes a display panel itself where a plurality of pixels including a display element such as a liquid crystal element or an EL element, and/or a peripheral driver circuit for driving the pixels are formed over a substrate. Further, it may include a flexible printed circuit (FPC) or a printed wiring board (PWB) attached to a display panel (e.g., an IC, a resistor element, a capacitor element, an inductor, or a transistor). Such display devices may also include an optical sheet such as a polarizing plate or a retardation plate. Further, it may include a backlight (which may include a light guide plate, a prism sheet, a diffusion sheet, a reflective sheet, and a light source (e.g., an TED or a cold-cathode tube)).

Note that a display element or a display device may be in various modes and may include various elements. For example, there are display media of which contrast changes by an electromagnetic function, such as EL elements (e.g., organic EL elements, inorganic EL elements, or EL elements containing both organic and inorganic materials), electron-emissive elements, liquid crystal elements, electronic inks, grating light valves (GLV), plasma displays (PDP), digital micromirror devices (DMD), piezoceramic displays, and carbon nanotubes. In addition, display devices using an EL element include EL displays; display devices using an electron-emissive element include field emission displays (FED), surface-conduction electron-emitter displays (SED), and the like; display devices using a liquid crystal element include liquid crystal displays, transmissive liquid crystal displays, semi-transmissive liquid crystal displays, and reflective liquid crystal displays; and display devices using electronic ink include electronic papers.

One feature of the present invention is a method for manufacturing a semiconductor device, comprising the steps of forming an organic compound layer including a photocatalyst substance over a first substrate having a light-transmitting property; forming an element layer over the organic compound layer including a photocatalyst substance; irradiating the organic compound layer including a photocatalyst substance with light which has passed through the first substrate; and separating the element layer from the first substrate.

One feature of the present invention is a method for manufacturing a semiconductor device, comprising the steps of: forming an organic compound layer including a photocatalyst substance over a first substrate having a light-transmitting property; forming an insulating layer over the organic compound layer including a photocatalyst substance; forming an element layer over the insulating layer; irradiating the organic compound layer including a photocatalyst substance with light which has passed through the first substrate; and separating the element layer and the insulating layer from the first substrate.

One feature of the present invention is a method for manufacturing a semiconductor device, comprising the steps of forming an organic compound layer including a photocatalyst substance over a first substrate having a light-transmitting property; forming an element layer over the organic compound layer including a photocatalyst substance; irradiating the organic compound layer including a photocatalyst substance with light which has passed through the first substrate; attaching a second substrate to the element layer; and separating the element layer from the first substrate to the second substrate.

One feature of the present invention is a method for manufacturing a semiconductor device, comprising the steps of forming an organic compound layer including a photocatalyst substance over a first substrate having a light-transmitting property; forming an insulating layer over the organic compound layer including a photocatalyst substance; forming an element layer over the insulating layer; irradiating the organic compound layer including a photocatalyst substance with light which has passed through the first substrate; attaching a second substrate to the element layer; and separating the element layer and the insulating layer from the first substrate to the second substrate.

One feature of the present invention is a method for manufacturing a semiconductor device, comprising the steps of forming an organic compound layer including a photocatalyst substance over a first substrate having a light-transmitting property; forming an element layer over the organic compound layer including a photocatalyst substance; irradiating the organic compound layer including a photocatalyst substance with light which has passed through the first substrate; attaching a second substrate to the element layer; separating the element layer from the first substrate to the second substrate; and attaching the element layer to a third substrate by an adhesive layer.

One feature of the present invention is a method for manufacturing a semiconductor device, comprising the steps of forming an organic compound layer including a photocatalyst substance over a first substrate having a light-transmitting property; forming an insulating layer over the organic compound layer including a photocatalyst substance; forming an element layer over the insulating layer; irradiating the organic compound layer including a photocatalyst substance with light which has passed through the first substrate; attaching a second substrate to the element layer; separating the element layer and the insulating layer from the first substrate to the second substrate; and attaching the element layer to a third substrate by an adhesive layer.

In the above structures, after separating the element layer from the first substrate, a third substrate attached to the element layer side may be formed from a material which does not transmit light in a wavelength which activates the photocatalyst substance left in the element layer. In addition, when the second substrate and the third substrate are flexible substrates, resin films or the like, semiconductor devices or display devices having flexibility can be manufactured.

In the present invention, by dispersing the photocatalyst substance into the organic compound layer, the organic compound is decomposed (broken) by a photocatalyst function of the photocatalyst substance and the organic compound layer is made rough, thereby peeling the element layer from the substrate. Thus, since it is unnecessary to apply a large amount of power to the element layer in order to peel it, the element layer can be easily and freely transferred to various types of substrates in a good shape state, without breaking the element in the peeling process.

According to the present invention, a semiconductor device and a display device can be manufactured using a peeling process, in which a transfer process can be conducted with a good state in which a shape and property of the element before peeling is kept. Therefore, more highly reliable semiconductor devices and display devices can be manufactured with high yield without complicating the apparatus and the process for manufacturing.

BRIEF DESCRIPTION OF THE DRAWINGS

In the accompanying drawings.

FIGS. 15A and 15B are a top view and a cross-sectional view of a display device according to an aspect of the present invention;

DETAILED DESCRIPTION OF THE INVENTION

Embodiment Modes

Figure 1A:
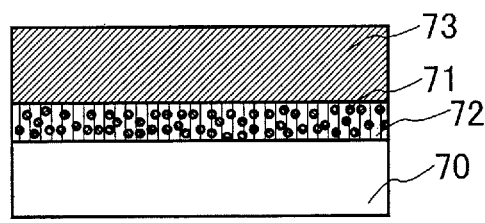
FIGS. 1A to 1D show an aspect of the present invention.

Hereinafter, Embodiment Modes of the present invention will be described with reference to the drawings. Note that the present invention can be carried out in many different modes. It is easily understood by those skilled in the art that modes and details disclosed herein can be modified in various ways without departing from the spirit and the scope of the present invention. Therefore, it should be noted that the present invention should not be interpreted as being limited to the description of the embodiment modes given below. Note that like portions or portions having a like function are denoted by the same reference numerals through drawings, and therefore, description thereon is omitted.

Embodiment Mode 1

An embodiment mode of the present invention is described with reference to FIGS. 1A to 1D.

According to the present invention, when an element layer is formed over a substrate, an organic compound layer including a substance having a photocatalyst function (hereinafter, also a photocatalyst substance) is provided between the substrate and the element layer. The photocatalyst substance absorbs light, and thus, the photocatalyst substance is activated by the light. The activation energy acts on peripheral organic compound, and as a result, changes and modifies properties of the organic compound. In other words, by the energy of the activated photocatalyst substance (oxidizability), a carbon-hydrogen bond and a carbon-carbon bond of such organic compound are separated, and a part of the organic compound becomes carbon dioxide and water, and is degassed. Consequently, the organic compound layer including a photocatalyst substance becomes rough and is separated (sectioned) to the element layer side and the substrate side within the layer. Accordingly, the element layer can be peeled from the substrate.

According to the present invention, by dispersing a photocatalyst substance in an organic compound layer, the organic compound is decomposed (broken) by a photocatalyst function of the photocatalyst substance and the organic compound layer is made rough, thereby peeling the element layer from the substrate. Thus, since it is unnecessary to apply a large amount of power to the element layer in order to peel it, there are no problems in that a film is peeled at an interface between layers in the peeling process and the element is broken, and transferring the element is not conducted in a good shape. In this specification, "good shape" indicates a state in which a shape before peeling is kept, and damages in appearance such as film peeling or remaining portion are not caused, or a state in which properties before peeling is kept without causing reduction in electric characteristics or reliability of the element. Also in this specification, "transfer" means to peel an element layer formed over a first substrate from the first substrate and to transpose it over a second substrate. In other words, it can also indicate that a place provided with the element layer is moved to another substrate.

In FIGS. 1A to 1D, an organic compound layer 72 including a photocatalyst substance is provided between a first substrate 70 and an element layer 73. As the first substrate 70, an appropriate substrate may be selected, which is suitable for conditions in a manufacturing process, in other words, which can withstand a process (such as a heat treatment) in forming a thin film transistor included in the element layer 73, or an element such as a display element (light-emitting element (such as organic EL element or inorganic EL element) or liquid crystal display element). A photocatalyst substance 71 is included in the organic compound layer 72. The photocatalyst substance may have any shape such as a granular shape, a pillar shape, a needle shape or a plate shape, and plural particles of a photocatalyst substance aggregate together and form an assembly as a simple body.

Hereinafter, an example of forming the organic compound layer 72 including a photocatalyst substance is described. The photocatalyst substance 71 is dispersed in a solution containing an organic compound. The solution may be stirred such that the photocatalyst substance 71 is evenly dispersed in the solution containing an organic compound. The viscosity of the solution may be determined as appropriate so as to obtain a desired thickness as a layer, while keeping fluidity. The organic compound also has a function of keeping the dispersed state of the granular shaped photocatalyst substance and holding the mixture as a shape of a layer.

The solution containing an organic compound in which the photocatalyst substance 71 is dispersed is attached to the first substrate 70 by a wet process such as a printing method, and dried so as to be solidified, thereby forming the organic compound layer 72 including a photocatalyst substance. The solvent is removed by being evaporated, and the organic compound and the photocatalyst substance 71 are included in the organic compound layer 72. The photocatalyst substance 72 is evenly dispersed and fixed due to the organic compound, in the organic compound layer 72 including a photocatalyst substance.

As a formation method of the organic compound layer 72 including a photocatalyst substance, a droplet-discharging method or a printing method (such as screen printing or offset printing) capable of selectively forming the organic compound layer including a photocatalyst substance, a coating method such as a spin coating method, a dipping method, a dispenser method, or the like can be used. There are no particular limitations on a film thickness of the organic compound layer 72 including a photocatalyst substance. Further, in the organic compound layer including a photocatalyst substance, the photocatalyst substance is preferably included at rate of greater than or equal to 10 wt % and less than or equal to 90 wt %, although the photocatalyst substance is included at any rate. This rate may be determined as appropriate since it is influenced by a photocatalyst function property of the photocatalyst substance, intensity of light irradiation, or strength of the organic compound to be decomposed. In addition, there are no particular limitations on the shape of the photocatalyst substance included in the organic compound layer. Minute photocatalyst substances which are smaller than the film thickness may be included dispersedly in the organic compound layer, or granular shaped photocatalyst substances having almost the same size as the film thickness may be covered with the organic compound and attached, which form a shape of a layer. Moreover, the sizes of the included photocatalyst substances are not necessarily uniform, and plural photocatalyst substances having different sizes may be mixed in the organic compound layer.

Through the above described process, the element layer 73 is formed over the organic compound layer 72 including a photocatalyst substance (FIG. 1A).

After that, light 77 is emitted from a light source 76 from the light-transmitting first substrate 70 side, and the light 77 passes through the first substrate 70, thereby irradiating the photocatalyst substance 71 with light 77.

There are no particular limitations on the used light, and it is possible to use any one of infrared light, visible light and ultraviolet light or a combination thereof. For example, light emitted from an ultraviolet lamp, a black light, a halogen lamp, a metal halide lamp, a xenon arc lamp, a carbon arc lamp, a high pressure sodium lamp, or a high pressure mercury lamp may be used. In such a case, a lamp light source may be lightened for a required period of time for irradiation or light may be emitted a plurality of times for irradiation.

In addition, laser light may also be used as the light. As a laser oscillator, a laser oscillator capable of emitting ultraviolet light, visible light, or infrared light can be used. As the laser oscillator, an excimer laser such as a KrF excimer laser, an ArF excimer laser, a XeCl excimer laser, or a Xe excimer laser; a gas laser such as a He laser, a He—Cd laser, an Ar laser, a He—Ne laser, or a HF laser; a solid-state laser using a crystal such as YAG, $GdVO_4$, $YVO_4$, YLF, or $YAlO_3$ doped with Cr, Nd, Er, Ho, Ce, Co, Ti, or Tm; or a semiconductor laser such as a GaN laser, a GaAs laser, a GaAlAs laser, or an InGaAsP laser can be used. As for the solid-state laser, it is preferable to use the first to fifth harmonics of the fundamental wave. In order to adjust the shape or path of laser light emitted from the laser oscillator, an optical system including a shutter, a reflector such as a mirror or a half minor, a cylindrical lens, a convex lens, or the like may be provided.

It is to be noted that laser irradiation may be selectively performed by moving a substrate or may be performed by scanning of the light in the X- and Y-axis directions. In this case, a polygon mirror or a galvanometer mirror is preferably used for the optical system.

In addition, a combination of light emitted from a lamp light source and laser light can also be used as the light. A region where exposure is performed for the relatively wide range may be irradiated with the use of a lamp, and only a region where high definition exposure is performed may be irradiated with laser light. Further, by light irradiation performed in such a manner, throughput can be improved.

The photocatalyst substance 71 absorbs the light 77, and the photocatalyst substance is activated by the light 77. The activation energy acts on the peripheral organic compound included in the organic compound layer 72 including a photocatalyst substance, and as a result, changes and modifies properties of the organic compounds. In other words, by the energy of the activated photocatalyst substance 71 (oxidizability), a carbon-hydrogen bond and a carbon-carbon bond of such organic compound are separated, and a part of the organic compound becomes carbon dioxide and water, and is degassed. Consequently, the organic compound layer 72 including a photocatalyst substance becomes rough, and thus, it becomes an organic compound layer 75 including a photocatalyst substance.

Figure 1B:
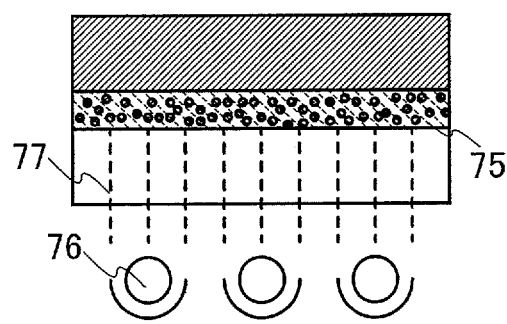
Figure 1C:
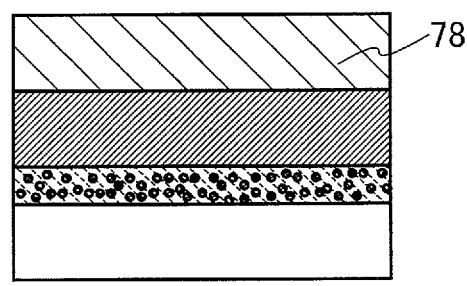
Figure 1D:
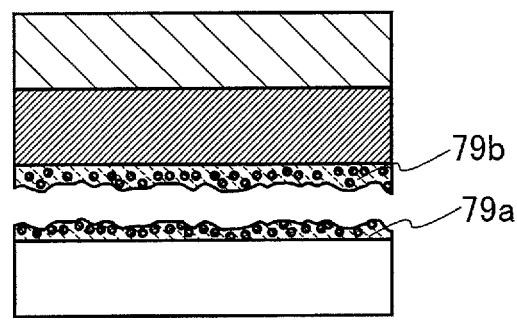

A second substrate 78 is provided over the element layer 73 (FIG. 1B). The second substrate may be attached to the element layer 73 by using an adhesive layer or the like, or a protective layer such as a resin layer may be directly formed over the element layer.

When power is applied to the second substrate 78 side so as to transfer the element layer 71, the strength of the organic compound layer 75 including a photocatalyst substance decreases, and thus, the organic compound layer 79b including a photocatalyst substance on the element layer side and the organic compound layer 79a including a photocatalyst substance on the substrate side are separated (sectioned) from each other within the layer. Accordingly, the element layer 71 can be peeled from the first substrate 70.

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate.

Accordingly, since elements can be transferred to various types of substrates as appropriate, a material for the substrate can be selected from a wider range of materials. In addition, an inexpensive material can be used for the substrate, and a semiconductor device can be manufactured at low cost, in addition to having various functions suitable for applications.

The concentration of the photocatalyst substance included in the organic compound layer may be uniform in the organic compound layer including a photocatalyst substance, or may have a gradient in a film thickness direction. The photocatalyst substance and the organic compound are not necessarily formed at the same time in the mixed state. Particles of the photocatalyst substance may be dotted over the substrate first and then the organic compound layer may be formed so as to fill a space between the particles. Alternatively, the organic compound layer may be faulted first, and then, the photocatalyst substance may be introduced into the organic compound layer (after dispersing on the organic compound layer, it may be diffused into the organic compound layer.). In the present invention, the organic compound layer including a photocatalyst substance may be formed by any process, as long as the photocatalyst substance and the organic compound are formed as a layer in a mixed state.

In this specification, "high concentration" indicates that existing probability or distribution of the photocatalyst substance is high. This concentration can be represented by volume ratio, weight ratio, composition ratio or the like in accordance with the property of the substance.

As an example of the mixed state of the photocatalyst substance included in the organic compound layer, FIGS. 2A to 2D and 3A to 3D show cases where the concentration of the photocatalyst substance included in the organic compound layer has a gradient in the film thickness direction in the organic compound layer including a photocatalyst substance.

Figure 2A:
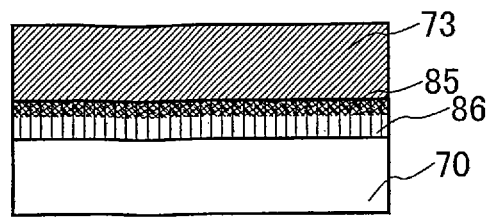
FIGS. 2A to 2D show an aspect of the present invention.

An organic compound layer including a photocatalyst substance shown in FIG. 2A is an example of an organic compound layer including a photocatalyst substance of the present invention. Over the first substrate 70, an organic compound layer 86 including a region 85 in which a photocatalyst substance is mixed is formed, and the element layer 73 is formed over the organic compound layer 86. The photocatalyst substance mixed in the organic compound layer 86 has a concentration gradient, and the photocatalyst substance exists unevenly in the organic compound layer 86. The region 85 in which a photocatalyst substance is mixed is included near the interface between the organic compound layer 86 and the element layer 73. Thus, the concentration of the photocatalyst substance included in the organic compound layer 86 is highest at the interface between the organic compound layer 86 and the element layer 73. The region 85 in which the photocatalyst substance is mixed can have a structure in which the concentration changes gradually toward the element layer 73 in the film thickness direction inside the organic compound layer, without having a clear interface with a region in which the photocatalyst substance is not mixed.

Figure 2B:
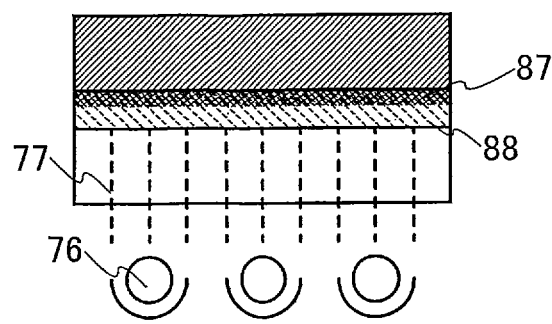
Figure 2C:
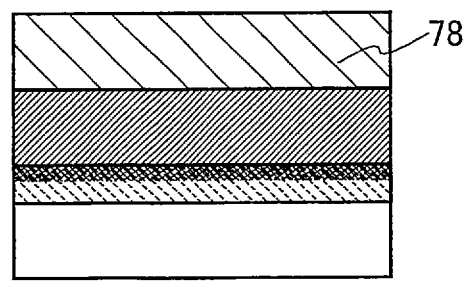
Figure 2D:
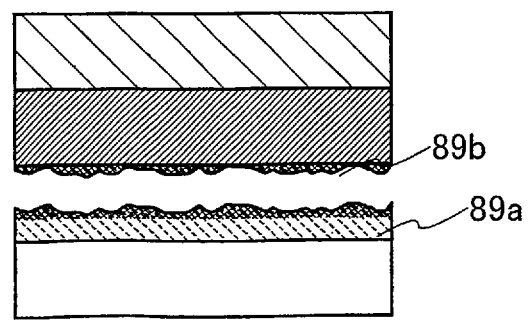

The photocatalyst substance is irradiated with light from the first substrate 70 side, and the activated energy decomposes the organic compound so as to form the organic compound layer 88 including a photocatalyst substance, of which strength decreases. After that, the second substrate 78 is attached onto the element layer 73, and the element layer 73 is peeled from the first substrate 70 (FIGS. 2B to 2D). Since roughening the organic compound layer by the photocatalyst substance occurs in the region 87 in which the photocatalyst substance is mixed, an organic compound layer 89b including a photocatalyst substance on the element layer side and an organic compound layer 89a including a photocatalyst substance on the substrate side are separated (sectioned) from each other within the layer.

Figure 3A:
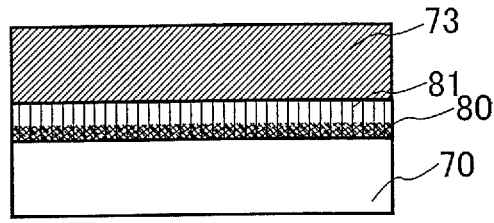
FIGS. 3A to 3D show an aspect of the present invention.

An organic compound layer including a photocatalyst substance shown in FIG. 3A is an example of an organic compound layer including a photocatalyst substance of the present invention. Over the first substrate 70, an organic compound layer 81 including a region 80 in which a photocatalyst substance is mixed is formed, and the element layer 73 is formed over the organic compound layer 81. The photocatalyst substance mixed in the organic compound layer 81 has a concentration gradient, and the photocatalyst substance exists unevenly in the organic compound layer 81. The region 80 in which the photocatalyst substance is mixed is included near the interface between the organic compound layer 81 and the first substrate 70. Thus, the concentration of the photocatalyst substance included in the organic compound layer 81 is highest at the interface between the organic compound layer 81 and the first substrate 70. The region 80 in which a photocatalyst substance is mixed can have a structure in which the concentration changes gradually toward the element layer 73 in the film thickness direction inside the organic compound layer, without having a clear interface with a region in which the photocatalyst substance is not mixed.

Figure 3B:
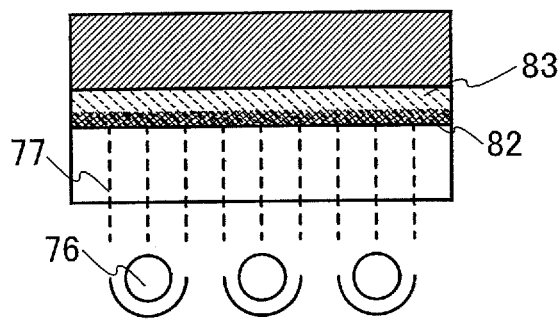
Figure 3C:
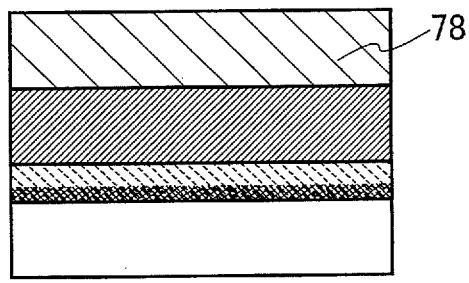
Figure 3D:
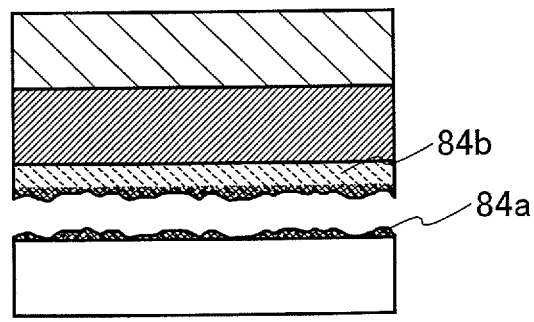
Figure 4A:
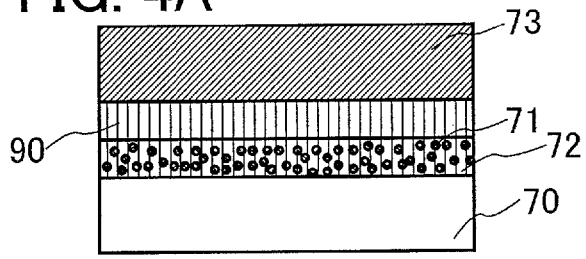
FIGS. 4A to 4D show an aspect of the present invention.
Figure 4B:
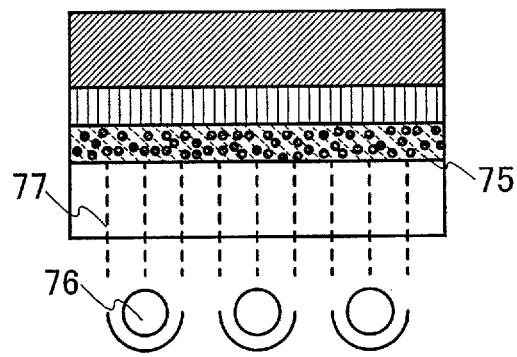
Figure 4C:
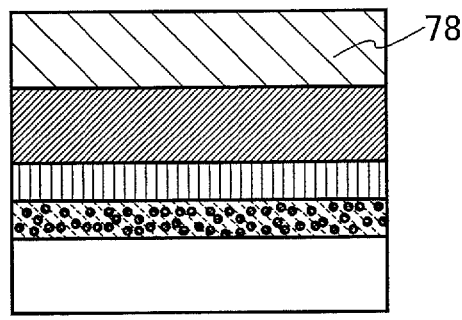
Figure 4D:
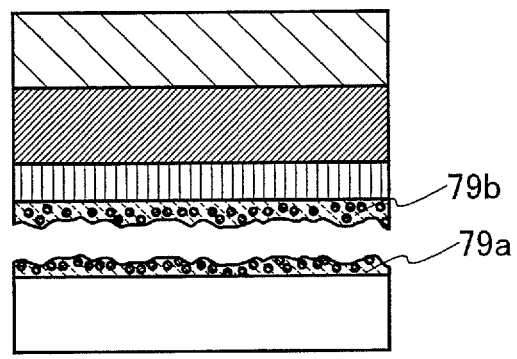

The photocatalyst substance is irradiated with light from the first substrate 70 side, and the activated energy decomposes the organic compound so as to form the organic compound layer 83 including a photocatalyst substance, of which strength decreases. After that, the second substrate 78 is attached onto the element layer 73, and the element layer 73 is peeled from the first substrate 70 (FIGS. 3B to 3D). Since roughening the organic compound layer by the photocatalyst substance occurs in the region 82 in which the photocatalyst substance is mixed, an organic compound layer 84b including a photocatalyst substance on the element layer side and an organic compound layer 84a including a photocatalyst substance on the substrate side are separated (sectioned) from each other within the layer.

Further, an insulating film may be provided between the organic compound layer including a photocatalyst substance and the element layer. In FIGS. 4A to 4D, an insulating layer 90 is provided between the organic compound layer 72 including a photocatalyst substance and the element layer 73. The insulating layer 90 can prevent contamination of the element layer due to impurities or the like, and further, if a material which can absorb or reflect light used for exposure is used for the insulating layer 90, the insulating layer 90 can block light emitted to the organic compound layer 72 including a photocatalyst substance. In addition, after peeling the element layer 73 from the first substrate 70, the insulating layer 90 can be used as a substrate for supporting and sealing the element layer 73.

The photocatalyst substance which can be used in the present invention is preferably titanium oxide ($TiO_2$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like. Photocatalytic activity can be generated by irradiating the photocatalyst substance with light of an ultraviolet light region (having a wavelength of 400 nm or less, preferably, 380 nm or less).

A photocatalyst substance including an oxide semiconductor containing a plurality of metals can be formed by mixing and melting salts of constituting elements. When a solvent needs to be removed, baking and/or drying may be performed. Specifically, heating may be performed at a predetermined temperature (for example, 300° C. or more), and preferably performed in an atmosphere containing oxygen.

With this heat treatment, the photocatalyst substance can have a predetermined crystal structure. For example, as for titanium oxide ($TiO_2$), the photocatalyst substance is of an anatase type or a rutile-anatase mixed type, and an anatase type is preferentially formed in a low-temperature phase. Therefore, the photocatalyst substance may be heated also if it does not have a predetermined crystal structure.

Photocatalytic activity can be improved by further doping the photocatalyst substance with transition metal (such as Pd, Pt, Cr, Ni, V, Mn, Fe, Ce, Mo, or W), or photocatalytic activity can be generated by light of a visible light region (having a wavelength of 400 nm to 800 nm). This is because transition metal can form a new level in a forbidden band of an active photocatalyst having a wide band gap, and can expand a light absorption range to a visible light region. For example, an acceptor type such as Cr or Ni, a donor type such as V or Mn, an amphoteric type such as Fe, or Ce, Mo, W, or the like can be used for doping. Since a wavelength of light can be determined by the photocatalyst substance as described above, light irradiation means irradiation of light having such a wavelength as to activate the photocatalyst substance.

In addition, when the photocatalyst substance is heated and reduced in vacuum or under hydrogen reflux, an oxygen defect is generated in a crystal. Without doping with a transition element in such a way, the oxygen defect can play a role equivalent to an electron donor. In particular, in the case of employing a sol-gel method, since an oxygen defect originally exists, reduction is not necessarily performed. By performing doping with a gas of $N_2$ or the like, an oxygen defect can be formed.

As an organic compound that can be used in the present invention, an organic material, or a mixed material of an organic material and an inorganic material can be used. As an organic material, a resin can be used, such as a cyanoethyl cellulose based resin, polyethylene, polypropylene, a polystyrene based resin, a silicone resin, an epoxy resin, vinylidene fluoride, or the like. In addition, a heat-resistant high-molecular material such as aromatic polyamide or polybenzimidazole, or a siloxane resin may also be used. The siloxane resin is a resin including a Si—O—Si bond. Siloxane has a skeleton structure formed of a bond of silicon (Si) and oxygen (O). As a substituent, an organic group containing at least hydrogen (for example, an alkyl group or aromatic hydrocarbon) is used. Alternatively, a fluoro group may be used as a substituent. In addition, as a substituent, both a fluoro group and an organic group containing at least hydrogen may also be used. Further, a resin material may also be used, such as a vinyl resin such as polyvinyl alcohol or polyvinylbutyral, a phenol resin, a novolac resin, an acrylic resin, a melamine resin, a urethane resin, an oxazole resin (polybenzoxazole), or the like.

As an inorganic material contained in the organic compound, a material of silicon oxide, silicon nitride, silicon oxynitride, silicon nitride oxide, aluminum nitride (AlN), aluminum oxynitride (AlON), aluminum nitride oxide (AlNO), aluminum oxide, titanium oxide ($TiO_2$), $BaTiO_3$, $SrTiO_3$, $PbTiO_3$, $KNbO_3$, $PbNbO_3$, $Ta_2O_5$, $BaTa_2O_6$, $LiTaO_3$, $Y_2O_3$, $Al_2O_3$, $ZrO_2$, or ZnS, or other substances containing an inorganic material can be used.

As the solvent for the solution containing an organic compound that can be used in the present invention, a solvent capable of forming a solution having such viscosity, that can dissolve an organic compound material and which is suitable for a method for forming an organic compound layer (various types of wet processes) and a desired film thickness, may be appropriately selected. An organic solvent or the like can also be used, and when, for example, a siloxane resin is used as an organic compound, propylene glycol monomethyl ether, propylene glycol monomethyl ether acetate (also referred to as PGMEA), 3-methoxy-3-methyl-1-butanol (also referred to as MMB), or the like can be used.

According to the present invention, a semiconductor device and a display device can be manufactured using a peeling process, in which a transfer process can be conducted with a good state in which a shape and property of the element before peeling, are kept. Therefore, more highly reliable semiconductor devices can be manufactured with high yield without complicating the apparatus and the process for manufacturing.

Embodiment Mode 2

Embodiment Mode 2 will explain one structural example of a display device to which a transfer process of the present invention is applied, with reference to drawings. More specifically, a case where a structure of a display device is a passive matrix type will be shown.

Figure 5A:
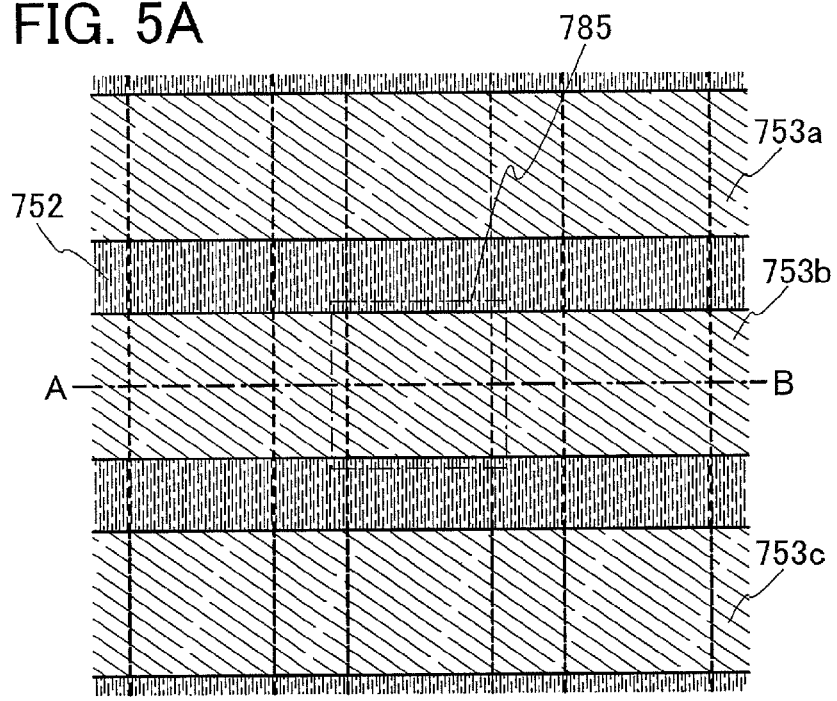
FIGS. 5A to 5C show an aspect of the present invention.
Figure 5B:
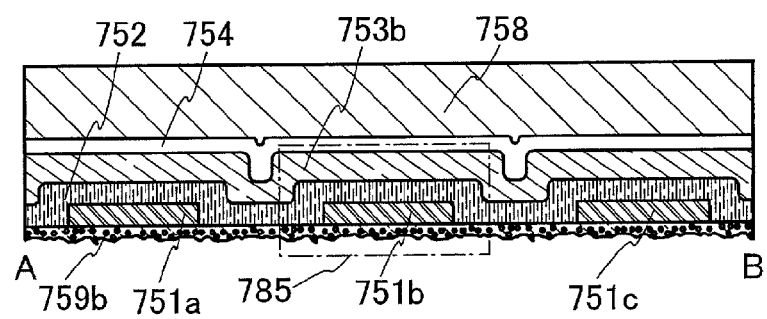

The display device includes first electrode layers 751a, 751b, and 751c extending in a first direction; an electroluminescent layer 752 provided to cover the first electrode layers 751a, 751b, and 751c; and second electrode layers 753a, 753b, and 753c extending in a second direction perpendicular to the first direction (FIG. 5A). The electroluminescent layer 752 is provided between the first electrode layers 751a, 751b, and 751c and the second electrode layers 753a, 753b, and 753c. In addition, an insulating layer 754 functioning as a protection film is provided so as to cover the second electrode layers 753a, 753b, and 753c. The element layer including the first electrode layers 751a, 751b and 751c, the second electrode layers 753a, 753b and 753c, the electroluminescent layer 752, and the insulating layer 754 is provided so as to be in contact with the substrate 758 (FIG. 5B). When an influence of an electric field in a lateral direction is concerned between adjacent light emitting elements, the electroluminescent layer 752 provided in each light-emitting element may be separated.

Figure 5C:
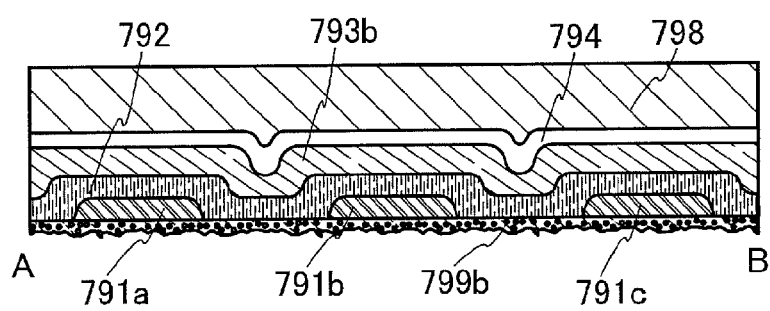

FIG. 5C is a deformed example of FIG. 5B. The element layer including first electrode layers 791a, 791b, and 791c, an electroluminescent layer 792, a second electrode layer 793b, and an insulating layer 794 which is a protective layer is provided so as to be in contact with the substrate 798. The first electrode layer may have a tapered shape like the first electrode layers 791a, 791b, and 791c in FIG. 5C, or a shape in which radius of curvature changes continuously. The shape like the first electrode layers 791a, 791b, and 791c can be formed with the use of a droplet-discharging method or the like. With such a curved surface having a curvature, coverage of an insulating layer or conductive layer to be stacked thereover is favorable.

In addition, a partition wall (insulating layer) may be formed to cover an end portion of the first electrode layer. The partition wall (insulating layer) serves as a wall separating a light-emitting element from another light-emitting element.

Figure 8A:
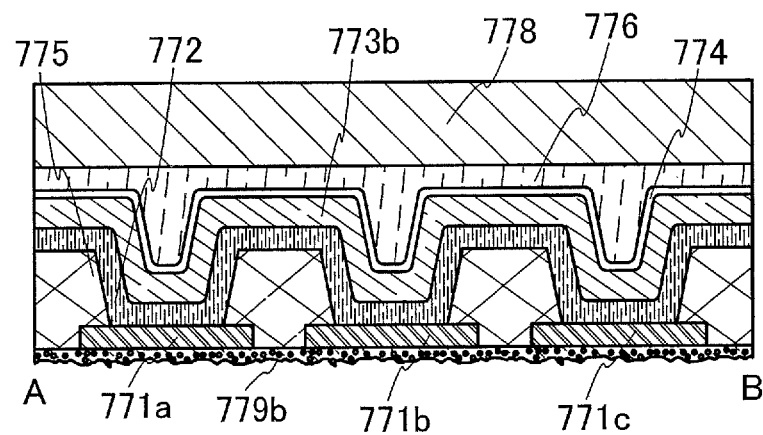
FIGS. 8A and 8B each show a manufacturing method of a display device according to an aspect of the present invention.
Figure 8B:
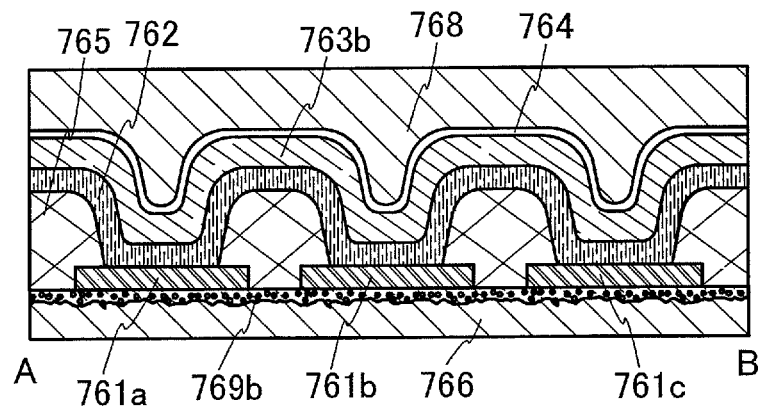

FIGS. 8A and 8B each show a structure in which the end portion of the first electrode layer is covered with the partition wall (insulating layer).

In an example of a light-emitting element shown in FIG. 8A, a partition wall (insulating layer) 775 is formed to have a tapered shape to cover end portions of first electrode layers 771a, 771b, and 771c. The element layer including the first electrode layers 771a, 771b, and 771c, the partition wall (insulating layer) 775, an electroluminescent layer 772, a second electrode layer 773b, an insulating layer 774, and an insulating layer 776 are provided so as to be in contact with the substrate 778.

An example of a light-emitting element shown in FIG. 8B has a shape in which a partition wall (insulating layer) 765 has a curvature, and radius of the curvature changes continuously. The element layer including first electrode layers 761a, 761b, and 761c, an electroluminescent layer 762, a second electrode layer 763b, and an insulating layer 764 are provided so as to be in contact with the substrate 768.

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate. The remaining layers on the element layer side after peeling the organic compound layer including a photocatalyst substance are the organic compound layers 759b, 769b, 779b and 799b including a photocatalyst substance.

Accordingly, since elements can be transferred to various types of substrates, a material for the substrate can be selected from a wider range of materials. In addition, an inexpensive material can be used for a substrate, and a semiconductor device can be manufactured at low cost, in addition to having various functions suitable for applications.

Figure 6A:
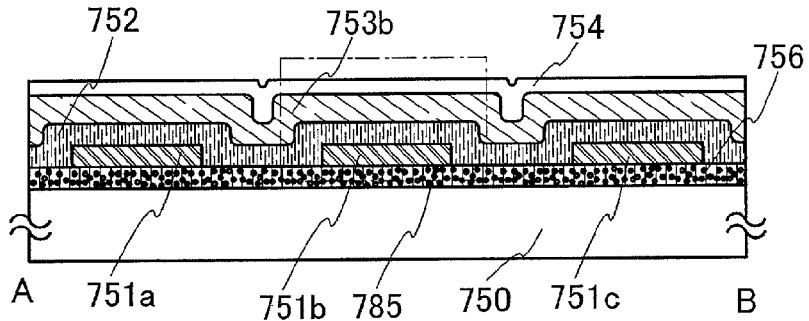
FIGS. 6A to 6D show a manufacturing method of a display device according to an aspect of the present invention.

FIGS. 6A to 6D show a manufacturing process of the display device shown in FIGS. 5A and 5B. In FIG. 6A, an organic compound layer 756 including a photocatalyst substance is provided between the first substrate 750 and the first electrodes 751a, 751b and 751c. As the first substrate 750, an appropriate substrate may be selected, which is suitable for conditions in a manufacturing process, in other words, which can withstand a process (such as a heat treatment) in forming a display element included in the element layer. A photocatalyst substance is included in the organic compound layer 756.

Figure 6B:
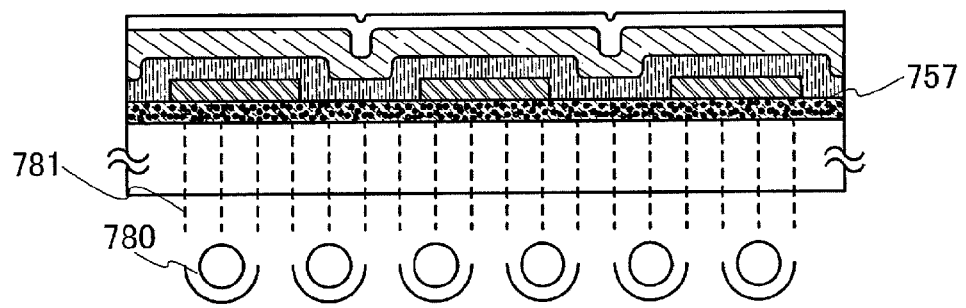

After that, the photocatalyst substance is irradiated with light 781 which is emitted from a light source 780 and passes through the first substrate 750, from the light-transmitting first substrate 750 side (FIG. 6B).

The photocatalyst substance absorbs the light 781, and thus, the photocatalyst substance is activated by the light 781. The activation energy acts on the peripheral organic compound included in the organic compound layer 756 including a photocatalyst substance, and as a result, changes and modifies properties of the organic compound. In other words, by the energy of the activated photocatalyst substance (oxidizability), a carbon-hydrogen bond and a carbon-carbon bond of such organic compound are separated, and a part of the organic compound becomes carbon dioxide and water, and is degassed. Consequently, the organic compound layer 756 including a photocatalyst substance becomes rough, so that it becomes an organic compound layer 757 including a photocatalyst substance.

Figure 6C:
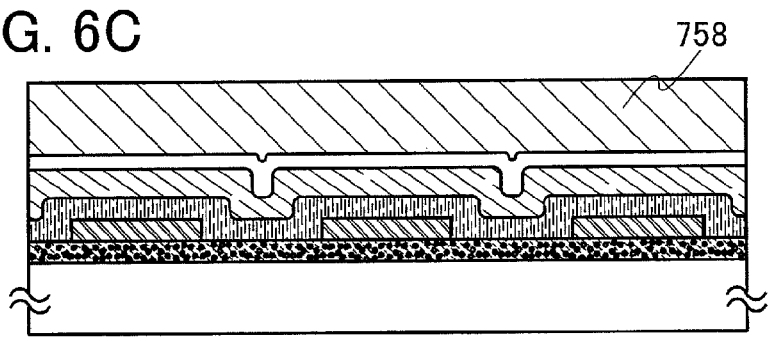
Figure 6D:
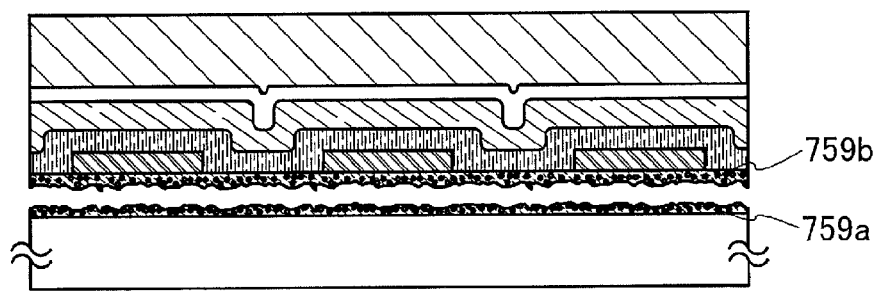

A second substrate 758 is provided over the insulating film 754 of an element layer including a light-emitting element 785 (FIG. 6C). The second substrate 758 may be attached to the element layer by using an adhesive or the like, or a protective layer such as a resin layer may be directly formed over the element layer.

When power is applied to the second substrate 758 side so as to transfer the element layer including a light-emitting element 785, the strength of the organic compound layer 757 including a photocatalyst substance decreases, and thus, the organic compound layer 759b including a photocatalyst substance on the element layer side and the organic compound layer 759a including a photocatalyst substance on the substrate side are separated (sectioned) from each other within the layer. Accordingly, the element layer including a light-emitting layer 785 can be peeled from the first substrate 750.

Figure 7A:
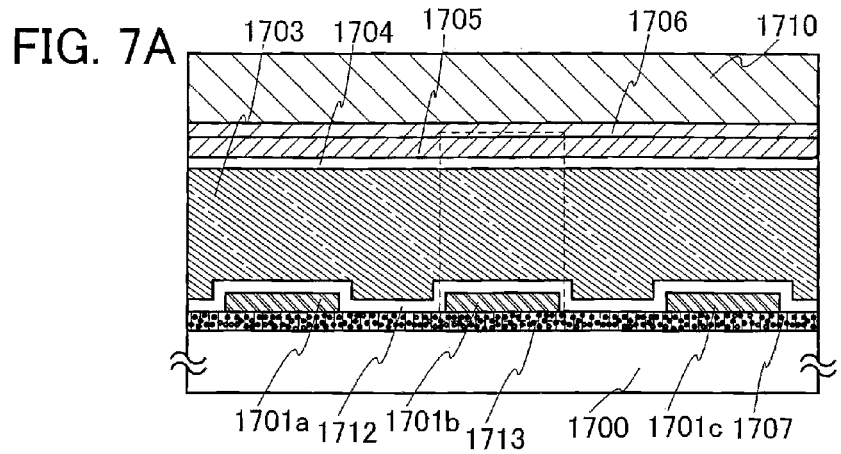
FIGS. 7A to 7D show a manufacturing method of a display device according to an aspect of the present invention.
Figure 7B:
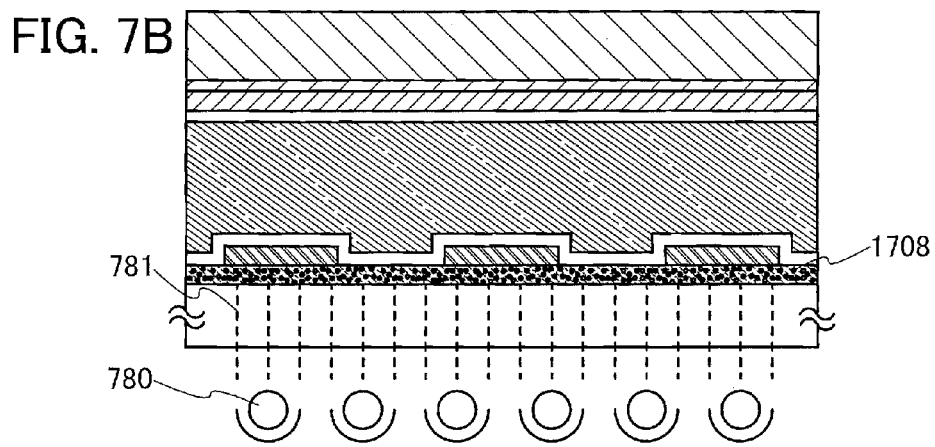
Figure 7C:
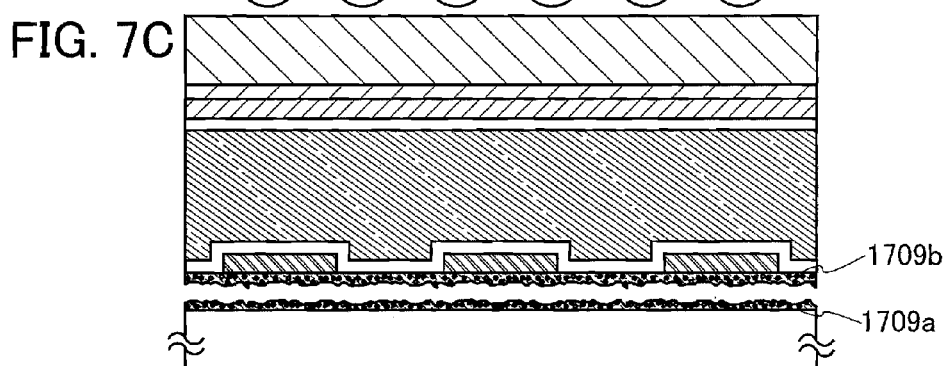

FIGS. 7A to 7D shows a manufacturing process of a passive matrix type liquid crystal display device to which the present invention is applied. In FIG. 7A, a first substrate 1700 and a second substrate 1710 face to each other with a liquid crystal layer 1703 interposed therebetween, in which an organic compound layer 1707 including a photocatalyst substance, the first pixel electrode layers 1701a, 1701b, 1701c, and an insulating layer 1712 serving as an alignment film are provided for the first substrate 1700, and an insulating layer 1704 serving as an alignment film, a counter electrode 1705, and a colored layer 1706 serving as a color filter are provided for the second substrate 1710. Between the first substrate 1700 and the first pixel electrodes 1701a, 1701b, 1701c, the organic compound layer 1707 including a photocatalyst substance is provided. As the first substrate 1700, an appropriate substrate may be selected, which is suitable for conditions in a manufacturing process, in other words, which can withstand a process (such as a heat treatment) in forming a liquid crystal display element 1713 included in the element layer. A photocatalyst substance is included in the organic compound layer 1707.

After that, the photocatalyst substance is irradiated with light 781 which is emitted from a light source 780 and passes through the first substrate 1700, from the light-transmitting first substrate 1700 side (FIG. 6B).

The photocatalyst substance absorbs the light 781, and thus, the photocatalyst substance is activated by the light 781. The activation energy acts on the peripheral organic compound included in the organic compound layer 1707 including a photocatalyst substance, and as a result, changes and modifies properties of the organic compound. In other words, by the energy of the activated photocatalyst substance (oxidizability), a carbon-hydrogen bond and a carbon-carbon bond of such organic compound are separated, and a part of the organic compound becomes carbon dioxide and water, and is degassed. Consequently, the organic compound layer 1707 including a photocatalyst substance becomes rough, so that it becomes the organic compound layer 1708 including a photocatalyst substance.

When power is applied to the second substrate 1710 side so as to transfer the element layer including the liquid crystal display element 1713, the strength of the organic compound layer 1708 including a photocatalyst substance decreases, and thus, the organic compound layer 1709b including a photocatalyst substance on the element layer side and the organic compound layer 1709a including a photocatalyst substance on the substrate side are separated (sectioned) from each other within the layer. Accordingly, the element layer including the liquid crystal display element 1713 can be peeled from the first substrate 1700.

Figure 7D:
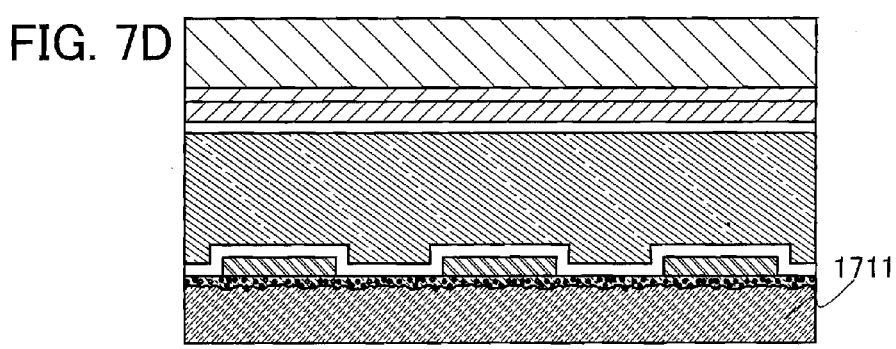

After peeling the element layer including the liquid crystal display element 1713 from the first substrate 1700, a third substrate 1711 is attached to the organic compound layer 1709a side including a photocatalyst substance of the element layer (FIG. 7D). The attached third substrate 1711 may be formed from a material which can block light in a wavelength which activates the photocatalyst substance left in the element layer.

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process, and an element with good shape can be transferred to various types of substrates as appropriate.

Accordingly, since elements can be transferred to various types of substrates, a material for the substrate can be selected from a wider range of materials. In addition, an inexpensive material can be used for a substrate, and a semiconductor device can be manufactured at low cost, in addition to having various functions suitable for applications.

The substrates 758, 766, 768 and 798 can be glass substrates, flexible substrates, quartz substrates, or the like. The flexible substrate is a substrate that can be bent, such as a plastic substrate formed from polycarbonate, polyarylate, polyether sulfone, or the like. In addition, a film (formed using polypropylene, polyester, vinyl, polyvinyl fluoride, vinyl chloride, or the like), paper of a fibrous material, a base film (polyester, polyamide, an evaporated inorganic film, paper or the like), or the like can be used.

The first electrode layer, the second electrode layer, and the electroluminescent layer shown in this embodiment mode can be formed by using any of the materials and the methods described in other embodiment modes.

As the partition walls (insulating layers) 765 and 775, silicon oxide, silicon nitride, silicon oxynitride, aluminum oxide, aluminum nitride, aluminum oxynitride, or other inorganic insulating materials; acrylic acid, methacrylic acid, or a derivative thereof; a heat-resistant high molecular material such as polyimide, aromatic polyamide, or polybenzimidazole; or a siloxane resin may be used. Alternatively, the following resin material can be used: a vinyl resin such as polyvinyl alcohol or polyvinylbutyral, an epoxy resin, a phenol resin, a novolac resin, an acrylic resin, a melamine resin, a urethane resin, or the like. Further, an organic material such as benzocyclobutene, parylene, fluorinated arylene ether, or polyimide; a composition material containing a water-soluble homopolymer and a water-soluble copolymer; or the like may be used. As a formation method, a vapor phase growth method such as a plasma CVD method or a thermal CVD method, or a sputtering method can be used. A droplet-discharging method or a printing method (a method for forming a pattern, such as screen printing or offset printing) can also be used. An organic film or an inorganic film (a SOG film, or the like) obtained by a coating method or the like can also be used.

After a conductive layer, an insulating layer, or the like is formed by discharging a composition by a droplet-discharging method, a surface thereof may be planarized by pressing with pressure to enhance planarity. As a pressing method, concavity and convexity of the surface may be reduced by scanning the surface by a roller-shaped object, or the surface may be pressed perpendicularly by a flat plate-shaped object. A heating treatment may also be performed at the time of pressing. Alternatively, the concavity and convexity of the surface may be removed with an air knife after the surface is softened or melted with a solvent or the like. A CMP method may also be used for polishing the surface. This process can be employed in planarizing of the surface when concavity and convexity are generated by a droplet-discharging method.

According to the present invention, a semiconductor device and a display device can be manufactured using a peeling process, in which a transfer process can be conducted with a good state in which a shape and property of the element before peeling is kept. Therefore, highly reliable semiconductor devices can be manufactured with high yield without complicating the apparatus and the process for manufacturing.

Embodiment Mode 3

Embodiment Mode 3 will describe a semiconductor device having a transistor which is formed by a transfer process of the present invention.

Figure 9A:
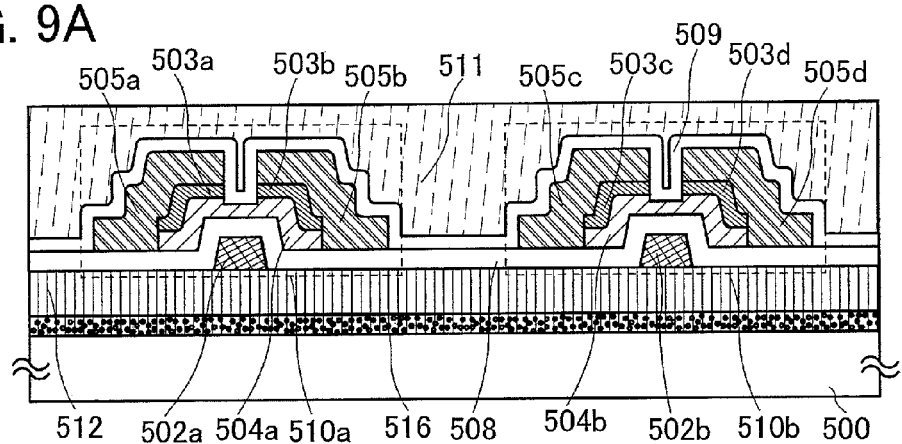
FIGS. 9A to 9C show a manufacturing method of a display device according to an aspect of the present invention.
Figure 9B:
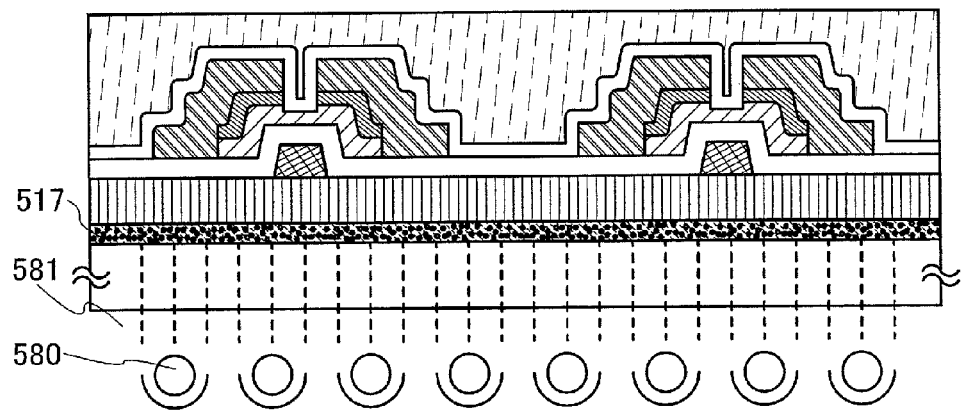
Figure 9C:
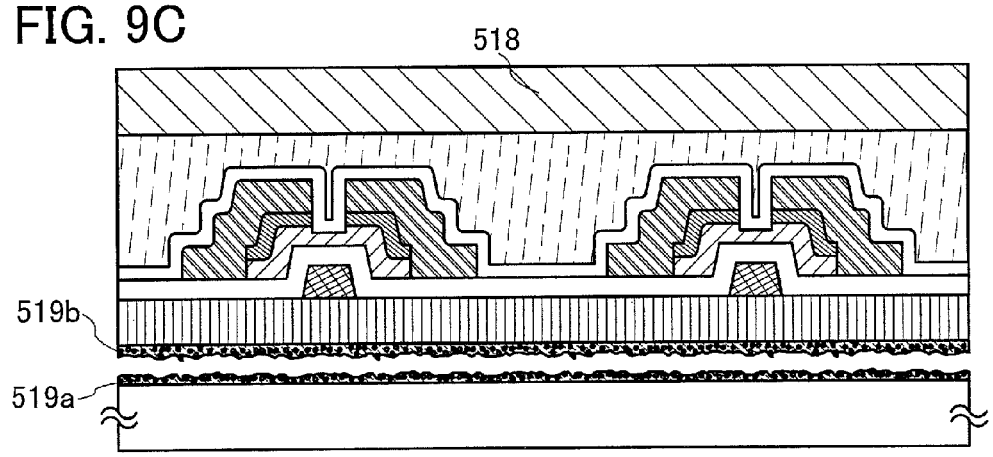

In FIGS. 9A to 9C, between a light-transmitting insulating layer 512 provided over a light-transmitting substrate 500, and an element layer including transistors 510a and 510b, an organic compound layer 516 including a photocatalyst substance is provided. As the first substrate 500 and the insulating layer 512, appropriate materials may be selected, which is suitable for conditions in a manufacturing process, in other words, which can withstand a process (such as a heat treatment) in forming a display element included in the element layer. A photocatalyst substance is included in the organic compound layer 516.

After that, the photocatalyst substance is irradiated with light 581 emitted from a light source 580 from the light-transmitting first substrate 500 side, passing through the first substrate 500 and the insulating layer 512 (FIG. 9B).

The photocatalyst substance absorbs the light 581, and thus, the photocatalyst substance is activated by the light 581. The activation energy acts on the peripheral organic compound included in the organic compound layer 516 including a photocatalyst substance, and as a result, changes and modifies properties of the organic compound. In other words, by the energy of the activated photocatalyst substance (oxidizability), a carbon-hydrogen bond and a carbon-carbon bond of such organic compound are separated, and a part of the organic compound becomes carbon dioxide and water, and is degassed. Consequently, the organic compound layer 516 including a photocatalyst substance becomes rough, so that it becomes the organic compound layer 517 including a photocatalyst substance.

A second substrate 518 is provided over the insulating film 509 and the insulating layer 511 of the element layer including the transistors 510a and 510b (FIG. 9C). The second substrate 518 may be attached to the element layer by using an adhesive or the like, or a protective layer such as a resin layer may be directly formed over the element layer.

When power is applied to the second substrate 518 side so as to transfer the element layer including the transistors 510a and 510b, the strength of the organic compound layer 517 including a photocatalyst substance decreases, and thus, the organic compound layer 519b including a photocatalyst substance on the element layer side and the organic compound layer 519a including a photocatalyst substance on the substrate side are separated (sectioned) from each other within the layer. Accordingly, the element layer including the transistors 510a and 510b can be peeled from the first substrate 500.

FIGS. 9A to 9C show an example in which the transistors 510a and 510b are channel etch type reverse staggered transistors. In FIGS. 9A to 9C, the transistors 510a and 510b include gate electrode layers 502a, 502b, a gate insulating layer 508, semiconductor layers 504a, 504b, semiconductor layers 503a, 503b, 503c, 503d having one conductivity, and wiring layers 505a, 505b, 505c, 505d serving as source or drain electrode layers.

A material for forming the semiconductor layer can be an amorphous semiconductor (hereinafter also referred to as "AS") formed by a vapor phase growth method or a sputtering method using a semiconductor material gas typified by silane or germane, a polycrystalline semiconductor formed by crystallizing the amorphous semiconductor using light energy or thermal energy, a semi-amorphous semiconductor (also referred to as microcrystal and hereinafter also referred to as "SAS"), or the like.

SAS is a semiconductor having an intermediate structure between amorphous and crystalline (including single crystal and polycrystalline) structures and a third state which is stable in free energy. Moreover, SAS includes a crystalline region with a short range order and lattice distortion. SAS is formed by glow discharge decomposition (plasma CVD) of a gas containing silicon. As the gas containing silicon, $SiH_4$ can be used, and in addition, $Si_2H_6$, $SiH_2Cl_2$, $SiHCl_3$, $SiCl_4$, $SiF_4$ or the like can also be used. Further, $F_2$ and $GeF_4$ may be mixed. The gas containing silicon may be diluted with $H_2$, or $H_2$ and one or a plurality of rare gas elements of He, Ar, Kr, and Ne. A rare element such as helium, argon, krypton, or neon is made to be contained to promote lattice distortion, thereby favorable SAS with increased stability can be obtained. An SAS layer formed by using a hydrogen based gas may be stacked over an SAS layer formed by using a fluorine based gas as the semiconductor film.

Hydrogenated amorphous silicon may be typically given as an example of an amorphous semiconductor, while polysilicon and the like may be typically given as an example of a crystalline semiconductor. Polysilicon (polycrystalline silicon) includes so-called high-temperature polysilicon formed using polysilicon as a main material, which is formed at processing temperatures of 800° C. or higher; so-called low-temperature polysilicon formed using polysilicon as a main material, which is formed at processing temperatures of 600° C. or lower; polysilicon crystallized by addition of an element which promotes crystallization; and the like. It is needless to say that a semi-amorphous semiconductor or a semiconductor containing a crystal phase in part thereof may also be used as described above.

In the case where a crystalline semiconductor film is used for the semiconductor film, the crystalline semiconductor film may be formed by a known method such as a laser crystallization method, a thermal crystallization method, and a thermal crystallization method using an element such as nickel which promotes crystallization. Further, a microcrystalline semiconductor that is SAS may be crystallized by laser irradiation, for enhancing crystallinity. In the case where an element which promotes crystallization is not used, before irradiating the amorphous semiconductor film with a laser beam, the amorphous semiconductor film is heated at 500° C. for one hour in a nitrogen atmosphere to discharge hydrogen so that the hydrogen concentration in the amorphous semiconductor film is less than or equal to $1 \times 10^{20}$ atoms/cm$^3$. This is because, if the amorphous semiconductor film contains much hydrogen, the amorphous semiconductor film may be broken by laser beam irradiation. A heat treatment for crystallization may be performed with the use of a heating furnace, laser irradiation, irradiation with light emitted from a lamp (also referred to as a lamp annealing), or the like. As a heating method, an RTA method such as a GRTA (Gas Rapid Thermal Anneal) method or an LRTA (Lamp Rapid Thermal Anneal) method may be used. A GRTA method is a method in which a heat treatment is performed by a high-temperature gas whereas an LRTA method is a method in which a heat treatment is performed by light emitted from a lamp.

In a crystallization process in which an amorphous semiconductor layer is crystallized to form a crystalline semiconductor layer, an element which promotes crystallization (also referred to as a catalytic element or a metal element) may be added to an amorphous semiconductor layer, and crystallization may be performed by a heat treatment (at 550 to 750° C. for 3 minutes to 24 hours). As a metal element which promotes crystallization of silicon, one or a plurality of kinds of metal such as iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

A method for introducing a metal element into the amorphous semiconductor film is not particularly limited as long as it is a method which can make the metal element exist on the surface of or inside of the amorphous semiconductor film. For example, a sputtering method, a CVD method, a plasma treatment method (also including a plasma CVD method), an adsorption method, or a method of applying a solution of metal salt can be used. Among them, a method using a solution is simple and advantageous in that the concentration of the metal element can be easily controlled. At this time, it is preferable to form an oxide film by UV light irradiation in an oxygen atmosphere, a thermal oxidation method, a treatment with ozone water containing hydroxyl radical or hydrogen peroxide, or the like so that wettability of the surface of the amorphous semiconductor film is improved, and an aqueous solution is diffused over the entire surface of the amorphous semiconductor film.

In order to remove or reduce the element which promotes crystallization from the crystalline semiconductor layer, a semiconductor layer containing an impurity element is formed to be in contact with the crystalline semiconductor layer and is made to function as a gettering sink. As the impurity element, an impurity element imparting n-type, an impurity element imparting p-type, a rare gas element, or the like can be used. For example, one or a plurality of kinds of elements such as phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed over the crystalline semiconductor layer containing the element which promotes crystallization, and a heat treatment (at temperatures of 550 to 750° C. for 3 minutes to 24 hours) is performed. The element which promotes crystallization contained in the crystalline semiconductor layer moves into the semiconductor layer containing a rare gas element, and the element which promotes crystallization contained in the crystalline semiconductor layer is removed or reduced. After that, the semiconductor layer containing a rare gas element functioning as the gettering sink is removed.

By scanning a laser beam and the semiconductor film relatively, laser irradiation can be performed. Further, in the laser beam irradiation, a marker can be formed to overlap beams with high precision or control positions for starting and finishing laser beam irradiation. The marker may be formed over the substrate at the same time as the amorphous semiconductor film is farmed.

In the case of laser beam irradiation, a continuous wave oscillation type laser beam (a CW laser beam) or a pulsed oscillation type laser beam (a pulsed laser beam) can be used. As a laser beam that can be used here, a laser beam emitted from one or a plurality of kinds of a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or a plurality of kinds of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser can be used. By irradiation with the fundamental wave of such a laser beam or the second harmonic to fourth harmonic laser beam of the fundamental wave, a large grain crystal can be obtained. For example, the second harmonic (532 nm) or the third harmonic (355 nm) of an Nd:YVO$_4$ laser beam (the fundamental wave: 1064 nm) can be used. As for an Nd:YVO$_4$ laser, either continuous wave oscillation or pulsed oscillation can be performed. In the case of continuous wave oscillation, the power density of the laser beam needs to be approximately 0.01 to 100 MW/cm$^2$ (preferably 0.1 to 10 MW/cm$^2$). Then, irradiation is carried out at a scanning rate of approximately 10 to 2000 cm/sec.

Further, a laser using, as a medium, single crystal YAG, YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or a plurality of kinds of Nd, Yb, Cr, Ti, Ho, Er, Tm and Ta as a dopant; an Ar ion laser; or a Ti: sapphire laser can perform continuous wave oscillation. In addition, pulse oscillation at a repetition rate of greater than or equal to 10 MHz is also possible by Q-switch operation, mode locking, or the like. Through pulse oscillation of a laser beam at a repetition rate of greater than or equal to 10 MHz, the semiconductor film is irradiated with the next pulse after the semiconductor film is melted by a laser beam and before the film is solidified. Accordingly, differing from the case where a pulsed laser at a lower repetition rate is used, the solid-liquid interface can be continuously moved in the semiconductor film, and a crystal grain grown continuously in the scanning direction can be obtained.

The use of ceramics (polycrystal) as a medium allows the medium to be formed into a free shape at low cost in a short time. Although a cylindrical columnar medium of several mm in diameter and several tens of mm in length is usually used in the case of single crystal, larger media can be formed in the case of ceramics.

Since the concentration of the dopant such as Nd or Yb in the medium, which directly contributes to light emission, is difficult to be changed significantly both in single crystal and polycrystal, improvement in laser beam output by increasing the concentration of the dopant has a certain level of limitation. However, in the case of ceramics, drastic improvement in output can be expected because the size of the medium can be significantly increased compared with the case of single crystal.

Further, in the case of ceramics, a medium having a parallelepiped shape or a rectangular parallelepiped shape can be easily formed. When a medium having such a shape is used and oscillation light goes in zigzag in the medium, an oscillation light path can be longer. Accordingly, amplification is increased and oscillation with high output is possible. Since a laser beam emitted from the medium having such a shape has a cross section of a quadrangular shape when being emitted, a linear beam can be easily shaped compared with the case of a circular beam. The laser beam emitted in such a manner is shaped by using an optical system; accordingly, a linear beam having a short side of less than or equal to 1 mm and a long side of several mm to several m can be easily obtained. In addition, by uniformly irradiating the medium with excited light, a linear beam has a uniform energy distribution in a long side direction. Further, the semiconductor film may be irradiated with a laser beam at an incident angle θ (0<θ<90°) with respect to the semiconductor film, thereby an interference of the laser beam can be prevented.

By irradiation of the semiconductor film with this linear beam, the entire surface of the semiconductor film can be annealed more uniformly. In the case where uniform annealing is required from one end to the other end of the linear beam, slits may be provided for the both ends so as to shield a portion where energy is attenuated.

When the thus obtained linear beam with uniform intensity is used to anneal the semiconductor film and this semiconductor film is used to manufacture a display device, the display device has favorable and uniform characteristics.

The semiconductor film may be irradiated with a laser beam in an inert gas atmosphere such as a rare gas or nitrogen as well. Accordingly, roughness of the surface of the semiconductor film can be prevented by laser irradiation, and variation of threshold voltage due to variation of interface state density can be prevented.

The amorphous semiconductor film may be crystallized by a combination of a heat treatment and laser beam irradiation, or either of a heat treatment or laser beam irradiation may be performed a plurality of times.

The gate electrode layer can be formed by a sputtering method, an evaporation method, a CVD method, or the like. The gate electrode layer may be fixated using an element such as tantalum (Ta), tungsten (W), titanium (Ti), molybdenum (Mo), aluminum (Al), copper (Cu), chromium (Cr), or neodymium (Nd), or an alloy material or a compound material containing these elements as its main component. Further, as the gate electrode layer, a semiconductor film typified by a polycrystalline silicon film doped with an impurity element such as phosphorus can be used, or AgPdCu alloy may be used. In addition, the gate electrode layer may be a single layer or a stacked layer.

In this embodiment mode, the gate electrode layer is formed to have a tapered shape; however, the present invention is not limited thereto. The gate electrode layer may have a stacked layer structure, where only one layer has a tapered shape while the other(s) may have a perpendicular side surface by anisotropic etching. The taper angles may be different or equal among the stacked gate electrode layers. With the tapered shape, coverage of a film to be stacked thereover is improved and defects are reduced, whereby reliability is enhanced.

In order to form the source electrode layer or the drain electrode layer, a conductive film is formed by a PVD method, a CVD method, an evaporation method, or the like, and the conductive film is etched into a desired shape. Further, the conductive film can be selectively formed in a predetermined position by a droplet-discharging method, a printing method, a dispenser method, an electrolytic plating method, or the like. A reflow method or a damascene method may also be used. The source electrode layer or the drain electrode layer is formed using an element such as Ag, Au, Cu, Ni, Pt, Pd, Ir, Rh, W, Al, Ta, Mo, Cd, Zn, Fe, Ti, Si, Ge, Zr, or Ba, or alloy or metal nitride thereof. In addition, a stacked layer structure of these materials may also be used.

As the insulating layers 512, 511, 509, silicon oxide, silicon nitride, silicon oxynitride, aluminum oxide, aluminum nitride, aluminum oxynitride, or other inorganic insulating materials; acrylic acid, methacrylic acid, or a derivative thereof; a heat-resistant high molecular material such as polyimide, aromatic polyamide, or polybenzimidazole; or a siloxane resin may be used. Alternatively, the following resin material can be used: a vinyl resin such as polyvinyl alcohol or polyvinylbutyral, an epoxy resin, a phenol resin, a novolac resin, an acrylic resin, a melamine resin, a urethane resin, or the like. Further, an organic material such as benzocyclobutene, parylene, fluorinated arylene ether, or polyimide; a composition material containing a water-soluble homopolymer and a water-soluble copolymer; or the like may be used. As a formation method, a vapor phase growth method such as a plasma CVD method or a thermal CVD method, or a sputtering method can be used. A droplet-discharging method or a printing method (a method for forming a pattern, such as screen printing or offset printing) can also be used. An organic film or an inorganic film (a SOG film, or the like) obtained by a coating method or the like can also be used.

After a conductive layer, an insulating layer, or the like is formed by discharging a composition by a droplet-discharging method, a surface thereof may be planarized by pressing with pressure to enhance planarity. As a pressing method, concavity and convexity of the surface may be reduced by scanning the surface with a roller-shaped object, or the surface may be pressed with a flat plate-shaped object. A heat treatment may also be performed at the time of pressing. Alternatively, the concavity and convexity of the surface may be removed with an air knife after the surface is softened or melted with a solvent or the like. A CMP method may also be used for polishing the surface. This process can be employed in planarizing a surface when concavity and convexity are generated by a droplet-discharging method.

The structure of the thin film transistor in the pixel portion is not limited to this embodiment mode, and a single gate structure in which one channel formation region is formed, a double gate structure in which two channel formation regions are formed, or a triple gate structure in which three channel formation regions are formed may be employed. Further, the thin film transistor in the peripheral driver circuit region may also employ a single gate structure, a double gate structure, or a triple gate structure.

The present invention is not limited to the method for manufacturing the thin film transistor shown in this embodiment mode, and can also be applied to a top gate type (a coplanar type, and a staggered type), a bottom gate type (a reverse coplanar type), or a dual gate type having two gate electrode layers which are disposed above and below a channel formation region with the gate insulating film interposed therebetween, or other structure.

Although this embodiment mode exemplifies the example in which a counter substrate having flexibility (also referred to as a flexible counter substrate) is attached after the photocatalyst substance is irradiated with light, the photocatalyst substance may be irradiated with light after attaching the substrate to be transferred to the element layer.

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate.

Accordingly, since elements can be freely transferred to various types of substrates, a material for the substrate can be selected from a wider range of materials. In addition, an inexpensive material can be used for a substrate, and a semiconductor device can be manufactured at low cost, in addition to having various functions suitable for applications.

Embodiment Mode 4

Embodiment Mode 4 will describe a display device having a structure different from that in Embodiment Mode 2. Specifically, a structure of an active matrix type display device is shown.

Figure 10A:
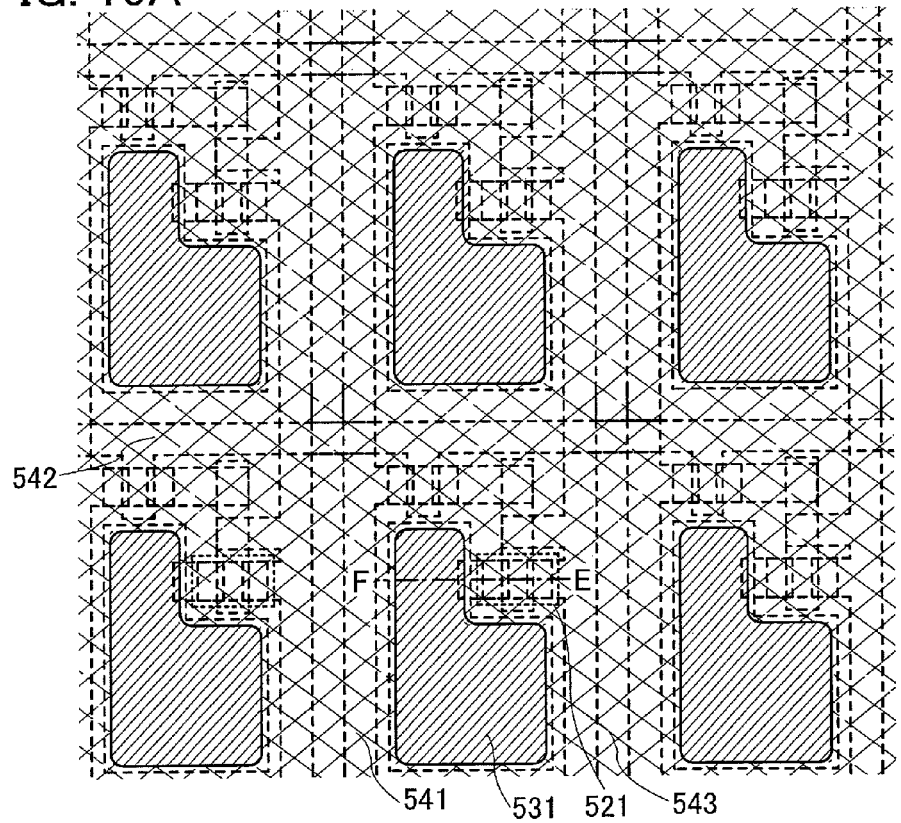
FIGS. 10A and 10B show a display device according to an aspect of the present invention.
Figure 10B:
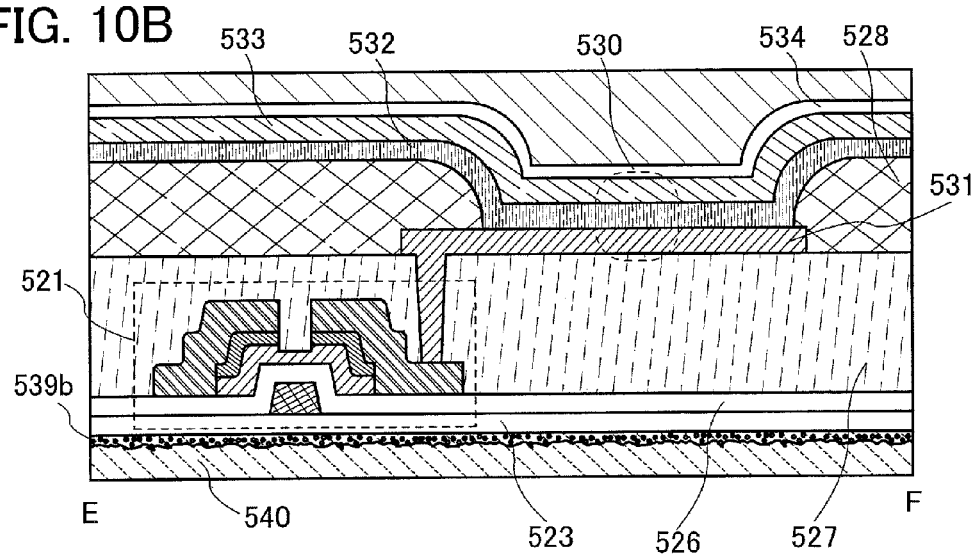

FIG. 10A shows a top view of the display device, and FIG. 10B shows a cross-sectional view taken along a line E-F in FIG. 10A. In addition, in FIG. 10A, an electroluminescent layer 532, a second electrode layer 533, and an insulating layer 534 are omitted and not illustrated, but provided as shown in FIG. 10B.

A first wiring extending in a first direction and a second wiring extending in a second direction perpendicular to the first direction are provided in a matrix. The first wiring is connected to a source electrode or a drain electrode of a transistor 521, and the second wiring is connected to a gate electrode of the transistor 521. A first electrode layer 531 is connected to the source electrode or the drain electrode of the transistor 521, which is not connected to the first wiring. Light-emitting element 530 is provided by a stacked structure of the first electrode layer 531, the electroluminescent layer 532, and the second electrode layer 533. A partition wall (insulating layer) 528 is provided between adjacent light-emitting elements. Over the first electrode layer and the partition wall (insulating layer) 528, the electroluminescent layer 532 and the second electrode layer 533 are stacked. An insulating layer 534 that is a protective layer is provided over the second electrode layer 533. In addition, the reverse staggered type thin film transistor shown in FIGS. 9A to 9C is used for the transistor 521 (FIGS. 10B and 11A).

In the display device shown in FIG. 10B, the element layer is provided over a third substrate 540 with the organic compound layer 539b interposed therebetween, and includes insulating layers 523, 526, 527, 528 ad a transistor 521.

Figure 11A:
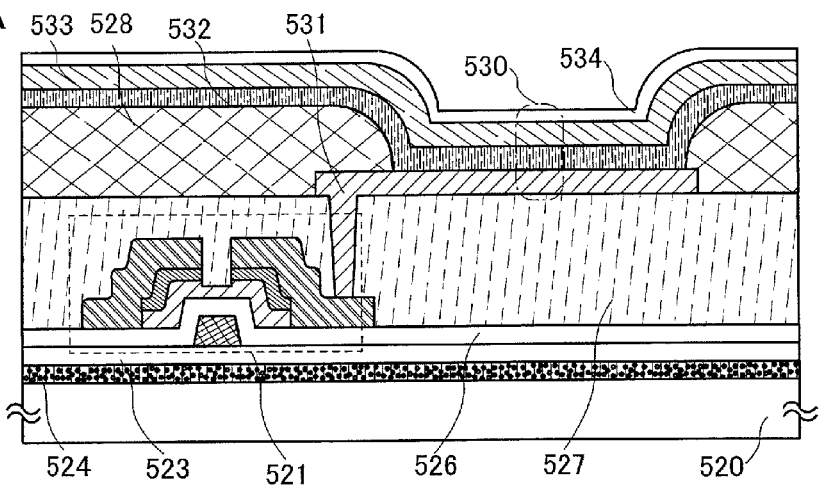
FIGS. 11A to 11C show a manufacturing method of a display device according to an aspect of the present invention.
Figure 11B:
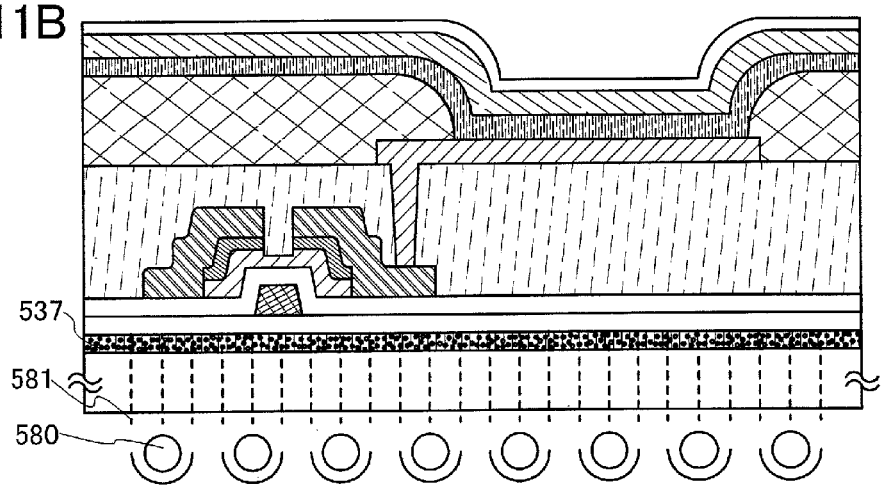
Figure 11C:
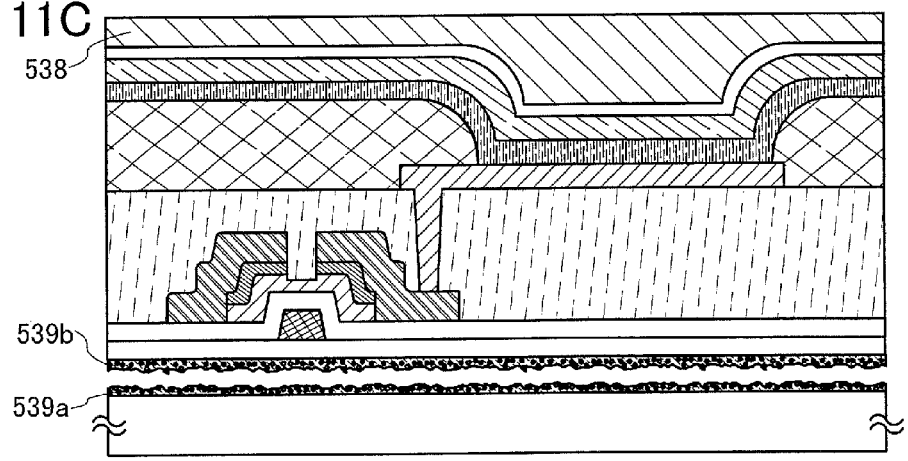

FIGS. 11A to 11C show a manufacturing process of a display device shown in FIGS. 10A and 10B. In FIGS. 11A to 11C, an organic compound layer 524 including a photocatalyst substance is provided between a first substrate 520 and an element layer including a transistor 521 and a light-emitting element 530. As the first substrate 520, an appropriate substrate may be selected, which is suitable for conditions in a manufacturing process, in other words, which can withstand a process (such as a heat treatment) in forming a display element included in the element layer. A photocatalyst substance is included in the organic compound layer 524.

After that, the photocatalyst substance is irradiated with light 581 emitted from a light source 580 from the light-transmitting first substrate 520 side, passing through the first substrate 520 (FIG. 11B).

The photocatalyst substance absorbs the light 581, and thus, the photocatalyst substance is activated by the light 581. The activation energy acts on the peripheral organic compound included in the organic compound layer 524 including a photocatalyst substance, and as a result, changes and modifies properties of the organic compound. In other words, by the energy of the activated photocatalyst substance (oxidizability), a carbon-hydrogen bond and a carbon-carbon bond of such organic compound are separated, and a part of the organic compound becomes carbon dioxide and water, and is degassed. Consequently, the organic compound layer 524 including a photocatalyst substance becomes rough, so that it becomes the organic compound layer 537 including a photocatalyst substance.

A second substrate 538 is provided over the insulating film 534 of the element layer including the transistor 521 and the light-emitting element 530 (FIG. 11C). The second substrate 538 may be attached to the element layer by using an adhesive or the like, or a protective layer such as a resin layer may be directly formed over the element layer.

When power is applied to the second substrate 538 side so as to transfer the element layer including the transistor 521 and the light-emitting element 530, the strength of the organic compound layer 537 including a photocatalyst substance decreases, and thus, the organic compound layer 539b including a photocatalyst substance on the element layer side and the organic compound layer 539a including a photocatalyst substance on the substrate side are separated (sectioned) from each other within the layer. Accordingly, the element layer including the transistor 521 and the light-emitting element 530 can be peeled from the first substrate 520.

Figure 12A:
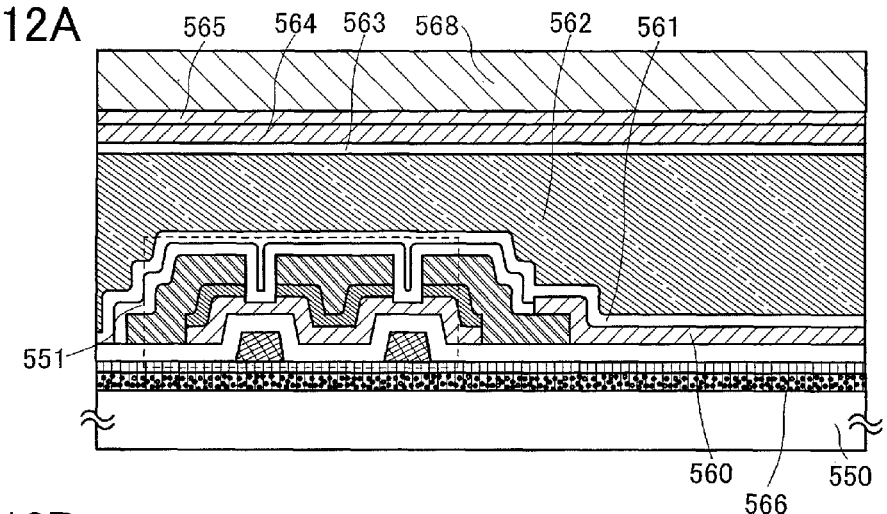
FIGS. 12A to 12C show a manufacturing method of a display device according to an aspect of the present invention.
Figure 12B:
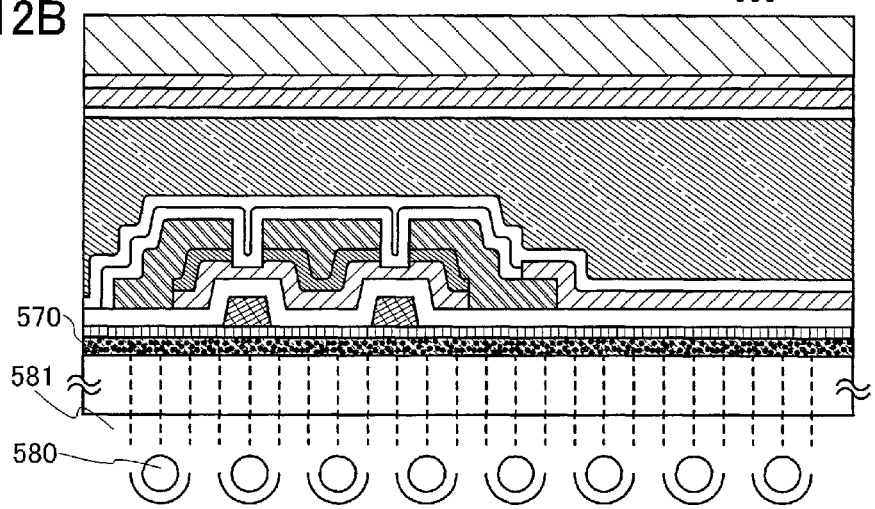
Figure 12C:
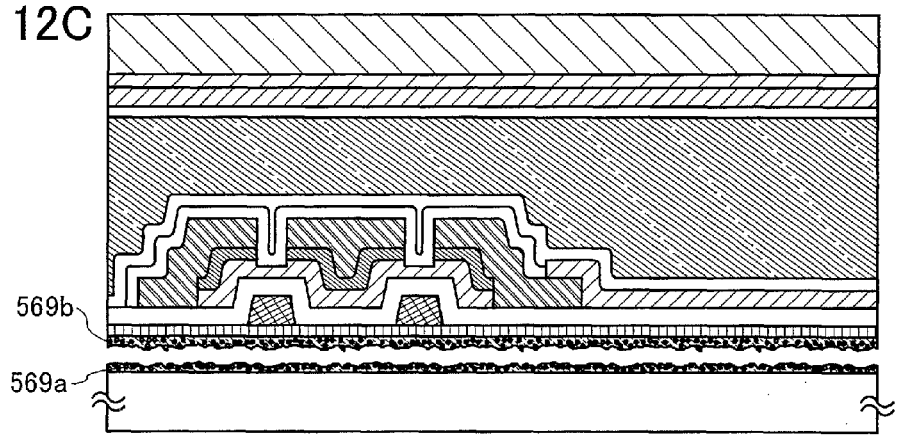

FIGS. 12A to 12C show a manufacturing process of an active matrix type liquid crystal display device to which the present invention is applied. In FIGS. 12A to 12C, a first substrate 550 and a second substrate 568 face to each other with a liquid crystal layer 562 interposed therebetween, in which an organic compound layer 566 including a photocatalyst substance, a transistor 551 having a multigate structure, a pixel electrode layer 560, and an insulating layer 561 serving as an alignment film are provided for the first substrate 550, and an insulating layer 563 serving as an alignment film, a counter electrode 564, and a colored layer 565 serving as a color filter are provided for the second substrate 568. An organic compound layer 566 including a photocatalyst substance is provided between the first substrate 550, and the element layer including the transistor 551 and the pixel electrode layer 560. As the first substrate 550, an appropriate substrate may be selected, which is suitable for conditions in a manufacturing process, in other words, which can withstand a process (such as a heat treatment) in forming a liquid crystal display element included in the element layer. A photocatalyst substance is included in the organic compound layer 566.

After that, the photocatalyst substance is irradiated with light 581 which is emitted from a light source 580 and passes through the first substrate 550, from the light-transmitting first substrate 550 side (FIG. 12B).

The photocatalyst substance absorbs the light 581, and thus, the photocatalyst substance is activated by the light 581. The activation energy acts on the peripheral organic compound included in the organic compound layer 566 including a photocatalyst substance, and as a result, changes and modifies properties of the organic compound. In other words, by the energy of the activated photocatalyst substance (oxidizability), a carbon-hydrogen bond and a carbon-carbon bond of such organic compound are separated, and a part of the organic compound becomes carbon dioxide and water, and is degassed. Consequently, the organic compound layer 566 including a photocatalyst substance becomes rough, so that it becomes the organic compound layer 570 including a photocatalyst substance.

When power is applied to the second substrate 568 side so as to transfer the element layer including the transistor 551 and the liquid crystal display element, the strength of the organic compound layer 570 including a photocatalyst substance decreases, and thus, the organic compound layer 569b including a photocatalyst substance on the element layer side and the organic compound layer 569a including a photocatalyst substance on the substrate side are separated (sectioned) from each other within the layer. Accordingly, the element layer including the transistor 551 and the display element can be peeled from the first substrate 550 (FIG. 12C).

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate.

Accordingly, since elements can be freely transferred to various types of substrates, a material for the substrate can be selected from a wider range of materials. In addition, an inexpensive material can be used for a substrate, and a semiconductor device can be manufactured at low cost, in addition to having various functions suitable for applications.

Figure 13A:
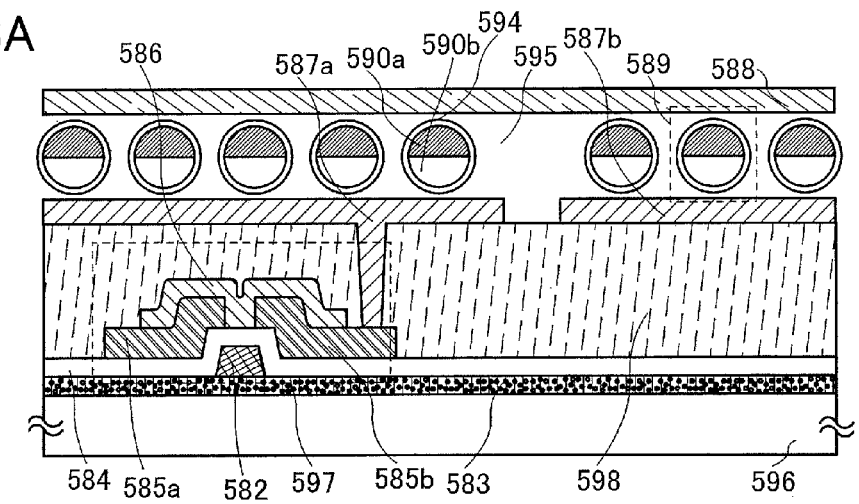
FIGS. 13A to 13C show a manufacturing method of a display device according to an aspect of the present invention.
Figure 13B:
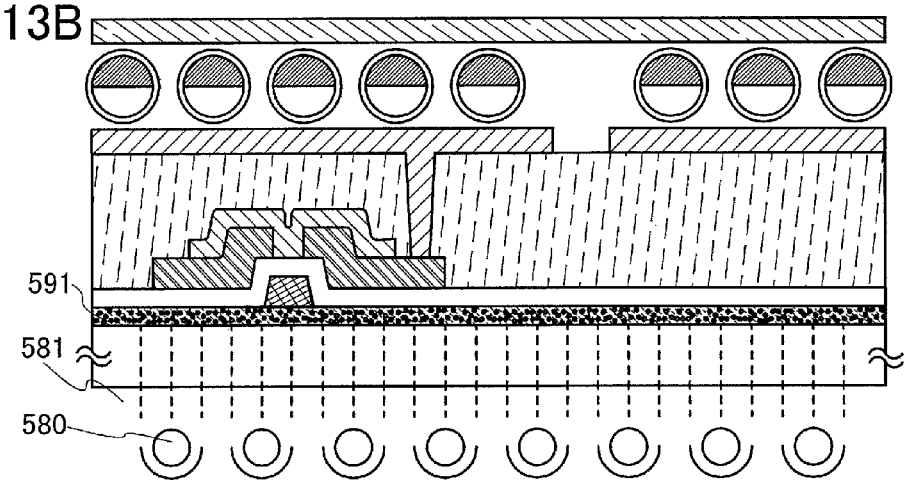
Figure 13C:
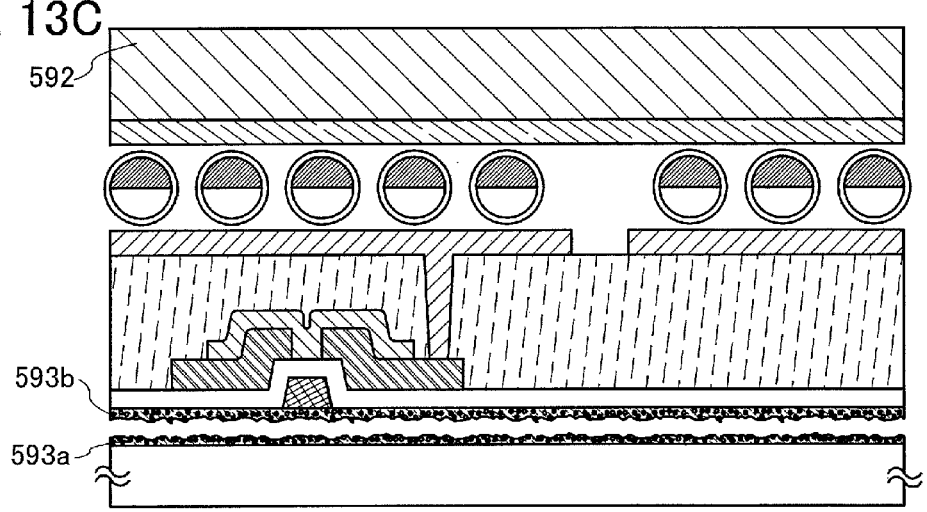

FIGS. 13A to 13C show a manufacturing process of an active matrix type electronic paper to which the present invention is applied. Although FIGS. 13A to 13C show an active matrix type one, the present invention can also applied to a passive matrix type electronic paper.

Although FIGS. 12A to 12C show a liquid crystal display element as an example of a display element, a display device using a twist ball display system may be used. A twist ball display system means a method in which spherical particles which are colored separately in black and white are arranged between the first conductive layer and the second conductive layer, and a potential difference is generated between the first conductive layer and the second conductive layer so as to control directions of the spherical particles, so that display is performed.

An organic compound layer 583 including a photocatalyst substance is provided between a light-transmitting substrate 596 and an element layer including spherical particles 589. As the first substrate 596, an appropriate substrate may be selected, which is suitable for conditions in a manufacturing process, in other words, which can withstand a process (such as a heat treatment) in forming a display element included in the element layer. A photocatalyst substance is included in the organic compound layer 583.

The transistor 597 is a reverse coplanar type thin film transistor, and includes a gate electrode layer 582, a gate insulating layer 584, wiring layers 585a and 585b, and a semiconductor layer 586. In addition, the wiring layer 585b is electrically connected to the first electrode layers 587a and 587b through an opening formed in the insulating layer 598. Between the first electrode layers 587a and 587b, and the second electrode layer 588, the spherical particles 589 which each include a black region 590a and a white region 590b, and on the periphery thereof, a cavity 594 which is filled with liquid, is provided. The circumference of the spherical particle 589 is filled with a filler 595 such as resin or the like (FIGS. 13A to 13C).

After that, the photocatalyst substance is irradiated with light 581 which is emitted from a light source 580 and passes through the first substrate 596, from the light-transmitting first substrate 596 side (FIG. 13B).

The photocatalyst substance absorbs the light 581, and thus, the photocatalyst substance is activated by the light. The activation energy acts on the peripheral organic compound included in the organic compound layer 583 including a photocatalyst substance, and as a result, changes and modifies properties of the organic compound. In other words, by the energy of the activated photocatalyst substance (oxidizability), a carbon-hydrogen bond and a carbon-carbon bond of such organic compound are separated, and a part of the organic compound becomes carbon dioxide and water, and is degassed. Consequently, the organic compound layer 583 including a photocatalyst substance becomes rough, so that it becomes the organic compound layer 591 including a photocatalyst substance.

When power is applied to the second substrate 592 side so as to transfer the element layer including the transistor 597 and the display element, the strength of the organic compound layer 591 including a photocatalyst substance decreases, and thus, the organic compound layer 593*b* including a photocatalyst substance on the element layer side and the organic compound layer 593*a* including a photocatalyst substance on the substrate side are separated (sectioned) from each other within the layer. Accordingly, the element layer including the transistor 597 and the spherical particles 589 can be peeled from the first substrate 596 (FIG. 13C).

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and the element with good shape can be easily and freely transferred to various types of substrates.

Accordingly, since elements can be transferred to various types of substrates, a material for the substrate can be selected from a wider range of materials. In addition, an inexpensive material can be used for a substrate, and a semiconductor device can be manufactured at low cost, in addition to having various functions suitable for applications.

Further, instead of the twist ball, an electrophoretic element can also be used. A microcapsule having a diameter of 10 μm to 200 μm which is filled with transparent liquid, positively charged white microparticles and negatively charged black microparticles and sealed, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element, and is called an electronic paper in general. The electrophoretic display element has higher reflectance than a liquid crystal display element, and thus, an assistant light is unnecessary, power consumption is low, and a display portion can be recognized in a dusky place. Even when power is not supplied to the display portion, an image which has been displayed once can be stored. Thus, it is possible that a displayed image can be stored, even if a semiconductor device having a display function is distanced from a source of an electronic wave.

The transistor may have any structure, as long as the transistor can serve as a switching element. As a semiconductor layer, various semiconductors such as an amorphous semiconductor, a crystalline semiconductor, a polycrystalline semiconductor, and a microcrystal semiconductor can be used, or an organic transistor may be formed using an organic compound.

According to the present invention, a semiconductor device and a display device can be manufactured using a peeling process, in which a transfer process can be conducted with a good state in which a shape and property of the element before peeling are kept. Therefore, more highly reliable semiconductor devices and display devices can be manufactured with high yield without complicating the apparatus and the process for manufacturing.

Embodiment Mode 5

Figure 14A:
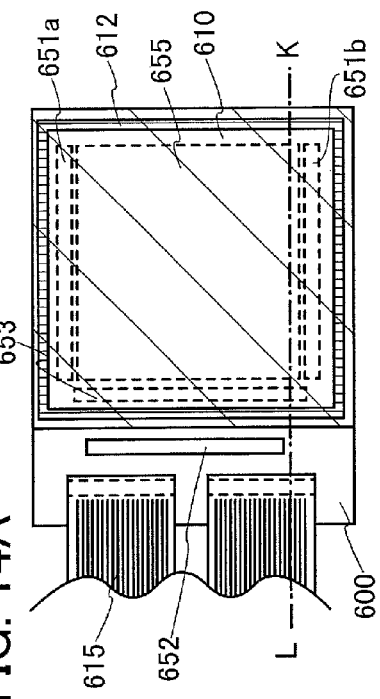
FIGS. 14A and 14B are a top view and a cross-sectional view of a display device according to an aspect of the present invention.

An embodiment mode of the present invention is described with reference to FIGS. 14A and 14B. Embodiment Mode 5 shows an example in which a channel etch type reverse staggered thin film transistor is used as a thin film transistor, and an interlayer insulating layer is not formed over the thin film transistor. Thus, detailed description of the same portions or portions having the same function are omitted. FIG. 14A is a top view of a light-emitting display device which is manufactured using a transfer process of the present invention, and FIG. 14B is a cross sectional view of FIG. 14A.

Figure 14B:
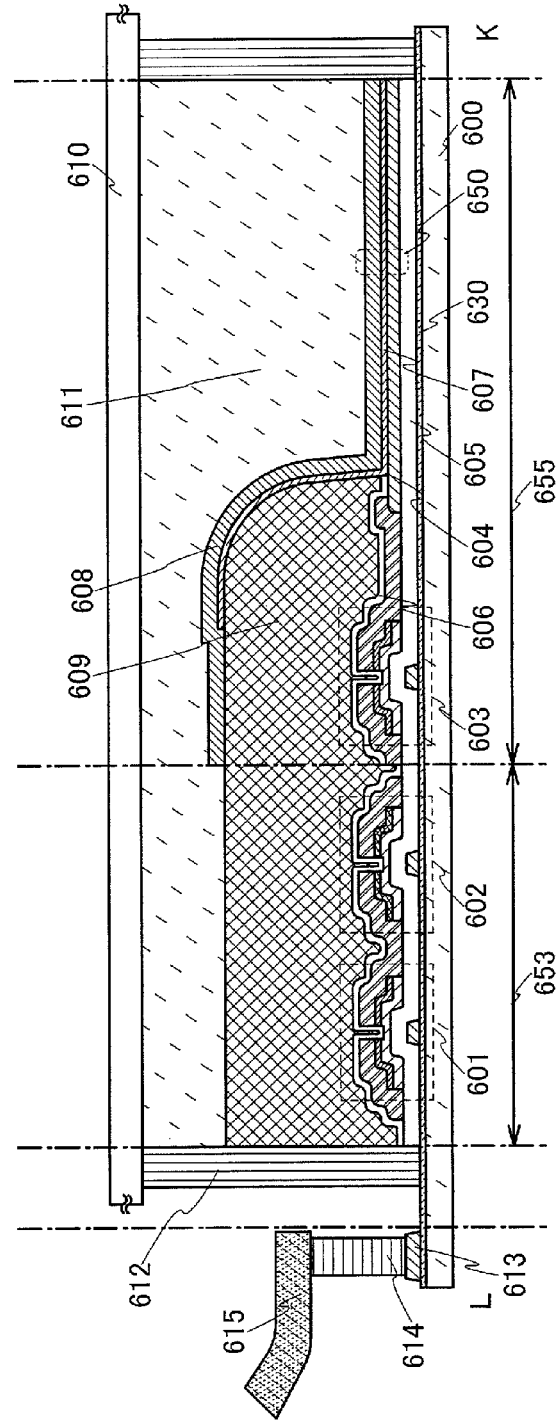

As shown FIGS. 14A and 14B, a pixel portion 655, driver circuit regions 651*a* and 651*b* which are scan line driver circuits, and a driver circuit 653 are sealed between a substrate 600 and a sealing substrate 610 by a sealing material 612, and a driver circuit region 652 which is a signal line driver circuit using an IC driver is provided over the substrate 600. Over the substrate 600, in a driver circuit region 653, reverse staggered type thin film transistors 601 and 602 are provided; in a pixel portion 655, an reverse staggered type thin film transistor 603, a gate insulating layer 605, an insulting film 606, an insulating layer 609, a light-emitting element 650 in which a first electrode layer 604, an electroluminescent layer 607 and a second electrode layer 608 are stacked, a filler 611, a sealing substrate 610 are provided; in a sealing region, a sealing material 612, a terminal electrode layer 613, an anisotropic conductive layer 614 and an FPC 615 are provided.

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate. The remaining layer on the element layer side after peeling the organic compound layer including a photocatalyst substance is the organic compound layer 630 including a photocatalyst substance. The organic compound layer 630 including a photocatalyst substance may be transferred to the sealing substrate 610, and then, may be removed by polishing or the like.

Accordingly, since elements can be transferred to various types of substrates, a material for the substrate can be selected from a wider range of materials. In addition, an inexpensive material can be used for a substrate, and a semiconductor device can be manufactured at low cost, in addition to having various functions suitable for applications.

Gate electrode layers, source electrode layers, and drain electrode layers of the reverse staggered type thin film transistors 601, 602, 603 are formed by a droplet-discharging method. The droplet-discharging method is a method in which a composition having a liquid conductive material is discharged, solidified by drying or baking so as to form a conductive layer or an electrode layer. When a composition including an insulating material is discharged and solidified by drying or baking, an insulating layer can also be formed. Since a component of a display device, such as a conductive layer or an insulating layer can be selectively formed, the process is simplified and material loss can be prevented. Therefore, a display device can be manufactured at low cost with high productivity.

A droplet-discharging means used in a droplet-discharging method is generally a means for discharging liquid droplets, such as a nozzle equipped with a composition discharge outlet, a head having one or a plurality of nozzles, or the like. Each nozzle of the droplet-discharging means is set such that the diameter is 0.02 to 100 μm (preferably less than or equal to 30 μm) and the quantity of component discharge from the nozzle is 0.001 to 100 pl (preferably greater than or equal to 0.1 pl and less than or equal to 40 pl, more preferably less than or equal to 10 pl). The discharge quantity is increased proportionately to the diameter of the nozzle. It is preferable that the distance between an object to be processed and the discharge outlet of the nozzle be as short as possible in order to drop the droplet at a desired position; the distance is preferably set to be 0.1 to 3 mm (much preferably less than or equal to 1 mm).

In the case where a film (e.g., an insulating film or a conductive film) is formed by a droplet-discharging method, the film is formed as follows: a composition containing a film material which is processed into a particle state is discharged, and the composition is fused or welded by baking to be solidified. A film formed by a sputtering method or the like tends to have a columnar structure, whereas the film thus formed by discharging and baking of the composition containing a conductive material tends to have a polycrystalline structure having the large number of grain boundaries.

As the composition to be discharged from the discharge outlet, a conductive material dissolved or dispersed in a solvent is used. The conductive material corresponds to a fine particle or a dispersed nanoparticle of metal such as Ag, Au, Cu, Ni, Pt, Pd, Ir, Rh, W, or Al, metal sulfide such as Cd or Zn, oxide of Fe, Ti, Si, Ge, Zr, Ba, or the like, silver halide, or the like. In addition, the above-described conductive materials may also be used in combination. As a transparent conductive film, indium tin oxide (ITO), indium tin oxide containing silicon oxide (ITSO), organic indium, organic tin, zinc oxide, titanium nitride, or the like can be used. Further, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may also be used. As for the composition to be discharged from the discharge outlet, it is preferable to use any of the materials of gold, silver, and copper dissolved or dispersed in a solvent, considering specific resistance, and it is more preferable to use silver or copper having low resistance. When silver or copper is used, a barrier film may be provided in addition as a countermeasure against impurities. A silicon nitride film or a nickel boron (NiB) film can be used as the barrier film.

The composition to be discharged is a conductive material dissolved or dispersed in a solvent, which further contains a dispersant or a thermosetting resin. In particular, the thermosetting resin has a function of preventing generation of cracks or uneven baking during baking. Thus, a formed conductive layer may contain an organic material. The contained organic material is different depending on heating temperature, atmosphere, or time. This organic material is an organic resin which functions as a thermosetting resin, a solvent, a dispersant, and a coating of a metal particle, or the like; typically, polyimide, acrylic, a novolac resin, a melamine resin, a phenol resin, an epoxy resin, a silicon resin, a furan resin, a diallyl phthalate resin, or other organic resins can be given as examples.

In addition, a particle with a plurality of layers, in which a conductive material is coated with another conductive material, may also be used. For example, a particle with a three-layer structure in which copper is coated with nickel boron (NiB) and the nickel boron is further coated with silver, or the like may be used. As for the solvent, esters such as butyl acetate or ethyl acetate, alcohols such as isopropyl alcohol or ethyl alcohol, an organic solvent such as methyl ethyl ketone or acetone, or water is used. The viscosity of the composition is preferably less than or equal to 20 mPa·s (cp), which prevents the composition from drying, and enables the composition to be discharged smoothly from the discharge outlet. The surface tension of the composition is preferably less than or equal to 40 mN/m. However, the viscosity of the composition and the like may be appropriately controlled depending on a solvent to be used or an intended purpose. For example, the viscosity of a composition in which ITO, organic indium, or organic tin is dissolved or dispersed in a solvent may be set to be 5 to 20 mPa·s, the viscosity of a composition in which silver is dissolved or dispersed in a solvent may be set to be 5 to 20 mPa·s, and the viscosity of a composition in which gold is dissolved or dispersed in a solvent may be set to be 5 to 20 mPa·s.

Further, the conductive layer may also be formed from a plurality of stacked conductive materials. In addition, the conductive layer may be formed first by a droplet-discharging method using silver as a conductive material and may be then plated with copper or the like. The plating may be performed by electroplating or a chemical (electroless) plating method. The plating may be performed by immersing a substrate surface in a container filled with a solution containing a plating material; alternatively, the solution containing a plating material may be applied to the substrate placed obliquely (or vertically) so as to flow the solution containing a plating material on the substrate surface. When the plating is performed by application of a solution to the substrate placed obliquely, there is an advantage of miniaturizing a process apparatus.

The diameter of a particle of the conductive material is preferably as small as possible for the purpose of preventing nozzles from being clogged and for manufacturing a minute pattern, although it depends on the diameter of each nozzle, a desired shape of a pattern, or the like. Preferably, the diameter of the particle of the conductive material is less than or equal to 0.1 μm. The composition is formed by a known method such as an electrolyzing method, an atomizing method, or a wet reduction method, and the particle size is generally about 0.01 to 10 μm. When a gas evaporation method is employed, the size of nanoparticles protected by a dispersant is as minute as about 7 nm, and when the surface of each particle is covered with a coating, the nanoparticles do not aggregate in the solvent and are stably dispersed in the solvent at room temperature, and behave similarly to liquid. Accordingly, it is preferable to use a coating.

In addition, the step of discharging the composition may be performed under reduced pressure. When the step is performed under reduced pressure, an oxide film or the like is not formed on the surface of the conductive material, which is preferable. After the composition is discharged, either drying or baking or both of them is/are performed. Both the drying step and baking step are heat treatments; however, for example, drying is performed at 100° C. for 3 minutes and baking is performed at 200 to 350° C. for 15 to 60 minutes, and they are different in purpose, temperature, and time period. The steps of drying and baking are performed under normal pressure or under reduced pressure, by laser irradiation, rapid thermal annealing, heating using a heating furnace, or the like. It is to be noted that the timing of such a heat treatment is not particularly limited. The substrate may be heated in advance to favorably perform the steps of drying and baking, and the temperature at that time is, although it depends on the material of the substrate or the like, generally 100 to 800° C. (preferably, 200 to 350° C.). Through these steps, nanoparticles are made in contact with each other and fusion and welding are accelerated since a peripheral resin is hardened and shrunk, as well as the solvent in the composition is volatilized or the dispersant is chemically removed.

A continuous wave or pulsed gas laser or solid-state laser may be used for laser irradiation. An excimer laser, a YAG laser, or the like can be used as the former gas laser. A laser using a crystal of YAG, $YVO_4$, $GdVO_4$, or the like which is doped with Cr, Nd, or the like can be used as the latter solid-state laser. It is preferable to use a continuous wave laser in consideration of the absorptance of a laser beam. Moreover, a laser irradiation method in which pulsed and continuous wave lasers are combined may be used. It is preferable that the heat treatment by laser irradiation be instantaneously performed within several microseconds to several tens of seconds so as not to damage the substrate 100, depending on heat resistance of the substrate 100. Rapid thermal annealing (RTA) is carried out by raising the temperature rapidly and heating the substrate instantaneously for several microseconds to several minutes with the use of an infrared lamp or a halogen lamp which emits ultraviolet to infrared light in an inert gas atmosphere. Since this treatment is performed instantaneously, only an outermost thin film can be heated practically and the lower layer of the film is not adversely affected. In other words, even a substrate having low heat resistance such as a plastic substrate is not adversely affected.

After the conductive layer or the insulating layer is formed by discharging a liquid composition by a droplet-discharging method, the surface thereof may be planarized by pressing with pressure to enhance planarity. As a pressing method, concavity and convexity may be reduced by scanning the surface with a roller-shaped object, or the surface may be pressed perpendicularly by a flat plate-shaped object. A heating step may be performed at the time of pressing. Alternatively, the concavity and convexity of the surface may be removed with an air knife after the surface is softened or melted with a solvent or the like. A CMP method may also be used for polishing the surface. This step can be employed in planarizing a surface when concavity and convexity are generated by a droplet-discharging method.

In this embodiment mode, an amorphous semiconductor is used as a semiconductor layer and a semiconductor layer having one conductivity type may be formed as needed. In this embodiment mode, a semiconductor layer and an amorphous n-type semiconductor layer as a semiconductor layer having one conductivity type are stacked. Further, an NMOS structure of an N-channel TFT in which an n-type semiconductor layer is formed, a PMOS structure of a P-channel TFT in which a p-type semiconductor layer is formed, or a CMOS structure of an N-channel TFT and a P-channel TFT can be manufactured. In this embodiment mode, the reverse staggered thin film transistors 601 and 603 are N-channel TFTs, and the reverse staggered thin film transistor 602 is a P-channel TFT, thereby the reverse staggered thin film transistors 601 and 602 form a CMOS structure in the driver circuit region 653.

Moreover, in order to impart conductivity, an element imparting conductivity is added by doping and an impurity region is formed in the semiconductor layer; therefore, an N-channel TFT and/or a P-channel TFT can be formed. Instead of forming an n-type semiconductor layer, conductivity may be imparted to the semiconductor layer by a plasma treatment with a $PH_3$ gas.

Further, the semiconductor layer can be formed using an organic semiconductor material by a printing method, a spray method, a spin coating method, a droplet-discharging method, a dispenser method, or the like. In this case, the aforementioned etching step is not required; therefore, the number of steps can be reduced. As an organic semiconductor, a low molecular material such as pentacene, a high molecular material, or the like can be used, and a material such as an organic pigment or a conductive high molecular material can be used as well. As the organic semiconductor material used in the present invention, a high molecular material of a π electron conjugated system of which a skeleton is composed of conjugated double bonds is preferable. Typically, a soluble high molecular material such as polythiophene, polyfluorene, poly(3-alkylthiophene), or a polythiophene derivative can be used.

According to the present invention, a semiconductor device and a display device can be manufactured using a peeling process, in which a transfer process can be conducted with a good state in which a shape and property of the element before peeling are kept. Therefore, more highly reliable semiconductor devices and display devices can be manufactured with high yield without complicating the apparatus and the process for manufacturing.

Embodiment Mode 6

An embodiment mode of the present invention is described with reference to FIGS. 15A and 15B. FIGS. 15A and 15B show a liquid crystal display device which is manufactured using a peeling process of the present invention.

FIG. 15A is a top view of the liquid crystal display device which is manufactured using a peeling process of the present invention, and FIG. 15B is a cross sectional view of FIG. 15A.

As shown in FIG. 15A, a pixel portion 256, and driver circuit regions 258a and 258b which are scan line driver circuits are sealed between a substrate 200 and a sealing substrate 210 by a sealing material 282, and a driver circuit region 257 which is a signal line driver circuit using an IC driver is provided over the substrate 200. In the pixel portion 256, a transistor 220 is provided. The substrate 200 is attached to the peeled element layer and the organic compound layer 230 including a photocatalyst substance, and may be formed of a material which does not transmit light in a wavelength which activates the photocatalyst substance left in the element layer. The counter substrate 210 and the substrate 200 are flexible substrates, resin film or the like. It is concerned that a substrate formed from a synthetic resin generally has a lower allowable temperature limit than other substrates. However, a substrate with high heat resistance is adopted in a manufacturing process first and the substrate is replaced by a substrate formed from a synthetic resin, thereby making it possible to employ such a substrate formed from a synthetic resin.

In the display device shown in FIGS. 15A and 15B, over the substrate 200, in a pixel portion, a transistor 220 which is a reverse staggered type thin film transistor, a pixel electrode layer 201, an insulating layer 202, an insulating layer 203 serving as an alignment film, a liquid crystal layer 204, a spacer 281, an insulating layer 205 serving as an alignment layer, a counter electrode layer 206, a color filter 208, a black matrix 207, a counter substrate 210, and a polarizing plate 231 are provided; in a sealing region, a sealing material 282, a terminal electrode layer 287, an anisotropic conductive layer 285 and an FPC 286 are provided.

A gate electrode layer, a source electrode layer, and a drain electrode layer of the transistor 220 which is a reverse staggered type thin film transistor formed in this embodiment mode are formed by a droplet-discharging method. The droplet-discharging method is a method in which a composition having a liquid conductive material is discharged, solidified by drying or baking so as to form a conductive layer or an electrode layer. When a composition including an insulating material is discharged and solidified by drying or baking, an insulating layer can also be formed. Since a component of a display device, such as a conductive layer or an insulating layer can be selectively formed, the process is simplified and material loss can be prevented. Therefore, a display device can be manufactured at low cost with high productivity.

In this embodiment mode, an amorphous semiconductor is used as a semiconductor layer and a semiconductor layer having one conductive type may be formed as needed. In this embodiment mode, a semiconductor layer and an amorphous n-type semiconductor layer as a semiconductor layer having one conductive type are stacked. Further, an NMOS structure of an N-channel TFT in which an n-type semiconductor layer is formed, a PMOS structure of a P-channel TFT in which a p-type semiconductor layer is formed, or a CMOS structure of an N-channel TFT and a P-channel TFT can be manufactured.

Moreover, in order to impart conductivity, an element imparting conductivity is added by doping and an impurity region is formed in the semiconductor layer; therefore, an N-channel TFT and/or a P-channel TFT can be formed. Instead of forming an n-type semiconductor layer, conductivity may be imparted to the semiconductor layer by plasma treatment with a $PH_3$ gas.

In this embodiment mode, the transistor 220 is an N-channel reverse staggered type thin film transistor. In addition, a channel protective type reverse staggered thin film transistor in which a protective layer is provided over the channel region of the semiconductor layer can also be used.

Further, the semiconductor layer can be formed using an organic semiconductor material by an evaporation method, a printing method, a spray method, a spin coating method, a droplet-discharging method, a dispenser method, or the like. In this case, the etching step is not necessarily conducted; therefore, the number of steps can be reduced. As an organic semiconductor, a low molecular material such as pentacene, a high molecular material or the like can be used, and a material such as an organic pigment and a conductive high molecular material can be used as well. As the organic semiconductor material used in the present invention, a high molecular material of a π electron conjugated system of which a skeleton is composed of conjugated double bonds is preferable. Typically, a soluble high molecular material such as polythiophene, polyfluorene, poly(3-alkylthiophene), or a polythiophene derivative can be used.

In the pixel portion 256, a base film may be provided between the transistor 220 and the organic compound layer including a photocatalyst substance. The base film may be formed from an inorganic insulating film or an organic insulating film, or a stack of the inorganic insulating film and the organic insulating film. There are many methods for forming a thin film transistor in addition to the above method, and the thin film transistor can be manufactured by any method. For example, a crystalline semiconductor film is used as an active layer. A gate electrode is provided over the crystalline semiconductor film with a gate insulating film interposed therebetween. An impurity element can be added to the active layer using the gate electrode instead of a mask. Addition of the impurity element using the gate electrode instead of a mask makes it unnecessary to form a mask for addition of the impurity element. The gate electrode can have either a single-layer structure or a stacked-layer structure. The impurity region can be made a high concentration impurity region or a low concentration impurity region by controlling the concentration thereof. A structure of such a thin film transistor having such a low concentration impurity region is referred to as an LDD (Lightly doped drain) structure. In addition, the low concentration impurity region can be formed to be overlapped with the gate electrode. A structure of such a thin film transistor is referred to as a GOLD (Gate Overlapped LDD) structure. Polarity of the thin film transistor is to be an n-type by using phosphorus (P) or the like in the impurity region. When polarity of the thin film transistor is to be a p-type, boron (B) or the like may be added. Thereafter, an insulating film covering the gate electrode and the like is formed. A dangling bond of the crystalline semiconductor film can be terminated by a hydrogen element mixed into the insulating film.

In order to improve planarity, an interlayer insulating film may be formed. For the interlayer insulating film, an organic material, an inorganic material, or a stacked structure thereof can be used. The interlayer insulating film can be formed from a material selected from silicon oxide, silicon nitride, silicon oxynitride, silicon nitride oxide, aluminum nitride, aluminum oxynitride, aluminum nitride oxide or aluminum oxide containing a larger amount of nitrogen content than oxygen content, diamond like carbon (DLC), polysilazane, carbon containing nitrogen (CN), PSG (phosphosilicate glass), BPSG (borophosphosilicate glass), alumina, and a substance containing another inorganic insulating material. Further, an organic insulating material may be used. As the organic material, which may be either photosensitive or nonphotosensitive, polyimide, acryl, polyamide, polyimide amide, resist, benzocyclobutene, a siloxane resin, or the like can be used. It is to be noted that the siloxane resin corresponds to a resin including a Si—O—Si bond. Siloxane has a skeleton structure of a bond of silicon (Si) and oxygen (O). As for a substituent, an organic group containing at least hydrogen (such as an alkyl group or aromatic hydrocarbon) is used. As for a substituent, a fluoro group may be used. Further, as for a substituent, an organic group containing at least hydrogen and a fluoro group may be used.

The pixel portion and the driver circuit region can be formed over the same substrate by using the crystalline semiconductor film.

A structure of the thin film transistor in the pixel portion is not limited to this embodiment mode, and the thin film transistor in the pixel portion may have a single-gate structure in which one channel formation region is formed, a double-gate structure in which two channel formation regions are formed, or a triple-gate structure in which three channel formation regions are formed. A thin film transistor in the peripheral driver circuit region may have a single-gate structure, a double-gate structure, or a triple-gate structure.

Further, the present invention is not limited to the manufacturing method of a thin film transistor shown in this embodiment mode. The present invention can be applied to a thin film transistor having a top-gate structure (such as a staggered type), a thin film transistor having a bottom-gate structure (such as a coplanar type), a thin film transistor a dual-gate structure in which two gate electrode layers are arranged above and below a channel formation region through a gate insulating film, or some other structures.

Next, an insulating layer 203 referred to as an alignment film is formed by a printing method or a droplet-discharging method so as to cover the pixel electrode layer 201 and the spacer 281. The insulating layer 203 can be selectively formed when a screen printing method or an off-set printing method is used. After that, a rubbing treatment is performed. When a liquid crystal mode, for example, a VA mode, is employed, there are cases when a rubbing treatment is not performed. An insulating layer 205 serving as an alignment film is similar to the insulating layer 203. Subsequently, the sealing material 282 is formed in the peripheral region where the pixel is formed by a droplet-discharging method, a dispenser method or the like.

After that, the counter substrate 210 in which an insulating layer 205 serving as an alignment film, a counter electrode layer 206, a colored layer 208 serving as a color filter, and a black matrix are provided, is attached to the TFT substrate, with a spacer 281 between the counter substrate and the TFT substrate. The space between the counter substrate and the TFT substrate is provided with a liquid crystal layer 204. Then, a polarizing plate 231 is provided on the outer side of the counter substrate 210. In this embodiment mode, a metal layer having reflectivity to visible light is used for the pixel electrode layer 201, and light passes through the counter substrate 210 so as to extract outside. Thus, the example in which the polarizing plate is provided for the counter substrate 210 side only is shown. However, when light is extracted from the substrate 200 side by using a transparent electrode layer as the pixel electrode layer, a polarizing plate is provided also on the side opposite to the surface of the substrate in which elements are formed. In addition, a retardation plate may be provided between the polarizing plate 231 and the counter substrate 210, which may serve as a circular polarizing plate. The polarizing plate can be provided over the substrate by using an adhesive layer. A filler may be mixed in the sealing material. Note that the color filter and the like may be formed from materials which exhibit red (R), green (G), and blue (B) in the case where the liquid crystal display device performs full-color display, or it may be formed from a material which exhibits at least one color in the case of mono-color display.

Note that the color filter is not provided in some cases where light-emitting diodes (LEDs) of RGB or the like are arranged as a backlight and a successive additive color mixing method (field sequential method) in which color display is performed by time division is employed. The black matrix is provided to as to be overlapped with a transistor and a CMOS circuit for the sake of reducing reflection of external light due to wirings of the transistor and the CMOS circuit. Note that the black matrix may be provided so as to be overlapped with a capacitor element. This is because reflection on a metal film constituting a part of the capacitor element can be prevented.

As a method for forming the liquid crystal layer, a dispenser method (dripping method) or an injecting method in which liquid crystal is injected using a capillary phenomenon after attaching the substrate having an element and the counter substrate 210 can be used. A dripping method may be applied when a large-sized substrate to which it is difficult to apply an injecting method is used.

In the present invention, after the element layer is formed over the substrate which can withstand a process condition (such as a temperature) with the organic compound layer including a photocatalyst substance interposed therebetween, a transfer process to a desired substrate (for example, a flexible substrate such as a film) is conducted. In the transfer process, light irradiation is conducted by transmitting the light through the substrate over which the organic compound layer including a photocatalyst substance is formed (so called rear exposure). The photocatalyst substance activated by the light decomposes the peripheral organic compound into carbon dioxide and water, and makes the layer rough. The structure of the organic compound layer including a photocatalyst substance is made rough and the strength thereof decreases so that the layer becomes fragile. Thus, when power in opposite directions is applied from both sides of the substrate side and the element layer side, the organic compound layer including a photocatalyst substance is sectioned (separated) into the substrate side and the element layer side, thereby transferring the element layer to the counter substrate side. In this embodiment mode, after transferring the element layer to the counter substrate side, the element layer is attached to the substrate 200.

As for formation of the liquid crystal layer, the transfer process to the substrate 200 may be conducted before or after forming the liquid crystal layer. For example, when a dispenser method is used as the formation method, a TFT and an alignment film may be formed, the element layer including the TFT element may be transferred to the substrate 200 before dropping a liquid crystal, then, the liquid crystal may be dropped onto the element layer formed over the substrate 200 to form the liquid crystal layer, and then, it may be sealed by using the counter substrate. Alternatively, an element layer may be formed over a glass substrate or the like which can withstand the process, and attached to a counter substrate while keeping a space formed by a spacer, and then, a liquid crystal may be injected between the element layer and the counter substrate by an injection method so as to form a liquid crystal layer. In a display device in which steps including up to and including a liquid crystal layer are finished, the element layer and the liquid crystal layer formed over an organic compound layer including a photocatalyst substance may be peeled from a processing substrate with the use of a function of the photocatalyst substance, and then, attached to the substrate 200.

A spacer may be provided in such a way that particles having a size of several μm are sprayed, or a resin film is formed over an entire surface of a substrate and etched. The material of such a spacer is applied by a spinner and then, subjected to exposure and development, so that a predetermined pattern is formed. Moreover, the spacer is heated at 150 to 200° C. in a clean oven or the like so as to be hardened. The thus manufactured spacer can have various shapes depending on the conditions of the exposure and development. It is preferable that the spacer have a columnar shape with a flat top so that mechanical strength for the liquid crystal display device can be secured when the counter substrate is attached. The shape can be conic, pyramidal, or the like, there are no particular limitations on the shape. Further, in this embodiment mode, the spacer 281 having curvature is provided over the pixel electrode layer 201, and covered with the insulating layer 203 serving as an alignment layer. When the alignment film is formed over the spacer in this manner, a contact or a short circuit caused by defective coverage or the like between the element electrode layer on the element layer side and the counter substrate, can be prevented. In addition, the shape of the spacer 281 is columnar, and has a curvature in a ridge portion of the column. In other words, the curvature radius R of an end portion in the top portion of the columnar spacer is 2 μm or less, preferably 1 μm or less. An even pressure can be applied, because of the shape like this, and thus, application of an excess pressure to one point can be prevented. Note that a low end of the spacer indicates an end portion of the columnar spacer of the flexible substrate 200 side, and an upper end thereof indicates a top portion of the columnar spacer. The width of a center portion in the height direction of the columnar spacer is L1, and the width of the end portion on the flexible second substrate side, of the columnar spacer is L2. $0.8 \leq L2/L1 \leq 3$ is satisfied. In addition, an angle between a tangent plane at the center of the side surface of the columnar spacer and a surface of the first flexible substrate or an angle between a tangent plane at the center of the side surface of the columnar spacer and a surface of the second flexible substrate is preferably in the range of 65° to 115°. Further, the height of the spacer is preferably in the range of 0.5 μm to 10 μm or in the range of 1.2 μm to 5 μm.

Subsequently, a terminal electrode layer 287 electrically connected to the pixel portion is provided with an FPC 286, which is a wiring board for connection, through an anisotropic conductive layer 285. The FPC 286 has a function of transmitting external signals or potential. Through the above steps, a liquid crystal display device having a display function can be manufactured.

A wiring included in the transistor, the gate electrode layer, the pixel electrode layer 201, and the conductive layer 206 that is a counter electrode layer can be formed from a material selected from indium tin oxide (ITO), indium zinc oxide (IZO) in which zinc oxide (ZnO) is mixed with indium oxide, a conductive material in which silicon oxide ($SiO_2$) is mixed with indium oxide, organoindium, organotin, indium oxide containing tungsten oxide, indium zinc oxide containing tungsten oxide, indium oxide containing titanium oxide, or indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu) or silver (Ag); an alloy of such metals; or metal nitride thereof.

Materials of the pixel electrode layer 201 and the conductive layer 206 may be selected as appropriated, depending on the types of the display device, i.e., a transmissive type display device or a reflective type display device. When light needs to pass, a light-transmitting electrode or a metal film enough to transmit light may be selected from the above described electrode materials.

According to the present invention, a semiconductor device and a display device can be manufactured using a peeling process, in which a transfer process can be conducted with a good state in which a shape and property of the element before peeling are kept. Therefore, highly reliable semiconductor devices and display devices can be manufactured with high yield without complicating the apparatus and the process for manufacturing.

Embodiment Mode 7

Embodiment mode 7 will describe an example of the semiconductor devices described in the foregoing embodiment modes with reference to drawings.

A semiconductor device described in this embodiment mode is capable of contactless reading and writing of data. Data transmission method is broadly classified into three methods of an electromagnetic coupling method in which communication is performed by mutual induction with a pair of coils disposed opposite to each other, an electromagnetic induction method in which communication is performed by an inductive electromagnetic field, and an electric wave method in which communication is performed by using electric waves; and any of these methods may be employed. An antenna that is used for transmitting data can be provided in two ways. One way is to provide an antenna over a substrate provided with a plurality of elements and memory elements, and the other way is to provide a terminal portion for a substrate provided with a plurality of elements and memory elements and connect an antenna provided over another substrate to the terminal portion.

First, an example of a structure of the semiconductor device in the case where an antenna is provided over a substrate provided with a plurality of elements and memory elements is described with reference to FIG. 16.

Figure 16:
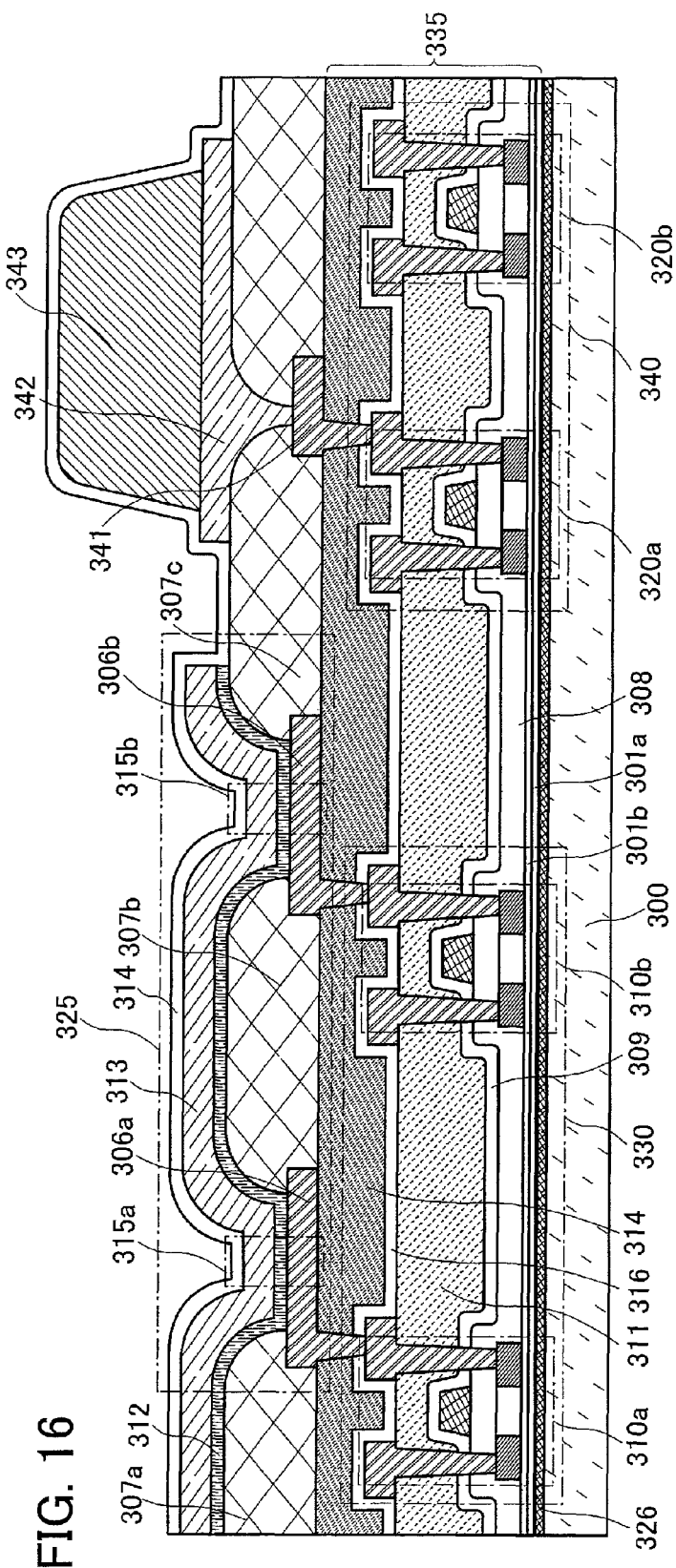
FIG. 16 is a cross-sectional view of a semiconductor device according to an aspect of the present invention.

FIG. 16 shows an active matrix type semiconductor device. An element-formation layer 335 which includes a transistor portion 330 having transistors 310a and 310b, a transistor portion 340 having transistors 320a and 320b, and insulating layers 301a, 301b, 308, 309, 311, 316, and 314 is provided over a substrate 300. A memory element portion 325 and a conductive layer 343 serving as an antenna are provided above the element-formation layer 335.

Although the case where the memory element portion 325 or the conductive layer 343 serving as an antenna is provided above the element-formation layer 335 is shown here, the structure is not limited thereto. The memory element portion 325 or the conductive layer 343 serving as an antenna can also be provided below the element-formation layer 335 or in the same layer as the element-formation layer 335.

The memory element portion 325 includes memory elements 315a and 315b. The memory element 315a is formed by stacking partition walls (insulating layers) 307a, 307b, an insulating layer (memory layer) 312, and a second conductive layer 313 over a first conductive layer 306a. The memory element 315b is formed by stacking partition walls (insulating layers) 307b, 307c, the insulating layer (memory layer) 312, and the second conductive layer 313 over a first conductive layer 306b. In addition, the insulating layer 314 serving as a protection film is formed to cover the second conductive layer 313. The first conductive layers 306a and 306b for forming the memory elements 315a and 315b are connected to source electrode layers or drain electrode layers of the transistors 310a and 310b, respectively. That is, each memory element is connected to one transistor. In addition, although the insulating layer (memory layer) 312 is formed over an entire surface so as to cover the first conductive layers 306a and 306b, and the partition walls (insulating layers) 307a, 307b, and 307c here, the insulating layer 312 may be selectively formed for each memory cell.

As described in the foregoing embodiment modes, in the memory element 315a, an element having a rectifying property may be provided between the first conductive layer 306a and the insulating layer (memory layer) 312, or between the insulating layer (memory layer) 312 and the second conductive layer 313. As the element having a rectifying property, the elements as described above also can be used. The same can be applied to the memory element 315b.

Here, the conductive layer 343 serving as an antenna is provided over a conductive layer 342 formed from the same layer as the second conductive layer 313, and electrically connected to the transistor 320a via the conductive layer 341 formed from the same layer as the first conductive layers 306a and 306b. Note that the conductive layer serving as an antenna may also be formed from the same layer as the second conductive layer 313.

As a material of the conductive layer 343 serving as an antenna, one kind of elements of gold (Au), platinum (Pt), nickel (Ni), tungsten (W), molybdenum (Mo), cobalt (Co), copper (Cu), aluminum (Al), manganese (Mn), titanium (Ti), and the like, an alloy containing a plurality of the elements, or the like can be used. In addition, as a forming method of the conductive layer 343 serving as an antenna, evaporation, sputtering, CVD, any printing method such as screen printing or gravure printing, a droplet-discharging method, or the like can be used.

Any of a P-channel TFT, an N-channel TFT, or a CMOS combining them can be provided as each of the transistors 310a, 310b, 320a, and 320b included in the element-formation layer 335. Further, the semiconductor layer in included the transistors 310a, 310b, 320a, and 320b can have any structure. For example, an impurity region (including a source region, a drain region, and an LDD region) may be formed, or either a P-channel type or an N-channel type may be employed. In addition, an insulating layer (a sidewall) may be formed in contact with a side surface of a gate electrode, or a silicide layer may be formed in one or both of source and drain regions and the gate electrode. As a material of the silicide layer, nickel, tungsten, molybdenum, cobalt, platinum, or the like can be used.

Further, an organic transistor in which a semiconductor layer is formed from an organic compound may be used for each of the transistors 310a, 310b, 320a, and 320b included in the element-formation layer 335. The element-formation layer 335 including an organic transistor can be formed by a printing method, a droplet-discharging method, or the like. By forming the element-formation layer 335 by a printing method, a droplet-discharging method, or the like, a semiconductor device can be manufactured at lower cost.

The element-formation layer 335, the memory elements 315a and 315b, and the conductive layer 343 serving as an antenna can be formed by an evaporation method, a sputtering method, a CVD method, a printing method, a droplet-discharging method, or the like as described above. In addition, different methods may be used depending on portions. For example, a transistor which requires high-speed operation can be provided by forming a semiconductor layer of Si or the like over a substrate and then crystallizing the semiconductor film by a heat treatment, and after that, another transistor serving as a switching element, which is an organic transistor, can be provided by a printing method or a droplet-discharging method, above the element-formation layer.

In addition, a sensor connecting to a transistor may be provided. As the sensor, an element which detects properties such as temperature, humidity, illuminance, gas, gravity, pressure, sound (vibration), or acceleration by a physical or chemical means can be given. The sensor is typically formed from a semiconductor element such as a resistor element, a capacitive coupling element, an inductive coupling element, a photovoltaic element, a photoelectric conversion element, a thermoelectric conversion element, a transistor, a thermistor, or a diode.

Next, one structural example of the semiconductor device in the case where a terminal portion is provided for a substrate provided with a plurality of elements and memory elements, and an antenna provided over another substrate is connected to the terminal portion is described with reference to FIG. 17

Figure 17:
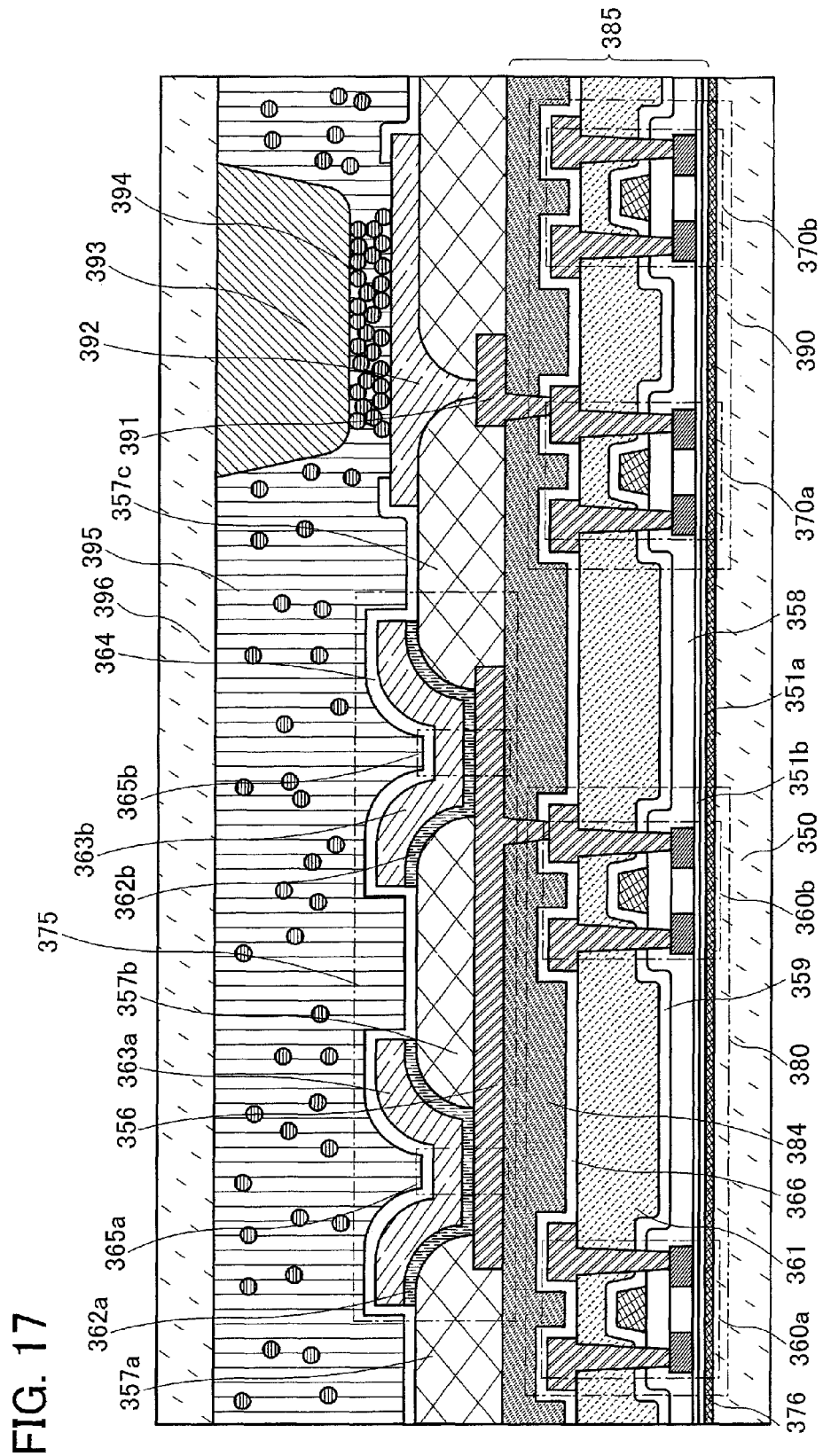
FIG. 17 is a cross-sectional view of a semiconductor device according to an aspect of the present invention.

FIG. 17 shows a passive matrix type semiconductor device. An element-formation layer 385 which includes a transistor portion 380 having transistors 360a and 360b, a transistor portion 390 having transistors 370a and 370b, and insulating layers 351a, 351b, 358, 359, 361, 366, and 384 is formed over a substrate 350, a memory element portion 375 is provided over the element-formation layer 385, and a conductive layer 393 serving as antenna provided for a substrate 396 is provided so as to be connected the element-formation layer 385. Note that although the case where the memory element portion 375 or the conductive layer 393 serving as an antenna is provided above the element-formation layer 385 is shown here, the present invention is not limited to this structure. The memory element portion 375 may also be provided below the element-formation layer 385 or in the same layer as the element-formation layer 385, or the conductive layer 393 serving as an antenna may also be provided below the element-formation layer 385.

The memory element portion 375 includes memory elements 365a and 365b. The memory element 365a is formed by stacking a partition wall (insulating layer) 357a, a partition wall (insulating layer) 357b, an insulating layer (memory layer) 362a and a second conductive layer 363a over a first conductive layer 356. The memory element 365b is formed by stacking a partition wall (insulating layer) 357b, a partition wall (insulating layer) 357c, an insulating layer (memory layer) 362b and a second conductive layer 363b over the first conductive layer 356. An insulating layer 364 serving as a protection film is formed to cover the second conductive layers 363a and 363b. The first conductive layer 356 for forming the plural memory elements 365a and 365b is connected to either a source electrode layer or a drain electrode layer of one transistor 360b. That is, the memory elements are connected to the same one transistor. In addition, although the insulating layer (memory layer) 362a and the second conductive layer 363a are separated from the insulating layer (memory layer) 362b and the second conductive layer 363b so that each memory cell is separated from one another by providing the partition walls (insulating layers) 357a, 357b, and 357c; they may also be formed over an entire surface if there is no fear of influence of electric field in a lateral direction between neighboring memory cells. Note that the memory elements 365a and 365b can be formed using any of the materials and manufacturing methods described in the foregoing embodiment modes. Therefore, such a defective is not generated, that film peeling at an interface between layers occurs due to a transfer step of elements to the second substrate after forming the element over the first substrate. A glass substrate which can withstand a condition such as temperature in a manufacturing process is used, and then elements are transferred to a second substrate, thereby a flexible substrate such as a film can be used as the substrate 350. Accordingly, a memory element can be peeled and transferred in a good shape, and thus, a semiconductor device can be manufactured.

The substrate provided with the element-formation layer 385 and the memory element portion 375 is attached to the substrate 396 provided with the conductive layer 393 serving as an antenna, by an adhesive resin 395. The transistor 370a formed in the element-formation layer 385 and the conductive layer 393 are electrically connected via a conductive microparticle 394 contained in the resin 395, the conductive layers 391 formed from the same layer as the first conductive layer 356, and the conductive layer 392 formed form the same layer as the second conductive layers 363a and 363b. Alternatively, the substrate provided with the element-formation layer 385 and the memory element portion 375 may be attached to the substrate 396 provided with the conductive layer 393 serving as an antenna, by a conductive adhesive such as silver paste, copper paste, or carbon paste, or by solder bonding.

Further, the memory element portion may also be provided over the substrate provided with the conductive layer serving as an antenna. Further, a sensor connecting to a transistor may also be provided.

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate. The remaining layers on the element layer side after peeling the organic compound layer including a photocatalyst substance are the organic compound layers 326 and 376 including a photocatalyst substance.

Accordingly, since elements can be transferred to various types of substrates, a material for the substrate can be selected from a wider range of materials. In addition, an inexpensive material can be used for the substrate, and a semiconductor device can be manufactured at low cost, in addition to having various functions suitable for applications.

Note that this embodiment mode can be freely combined with any of the foregoing embodiment modes. Further, the semiconductor device manufactured in this embodiment mode can be provided over a flexible base by being separated from a substrate in a peeling process and attached to a flexible substrate; thereby a flexible semiconductor device can be formed. The flexible base corresponds to a film formed from polypropylene, polyester, vinyl, polyvinyl fluoride, vinyl chloride, or the like; a paper formed of a fibrous material; a stacked film of a base material film (such as polyester, polyamide, an inorganic evaporation film, or paper) and an adhesive synthetic resin film (such as an acrylic synthetic resin or an epoxy synthetic resin); or the like. The film is attached to an object by a heat treatment and a pressure treatment. When a heat treatment and pressure treatment are performed to the film, an adhesion layer provided in the outermost surface of the film or a layer provided in the outermost layer (not the adhesion layer) is melted by heat and attached by pressure. The adhesion layer may be provided in the base but not necessarily. The adhesion layer corresponds to a layer containing an adhesive such as a thermosetting resin, an ultraviolet curing resin, an epoxy resin adhesive, or a resin additive.

According to the present invention, a semiconductor device and a display device can be manufactured using a peeling process, in which a transfer process can be conducted with a good state in which a shape and property of the element before peeling are kept. Therefore, more highly reliable semiconductor devices can be manufactured with high yield without complicating the apparatus and the process for manufacturing.

Embodiment Mode 8

A thin film transistor a light-emitting element can be formed and transferred to various types of substrates using the present invention, and thus, a display device can be formed. When a light-emitting element is used and an N-channel transistor is used as a transistor which drives the light-emitting element, light emitted from the light-emitting element performs any one of bottom emission, top emission, and dual emission. Here, a stacked structure of the light-emitting element corresponding to each emission type will be described with reference to FIGS. 20A to 20C.

Further, in this embodiment mode, channel protection thin film transistors 461, 471, and 481 formed according to the present invention are used. The thin film transistor 481 is provided over a light-transmitting substrate 480 and includes a gate electrode layer 493, a gate insulating film 497, a semiconductor layer 494, n-type semiconductor layers 495a and 495b, source or drain electrode layers 487a and 487b, and a channel protective layer 496. In this embodiment mode, a silicon film having an amorphous structure is used as the semiconductor layer, and an n-type semiconductor layer is used as a semiconductive layer having one conductivity. Instead of forming the n-type semiconductor layer, a plasma treatment using $PH_3$ gas may be conducted so as to give the semiconductor layer a conductivity. The semiconductor layer is not limited to that in this embodiment mode, and a crystalline semiconductor layer may also be used, as long as an organic compound layer including a photocatalyst substance can withstand a process temperature. In the case of using a crystalline semiconductor layer such as polysilicon, an impurity element may be introduced (added) into the crystalline semiconductor layer so as to form an impurity region having one conductivity, without forming the semiconductor layer having one conductivity. Further, an organic semiconductor such as pentacene can be used. When such an organic semiconductor is selectively formed by a droplet-discharging method or the like, an etching process into a desired shape can be simplified.

According to the present invention, by dispersing a photocatalyst substance in an organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate. The remaining layers on the element layer side after peeling the organic compound layer including a photocatalyst substance are the organic compound layers 499, 469, and 479 including a photocatalyst substance. The substrates 480, 460, and 470 attached to the element layer side may be formed from materials which can block light in a wavelength which activates the photocatalyst substance left in the element layer.

Accordingly, since elements can be transferred to various types of substrates, a material for the substrate can be selected from a wider range of materials. In addition, an inexpensive material can be used for the substrate, and a display device can be manufactured at low cost, in addition to having various functions suitable for applications.

The channel protective layer 496 may be formed by a droplet-discharging method using polyimide, polyvinyl alcohol, or the like. As a result, an exposure process can be omitted. The channel protective layer can be a film formed from one or a plurality of an inorganic material (silicon oxide, silicon nitride, silicon oxynitride, silicon nitride oxide, or the like), a photosensitive or non-photosensitive organic material (an organic resin material) (polyimide, acrylic, polyamide, polyimide amide, a resist, benzocyclobutene, or the like), a material which has a low dielectric constant, or the like; a stack of such films; or the like. In addition, a siloxane resin may be used. It is to be noted that the siloxane resin corresponds to a resin including a Si—O—Si bond. Siloxane has a skeleton structure of a bond of silicon (Si) and oxygen (O). As for a substituent, an organic group containing at least hydrogen (such as an alkyl group or aromatic hydrocarbon) is used. As for a substituent, a fluoro group may be used. Further, as for a substituent, an organic group containing at least hydrogen and a fluoro group may be used. As a manufacturing method, a vapor phase growth method such as plasma CVD or thermal CVD, or sputtering can be used. A droplet-discharging method, a printing method (a method of forming a pattern, such as screen printing or offset printing), a dispenser method can also be used. An organic film or an inorganic film (a SOG film, or the like) obtained by a coating method can also be used.

Figure 20A:
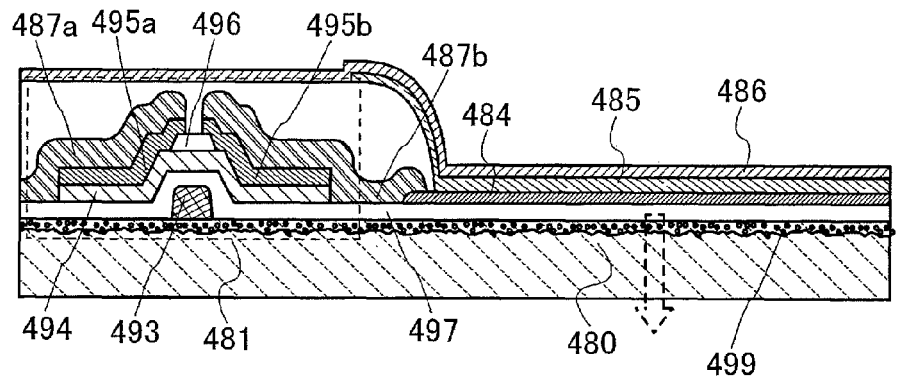
FIGS. 20A to 20C each are a cross-sectional view of a display device according to an aspect of the present invention.
Figure 20B:
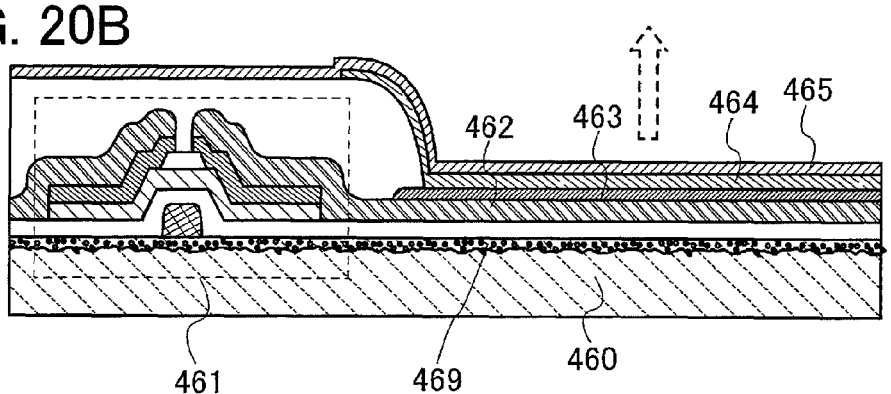
Figure 20C:
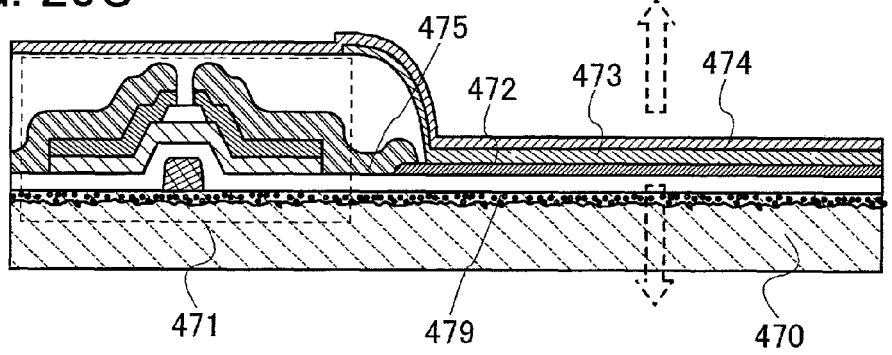

First, the case where light is emitted toward a light-transmitting substrate 480, in other words, the case of bottom emission, will be described with reference to FIG. 20A. In this case, a first electrode layer 484 is formed to be in contact with the source or drain electrode layer 487b so as to be electrically connected to the thin film transistor 481, and over the first electrode layer 484, an electroluminescent layer 485 and a second electrode layer 486 are sequentially stacked. Next, the case where light is emitted to the side opposite to a light-transmitting substrate 460, in other words, the case of top emission, will be described with reference to FIG. 20B. The thin film transistor 461 can be formed in a similar manner to the above described thin film transistor.

A source or drain electrode layer 462 which is electrically connected to the thin film transistor 461, a first electrode layer 463, an electroluminescent layer 464, and a second electrode layer 465 are sequentially stacked. In this structure, even when light passes through the first electrode layer 463, the light is reflected on the source or drain electrode layer 462, and emitted to the opposite side to the light-transmitting substrate 460. Note that in this structure, it is unnecessary that the first electrode layer 463 is formed from a light-transmitting material. Lastly, the case where light is emitted toward both a light-transmitting substrate 470 side and an opposite side, in other words, the case of dual emission, is described with reference to FIG. 20C. The thin film transistor 471 is also a channel protection thin film transistor like the thin film transistor 481, and can be formed in the same manner as the thin film transistor 481. A first electrode layer 472 is formed to be in contact with the source or drain electrode layer 475 so as to be electrically connected to the thin film transistor 471, and over the first electrode layer 472, an electroluminescent layer 473 and a second electrode layer 474 are sequentially stacked. At this time, when the first electrode layer 472 and the second electrode layer 474 are both formed from materials having light transmitting properties, or formed to have such thicknesses that can transmit light, the dual emission is realized.

Structures of the light-emitting element applicable to this embodiment mode will be explained in detail with reference to FIGS. 18A to 18D.

FIGS. 18A to 18D each show an example of an element structure of a light-emitting element, which is a light-emitting element where an electroluminescent layer 860, which is formed by mixing an organic compound and an inorganic compound, is sandwiched between a first electrode layer 870 and a second electrode layer 850. As shown in the figure, the electroluminescent layer 860 includes a first layer 804, a second layer 803, and a third layer 802, and there is a great feature especially in the first layer 804 and the third layer 802.

First, the first layer 804 is a layer which has a function of transporting holes to the second layer 803, and includes at least a first organic compound and a first inorganic compound showing an electron-accepting property to the first organic compound. It is important that the first organic compound and the first inorganic compound are not only simply mixed but also the first inorganic compound has an electron-accepting property with respect to the first organic compound. This structure generates many hole-carriers in the first organic compound which has originally almost no inherent carriers, and an hole-injecting and an hole-transporting property which are highly excellent can be obtained.

Therefore, as for the first layer 804, not only advantageous effect that is considered to be obtained by mixing an inorganic compound (such as improvement in heat resistance) but also excellent conductivity (in particular, a hole-injecting property and a hole-transporting property in the first layer 804) can also be obtained. This excellent conductivity is advantageous effect, which cannot be obtained in a conventional hole-transporting layer in which an organic compound and an inorganic compound that do not electronically interact with each other are simply mixed. This advantageous effect can make a drive voltage lower than conventionally. In addition, since the first layer 804 can be made thick without causing increase in a drive voltage, short circuit of the element due to a dust or the like can be suppressed.

However, it is preferable to use a hole-transporting organic compound as the first organic compound because hole-carriers are generated in the first organic compound as described above. Examples of the hole-transporting organic compound include phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis-{N-[4-di(m-tolyl)amino]phenyl-N-phenylamino}biphenyl (abbreviation: DNTPD), 4,4',4"-tris(N-carbazolyl)triphenylamine (abbreviation: TCTA), and the like. However, the present invention is not limited to these examples. In addition, among the compounds described above, an aromatic amine compound typified by TDATA, MTDATA, m-MTDAB, TPD, NPB, DNTPD, and TCTA can easily generate hole-carriers, and are suitable compound groups for the first organic compound.

On the other hand, the first inorganic compound may be any material as long as the material can easily accept electrons from the first organic compound, and various kinds of metal oxides and metal nitrides can be used. Any of transition metal oxides that belong to Groups 4 to 12 of the periodic table is preferable because an electron-accepting property is easily provided. Specifically, for example, titanium oxide, zirconium oxide, vanadium oxide, molybdenum oxide, tungsten oxide, rhenium oxide, ruthenium oxide, zinc oxide, and the like can be given. In addition, among the metal oxides described above, any of transition metal oxides that belong to Groups 4 to 8 of the periodic table mostly has a high electron-accepting property, which is a preferable group. In particular, vanadium oxide, molybdenum oxide, tungsten oxide, and rhenium oxide are preferable because they can be formed by vacuum evaporation and can be easily used.

Note that the first layer 804 may be funned by stacking a plurality of layers each including a combination of the organic compound and the inorganic compound as described above, or may further include another organic compound or inorganic compound.

Next, the third layer 802 will be explained. The third layer 802 is a layer which has a function of transporting electrons to the second layer 803, and includes at least a third organic compound and a third inorganic compound showing an electron-donating property to the third organic compound. It is important that the third organic compound and the third inorganic compound are not only simply mixed but also the third inorganic compound has an electron-denoting property with respect to the third organic compound. This structure generates many electron-carriers in the third organic compound which has originally almost no inherent carriers, and an electron-injecting and an electron-transporting property which are highly excellent can be obtained.

Therefore, as for the third layer 802, not only advantageous effect that is considered to be obtained by mixing an inorganic compound (such as improvement in heat resistance) but also excellent conductivity (in particular, an electron-injecting property and an electron-transporting property in the third layer 802) can also be obtained. This excellent conductivity is advantageous effect, which cannot be obtained in a conventional electron-transporting layer in which an organic compound and an inorganic compound that do not electronically interact with each other are simply mixed. This advantageous effect can make a drive voltage lower than conventionally. In addition, since the third layer 802 can be made thick without causing increase in a drive voltage, short circuit of the element due to a dust or the like can be suppressed.

However, it is preferable to use an electron-transporting organic compound as the third organic compound because electron-carriers are generated in the third organic compound as described above. Examples of the electron-transporting organic compound include tris(8-quinolinolato)aluminum (abbreviation: ANA tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)(4-phenylphenolato)aluminum (abbreviation: BAlq), bis[2-(T-hydroxyphenyl)benzoxazolato]zinc (abbreviation: Zn(BOX)$_2$), bis[2-(2'-hydroxyphenyl)benzothiazolato]zinc (abbreviation: Zn(BTZ)$_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2''-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. However, the present invention is not limited to these examples. In addition, among the compounds mentioned above, chelate metal complexes having a chelate ligand including an aromatic ring typified by Alq$_3$, Almq$_3$, BeBq$_2$, BAlq, Zn(BOX)$_2$, and Zn(BTZ)$_2$, organic compounds having a phenanthroline skeleton typified by BPhen and BCP, and organic compounds having an oxadiazole skeleton typified by PBD and OXD-7 can easily generate electron-carriers, and are suitable compound groups for the third organic compound.

On the other hand, the third inorganic compound may be any material as long as the material can easily donate electrons to the third organic compound, and various kinds of a metal oxide and a metal nitride can be used. An alkali metal oxide, an alkaline-earth metal oxide, a rare-earth metal oxide, an alkali metal nitride, an alkaline-earth metal nitride, and a rare-earth metal nitride are preferable because an electron-donating property is easily provided. Specifically, for example, lithium oxide, strontium oxide, barium oxide, erbium oxide, lithium nitride, magnesium nitride, calcium nitride, yttrium nitride, lanthanum nitride, and the like can be given. In particular, lithium oxide, barium oxide, lithium nitride, magnesium nitride, and calcium nitride are preferable because they can be formed by vacuum evaporation and can be easily used.

Note that the third layer 802 may be formed by stacking a plurality of layers each including a combination of the organic compound and the inorganic compound as described above, or may further include another organic compound or inorganic compound.

Then, the second layer 803 will be explained. The second layer 803 is a layer which has a function of emitting light, and includes a second organic compound that has a light-emitting property. A second inorganic compound may also be included. The second layer 803 can be formed by using various light-emitting organic compounds and inorganic compounds. However, since it is believed to be hard to flow a current through the second layer 803 as compared with the first layer 804 or the third layer 802, the thickness of the second layer 803 is preferably approximately 10 nm to 100 nm.

There are no particular limitations on the second organic compound as long as it is a light-emitting organic compound. Examples of the second organic compound include, for example, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: 1BP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)etheny]-4H-pyran (abbreviation: DCM2), 4-(dicyanomethylene)-2,6-bis[p-(dimethylamino)styryl]-4H-pyran (abbreviation: BisDCM), and the like. In addition, it is also possible to use a compound capable of emitting phosphorescence such as bis[2-(4',6'-difluorophenyl)pyridinato-N,C$^{2'}$]iridium(picolinate) (abbreviation: FIrpic), bis-{2-[3',5'-bis(trifluoromethyl)phenyl]pyridinato-N,C$^{2'}$}iridium(picolinate) (abbreviation: Ir(CF$_3$ppy)$_2$(pic)), tris(2-phenylpyridinato-N,C$^{2'}$)iridium (abbreviation: Ir(ppy)$_3$), bis(2-phenylpyridinato-N,C$^{2'}$)iridium(acetylacetonate) (abbreviation: Ir(ppy)$_2$(acac)), bis[2-(2'-thienyl)pyridinato-N, C$^{3'}$]iridium(acetylacetonate) (abbreviation: Ir(thp)$_2$(acac)), bis(2-phenylquinolinato-N,C$^{2'}$)iridium(acetylacetonate) (abbreviation: Ir(pq)$_2$(acac)), or bis[2-(2'-benzothienyl) pyridinato-N, C$^{3'}$]iridium(acetylacetonate) (abbreviation: Ir(btp)$_2$(acac)).

Further, a triplet excitation light-emitting material containing a metal complex or the like may be used for the second layer 803 in addition to a singlet excitation light-emitting material. For example, among pixels emitting red, green, and blue light, a pixel emitting red light whose luminance is reduced by half in a relatively short time is formed by using a triplet excitation light-emitting material and the other pixels are formed by using a singlet excitation light-emitting material. A triplet excitation light-emitting material has a feature of favorable light-emitting efficiency and less power consumption to obtain the same luminance. In other words, when a triplet excitation light-emitting material is used for a red pixel, only small amount of current needs to be applied to a light-emitting element; thus, reliability can be improved. A pixel emitting red light and a pixel emitting green light may be Ruined by using a triplet excitation light-emitting material and a pixel emitting blue light may be formed by using a singlet excitation light-emitting material to achieve low power consumption as well. Low power consumption can be further achieved by forming a light-emitting element emitting green light that has high visibility for human eyes by using a triplet excitation light-emitting material.

The second layer 803 may include not only the second organic compound as described above, which produces light-emission, but also another organic compound which is added thereto. Examples of organic compounds that can be added include TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviation: CBP), 1,3,5-tris[4-(N-carbazolyl)phenyl]benzene (abbreviation: TCPB), and the like. However, the present invention is not limited to these examples. It is preferable that the organic compound, which is added in addition to the second organic compound, has larger excitation energy than that of the second organic compound and be added by the larger amount than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure to perform color display by providing each pixel with a light-emitting layer having a different emission wavelength range. Typically, a light-emitting layer corresponding to each color of R (red), G (green), and B (blue) is formed. Also in this case, color purity can be improved and a pixel portion can be prevented from having a mirror surface (reflection) by providing the light-emission side of the pixel with a filter which transmits light of an emission wavelength range of the light. By providing a filter, a circularly polarizing plate or the like that has been conventionally required can be omitted, and further, the loss of light emitted from the light-emitting layer can be eliminated. Further, change in a color tone, which occurs when a pixel portion (display screen) is obliquely seen, can be reduced.

Either a low-molecular organic light-emitting material or a high-molecular organic light-emitting material may be used for a material of the second layer 803. A high-molecular organic light-emitting material is physically stronger as compared with a low-molecular material and is superior in durability of the element. In addition, a high-molecular organic light-emitting material can be formed by coating; therefore, the element can be relatively easily manufactured.

The emission color is determined depending on a material forming the light-emitting layer; therefore, a light-emitting element which exhibits desired light-emission can be formed by selecting an appropriate material for the light-emitting layer. As a high-molecular electroluminescent material which can be used for forming a light-emitting layer, a polyparaphenylene-vinylene-based material, a polyparaphenylene-based material, a polythiophene-based material, or a polyfluorene-based material can be used.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light-emission of the second organic compound is not easily quenched by the inorganic compound, and various kinds of metal oxides and metal nitrides can be used. In particular, a metal oxide having a metal that belongs to Group 13 or 14 of the periodic table is preferable because light-emission of the second organic compound is not easily quenched, and specifically, aluminum oxide, gallium oxide, silicon oxide, and germanium oxide are preferable. However, the second inorganic compound is not limited thereto.

Note that the second layer 803 may be formed by stacking a plurality of layers each including a combination of the organic compound and the inorganic compound as described above, or may further include another organic compound or inorganic compound. A layer structure of the light-emitting layer can be changed, and an electrode layer for injecting electrons may be provided or a light-emitting material may be dispersed, instead of providing no specific electron-injecting region or light-emitting region. Such a change can be permitted unless it departs from the spirit of the present invention.

A light-emitting element formed by using the above materials emits light by being forwardly biased. A pixel of a display device which is formed by using a light-emitting element can be driven by a simple matrix (passive matrix) mode or an active matrix mode. In any case, each pixel emits light by applying a forward bias thereto at a specific timing; however, the pixel is in a non-emitting state for a certain period. Reliability of a light-emitting element can be improved by applying a reverse bias in the non-emitting time. In a light-emitting element, there is a deterioration mode in which emission intensity is decreased under constant driving conditions or a deterioration mode in which a non-light-emitting region is enlarged in the pixel and luminance is apparently decreased. However, progression of deterioration can be slowed down by alternating current driving where bias is applied forwardly and reversely; thus, reliability of a light-emitting display device can be improved. Additionally, either digital driving or analog driving can be applied.

A color filter (colored layer) may be formed over a sealing substrate. The color filter (colored layer) can be formed by an evaporation method or a droplet-discharging method. High-resolution display can be performed with the use of the color filter (colored layer). This is because a broad peak can be modified to be sharp in an emission spectrum each of R, G, and B by the color filter (colored layer).

Full color display can be performed by forming a material emitting light of a single color and combining with a color filter or a color conversion layer. Preferably, the color filter (colored layer) or the color conversion layer is formed over, for example, a second substrate (a sealing substrate) and attached to a substrate.

Needless to say, display of a single color emission may also be performed. For example, an area color type display device may be manufactured by using single color emission. The area color type is suitable for a passive matrix display portion, and can mainly display characters and symbols.

Figure 18A:
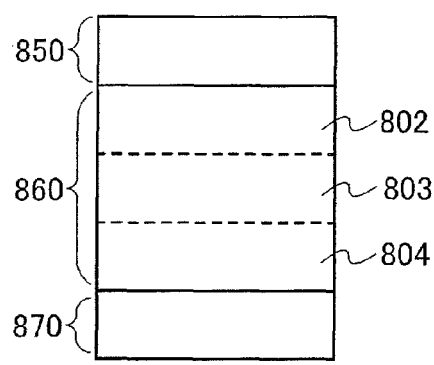
FIGS. 18A to 18D each show a structure of a light-emitting element which can be applied to the present invention.
Figure 18B:
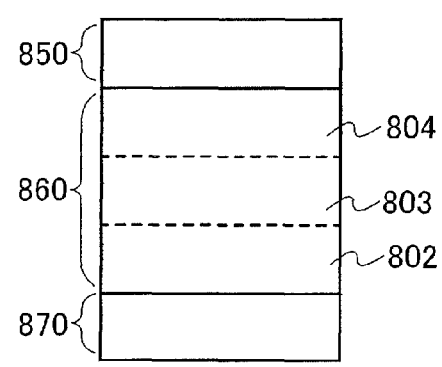

Materials of the first electrode layer 870 and the second electrode layer 850 are required to be selected considering the work function. The first electrode layer 870 and the second electrode layer 850 can be either an anode or a cathode depending on the pixel structure. In a case where polarity of a driving thin film transistor is a P-channel type, the first electrode layer 870 preferably serves as an anode and the second electrode layer 850 preferably serves as a cathode as shown in FIG. 18A. In a case where polarity of the driving thin film transistor is an N-channel type, the first electrode layer 870 preferably serves as a cathode and the second electrode layer 850 preferably serves as an anode as shown in FIG. 18B. Materials that can be used for the first electrode layer 870 and the second electrode layer 850 will be described. It is preferable to use a material having a high work function (specifically, a material having a work function of 4.5 eV or more) for one of the first electrode layer 870 and the second electrode layer 850, which serves as an anode, and a material having a lower work function (specifically, a material having a work function of 3.5 eV or less) for the other electrode layer which serves as a cathode. However, since the first layer 804 is superior in a hole-injecting property and a hole-transporting property and the third layer 802 is superior in an electron-injecting property and an electron transporting property, both of the first electrode layer 870 and the second electrode layer 850 are scarcely restricted by a work function, and various materials can be used.

The light-emitting elements shown in FIGS. 18A and 18B have a structure where light is extracted from the first electrode layer 870; thus, the second electrode layer 850 does not necessarily have a light-transmitting property. The second electrode layer 850 is preferably formed from a film mainly containing an element of Ti, Ni, W, Cr, Pt, Zn, Sn, In, Ta, Al, Cu, Au, Ag, Mg, Ca, Li and Mo, or an alloy material or a compound material containing the element as its main component such as TiN, $TiSi_xN_y$, $WSi_x$, $WN_x$, $WSi_xN_y$, or NbN; or a stacked film thereof in a total film thickness of 100 nm to 800 nm.

The second electrode layer 850 can be formed by an evaporation method, a sputtering method, a CVD method, a printing method, a dispenser method, a droplet-discharging method, or the like.

In addition, when the second electrode layer 850 is formed by using a light-transmitting conductive material similarly to the material used for the first electrode layer 870, light can also be extracted from the second electrode layer 850, and a dual emission structure can be obtained, in which light emitted from the light-emitting element is emitted from both the first electrode layer 870 side and the second electrode layer 850 side.

Note that the light-emitting element of the present invention can have variations by changing types of the first electrode layer 870 and the second electrode layer 850.

FIG. 18B shows a case where the third layer 802, the second layer 803, and the first layer 804 are sequentially provided from the first electrode layer 870 side in the electroluminescent layer 860.

As described above, in the light-emitting element applicable to the present invention, the layer interposed between the first electrode layer 870 and the second electrode layer 850 is formed from the electroluminescent layer 860 including a layer in which an organic compound and an inorganic compound are combined. The light-emitting element is an organic-inorganic composite light-emitting element provided with layers (that is, the first layer 804 and the third layer 802) that provide functions called a high carrier-injecting property and carrier-transporting property by mixing an organic compound and an inorganic compound. Such functions as high carrier-injecting property and carrier-transporting property are not obtainable from only either one of the organic compound or the inorganic compound. In addition, the first layer 804 and the third layer 802 are particularly required to be layers in which an organic compound and an inorganic compound are combined when provided on the first electrode layer 870 side, and may also contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method of evaporating both an organic compound and an inorganic compound by resistance heating. Besides, for co-evaporation, an inorganic compound may be evaporated by an electron beam (EB) while evaporating an organic compound by resistance heating. Moreover, the methods also include a method of sputtering an inorganic compound while evaporating an organic compound by resistance heating to deposit the both at the same time. In addition, the electroluminescent layer may also be formed by a wet method.

In the same manner, for the first electrode layer 870 and the second electrode layer 850, evaporation by resistance heating, EB evaporation, sputtering, a wet method, or the like can be used.

Figure 18C:
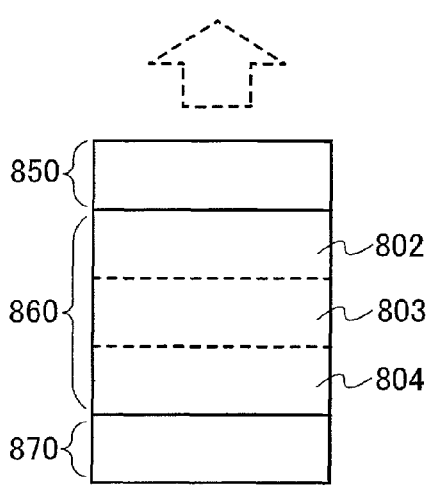
Figure 18D:
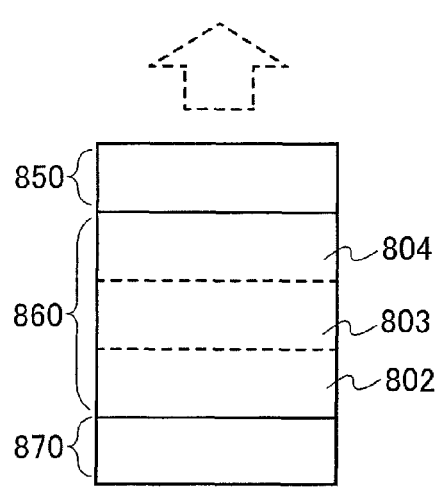

In FIG. 18C, an electrode layer having reflectivity is used for the first electrode layer 870, and an electrode layer having a light-transmitting property is used for the second electrode layer 850 in the structure of FIG. 18A. Light emitted from the light-emitting element is reflected on the first electrode layer 870, transmitted through the second electrode layer 850, and is emitted to outside. In the same manner, in FIG. 18D, an electrode layer having reflectivity is used for the first electrode layer 870, and an electrode layer having a light-transmitting property is used for the second electrode layer 850 in the structure of FIG. 18B. Light emitted from the light-emitting element is reflected on the first electrode layer 870, transmitted through the second electrode layer 850, and is emitted to outside.

This embodiment mode can be freely combined with the embodiment modes described above.

Embodiment Mode 9

Embodiment Mode 9 will explain another structure applicable to a light-emitting element of the present invention with reference to FIGS. 37A to 37C and FIGS. 38A to 38C.

A light-emitting element utilizing electroluminescence is distinguished by whether a light-emitting material is an organic compound or an inorganic compound. Generally, the former is referred to as an organic EL element, whereas the latter is referred to as an inorganic EL element.

The inorganic EL element is classified into a dispersion type inorganic EL element and a thin film type inorganic EL element, depending on its element structure. The former and the latter are different in that the former has an electroluminescent layer where particles of a light-emitting material are dispersed in a binder, whereas the latter has an electroluminescent layer formed from a thin film of a light-emitting material. However, the former and the latter have in common that they need an electron accelerated by a high electric field. Note that, as a mechanism of luminescence that is obtained, there are donor-acceptor recombination type luminescence that utilizes a donor level and an acceptor level, and localized type luminescence that utilizes inner-shell electron transition of a metal ion. Generally, in many cases, donor-acceptor recombination type luminescence is employed in a dispersion type inorganic EL element, whereas localized type luminescence is employed in a thin film type inorganic EL element.

The light-emitting material, which can be used in the present invention, includes a host material and an impurity element to be a light-emission center. By changing an impurity element that is contained, light emission of various colors can be obtained. As a manufacturing method of the light-emitting material, various methods such as a solid phase method and a liquid phase method (a coprecipitation method) can be used. In addition, an evaporative decomposition method, a double decomposition method, a method by heat decomposition reaction of a precursor, a reversed micelle method, a method in which these methods are each combined with high temperature baking, a liquid phase method such as a lyophilization method, or the like can also be used.

A solid phase method is a method by which a host material, and an impurity element or a compound containing an impurity element are measured, mixed in a mortar, heated in an electric furnace, and baked to be reacted to contain the impurity element in the host material. The baking temperature is preferably 700° C. to 1500° C. This is because the solid reaction does not progress when the temperature is too low, and the host material is decomposed when the temperature is too high. The baking may be performed in a powder state; however, it is preferable to perform the baking in a pellet state. Although the baking has to be performed at a comparatively high temperature, the solid phase method is easy; thus, the solid phase method is suitable for mass production with high productivity.

A liquid phase method (a coprecipitation method) is a method by which a host material or a compound containing a host material is reacted in a solution with an impurity element or a compound containing an impurity element, dried, and then baked. Particles of a light-emitting material are distributed uniformly, and the reaction can progress even when the grain size is small and the baking temperature is low.

As a host material used for a light-emitting material, a hydrosulfide, an oxide, or a nitride can be used. As a hydrosulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As an oxide, for example, zinc oxide (ZnO), yttrium oxide ($Y_2O_3$), or the like can be used. As a nitride, for example, aluminum nitride (AlN), gallium nitride (GaN), indium nitride (InN), or the like can be used. Further, zinc selenide (ZnSe), zinc telluride (ZnTe), or the like can also be used, and a three-component mixed crystal such as calcium sulfide-gallium ($CaGa_2S_4$), strontium sulfide-gallium ($SrGa_2S_4$), or barium sulfide-gallium ($BaGa_2S_4$) may also be used.

As a light-emission center of localized type luminescence, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added as charge compensation.

On the other hand, as a light-emission center of donor-acceptor recombination type luminescence, a light-emitting material containing a first impurity element which forms a donor level and a second impurity element which forms an acceptor level can be used. As the first impurity element, for example, fluorine (F), chlorine (Cl), aluminum (Al), or the like can be used for example. As the second impurity element, for example, copper (Cu), silver (Ag), or the like can be used.

In a case of synthesizing the light-emitting material of donor-acceptor recombination type luminescence by a solid phase method, a host material, the first impurity element or a compound containing the first impurity element, and the second impurity element or a compound containing the second impurity element are each measured, mixed in a mortar, heated in an electric furnace, and baked. As the host material, the above described host materials can be used. As the first impurity element or the compound containing the first impurity element, for example, fluorine (F), chlorine (Cl), aluminum sulfate ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably 700° C. to 1500° C. This is because the solid reaction does not progress when the temperature is too low, and the host material is decomposed when the temperature is too high. The baking may be performed in a powder state; however, it is preferable to pedal the baking in a pellet state.

As the impurity element in the case of utilizing solid reaction, a compound containing the first impurity element and the second impurity element may be combined. In this case, since the impurity element is easily diffused and solid reaction progresses easily, a uniform light-emitting material can be obtained. Further, since a surplus impurity element does not enter, a light-emitting material having high purity can be obtained. As the compound containing the first impurity element and the second impurity element, for example, copper chloride (CuCl), silver chloride (AgCl), or the like can be used.

Note that a concentration of these impurity elements may be 0.01 to 10 atom % with respect to the host material, and the concentration is preferably 0.05 to 5 atom %.

In the case of a thin film type inorganic EL element, an electroluminescent layer is a layer containing the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as an organic metal CVD method or a hydride transport low-pressure CVD method, an atomic layer epitaxy method (ALE), or the like.

Figure 37A:
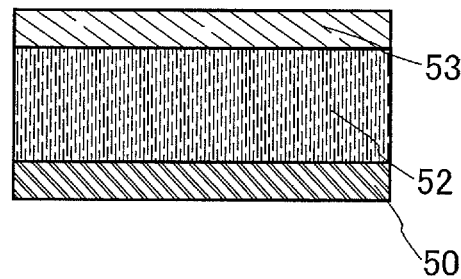
FIGS. 37A to 37C each show a structure of a light-emitting element which can be applied to the present invention.
Figure 37B:
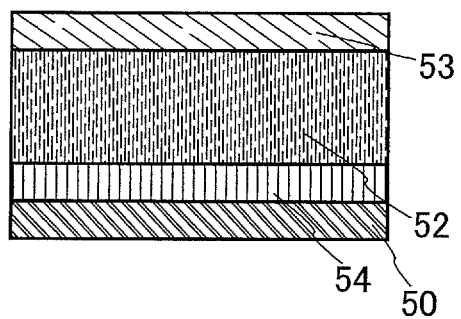
Figure 37C:
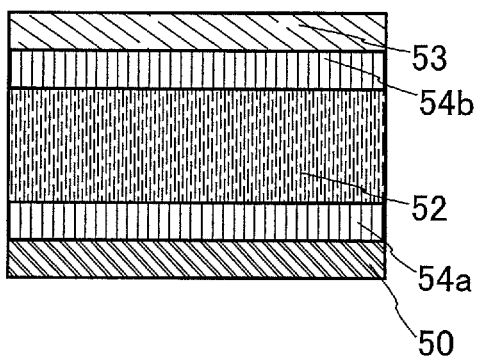

FIGS. 37A to 37C each show an example of a thin film type inorganic EL element that can be used as a light-emitting element. In FIGS. 37A to 37C, the light-emitting elements each include a first electrode layer 50, an electroluminescent layer 52, and a second electrode layer 53.

The light-emitting elements shown in FIGS. 37B and 37C each have a structure where an insulating layer is formed between the electrode layer and the electroluminescent layer in the light-emitting element of FIG. 37A. The light-emitting element shown in FIG. 37B has an insulating layer 54 between the first electrode layer 50 and the electroluminescent layer 52. The light-emitting element shown in FIG. 37C has an insulating layer 54a between the first electrode layer 50 and the electroluminescent layer 52, and an insulating layer 54b between the second electrode layer 53 and the electroluminescent layer 52. In this manner, the insulating layer may be provided between the electroluminescent layer and one electrode layer of a pair of electrode layers that sandwiches the electroluminescent layer, or may be provided between the electroluminescent layer and the both electrode layers. Moreover, the insulating layer may be a single layer or a stacked layer including a plurality of layers.

In addition, although the insulating layer 54 is provided to be in contact with the first electrode layer 50 in FIG. 37B, the insulating layer 54 may be provided to be in contact with the second electrode layer 53 by reversing the order of the insulating layer and the electroluminescent layer.

In the case of a dispersion type inorganic EL element, an electroluminescent layer where particles of a light-emitting material are dispersed in a binder is formed. When particles with desired grain sizes cannot be obtained enough by a manufacturing method of a light-emitting material, the electroluminescent layer may be formed in a particle state by being crushed with a mortar or the like. A binder refers to a substance for fixing a light-emitting material in a particle state in a dispersed state to keep a shape as an electroluminescent layer. The light-emitting material is uniformly dispersed and fixed in an electroluminescent layer by the binder.

In the case of a dispersion type inorganic EL element, as a method for forming an electroluminescent layer, a droplet-discharging method, a printing method (such as screen printing or offset printing), which can selectively form an electroluminescent layer, a coating method such as a spin coating method, a dipping method, a dispenser method, or the like can be used. There are no particular limitations of the film thickness of the electroluminescent layer; however, the film thickness of 10 nm to 1000 nm is preferable. In addition, in the electroluminescent layer containing a light-emitting material and a binder, a ratio of the light-emitting material is preferably set to be greater than or equal to 50 wt % and less than or equal to 80 wt %.

Figure 38A:
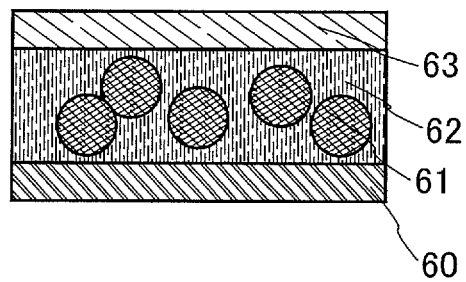
FIGS. 38A to 38C each show a structure of a light-emitting element which can be applied to the present invention.
Figure 38B:
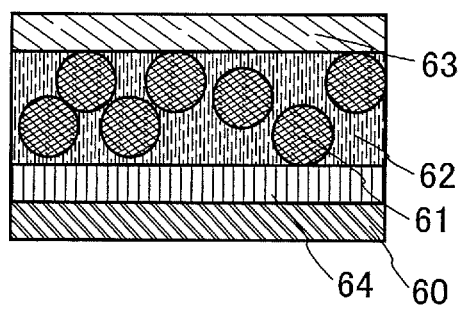
Figure 38C:
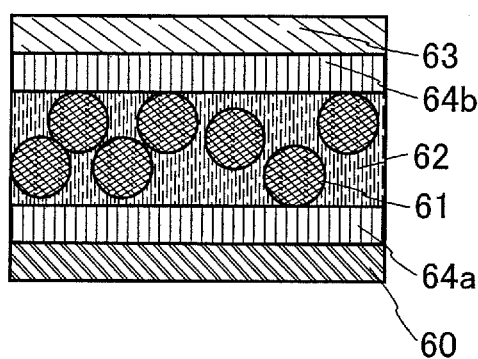

FIGS. 38A to 38C each show an example of a dispersion type inorganic EL element that can be used as a light-emitting element. In FIG. 38A, the light-emitting element has a stacked structure of a first electrode layer 60, an electroluminescent layer 62, and a second electrode layer 63, where a light-emitting material 61 held by a binder is included in the electroluminescent layer 62.

As the binder that can be used in this embodiment mode, an organic material or an inorganic material can be used, and a mixed material of an organic material and an inorganic material may also be used. As the organic material, a resin such as a polymer, polyethylene, polypropylene, a polystyrene based resin, a silicone resin, an epoxy resin, or vinylidene fluoride having a comparatively high dielectric constant like a cyanoethyl cellulose based resin can be used. In addition, a heat-resistant high molecular compound such as aromatic polyamide or polybenzimidazole, or a siloxane resin may be used. Siloxane corresponds to a resin containing a Si—O—Si bond. Siloxane is composed of a skeleton structure formed by the bond of silicon (Si) and oxygen (O). As a substituent thereof, an organic group containing at least hydrogen (such as an alkyl group or aromatic hydrocarbon) is used. In addition, a fluoro group may be used as the substituent. Further, an organic group containing at least hydrogen and a fluoro group may be used as the substituent. Moreover, a vinyl resin such as polyvinyl alcohol or polyvinyl butyral, or a resin material such as a phenol resin, a novolac resin, an acrylic resin, a melamine resin, a urethane resin, an oxazole resin (polybenzoxazole) may also be used. For example, a photocurable resin or the like can be used. A dielectric constant can also be adjusted by appropriately mixing these resins with microparticles having a high dielectric constant such as barium titanate ($BaTiO_3$) or strontium titanate ($SrTiO_3$).

As the inorganic material, a material of silicon oxide ($SiO_x$), silicone nitride ($SiN_x$), silicon containing oxygen and nitrogen, aluminum nitride (AlN), aluminum containing oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS and other substances containing an inorganic material can be used. By mixing an organic material with an inorganic material having a high dielectric constant (by adding or the like), a dielectric constant of an electroluminescent layer including a light-emitting material and a binder can be further controlled and the dielectric constant can be further increased.

In a manufacturing process, the light-emitting material is dispersed in a solution containing a binder. However, as a solvent of the solution containing a binder that can be used in this embodiment mode, it is preferable to appropriately select such a solvent that dissolves the binder material and that can make a solution with the viscosity of which is appropriate for a method for forming an electroluminescent layer (various wet processes) and a desired film thickness. In a case where an organic solvent or the like can be used and, for example, a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 38B and 38C each have a structure where an insulating layer is formed between the electrode layer and the electroluminescent layer in the light-emitting element of FIG. 38A. The light-emitting element shown in FIG. 38B has an insulating layer 64 between the first electrode layer 60 and the electroluminescent layer 62. The light-emitting element shown in FIG. 38C has an insulating layer 64a between the first electrode layer 60 and the electroluminescent layer 62, and an insulating layer 64b between the second electrode layer 63 and the electroluminescent layer 62. In this manner, the insulating layer may be provided between the electroluminescent layer and one electrode layer of a pair of electrode layers that sandwiches the electroluminescent layer, or may be provided between the electroluminescent layer and the both electrode layers. Moreover, the insulating layer may be a single layer or a stacked layer including a plurality of layers.

In addition, although the insulating layer 64 is provided to be in contact with the first electrode layer 60 in FIG. 38B, the insulating layer 64 may be provided to be in contact with the second electrode layer 63 by reversing the order of the insulating layer and the electroluminescent layer.

Although insulating layers like the insulating layers 54, 54a and 54b in FIG. 37B or 37C, and the insulating layers 64, 64a and 64b in FIG. 38B or 38C are not particularly limited, such insulating layers preferably have high dielectric strength and dense film qualities, and much preferably high dielectric constants. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked film of two kinds or more thereof can be used. These insulating films can be formed by sputtering, evaporation, CVD, or the like. In addition, the insulating layers may be formed by dispersing particles of these insulating materials in a binder. The binder material is preferably formed with the same material and by the same method as the binder contained in the electroluminescent layer. A film thickness of such an insulating layer is not particularly limited, and the film thickness of 10 nm to 1000 nm is preferable.

The light-emitting elements shown in this embodiment mode can provide light emission by applying a voltage between a pair of electrode layers that sandwiches the electroluminescent layer; and, the light-emitting elements can be operated by any of DC driving and AC driving.

The present invention can be freely combined with the embodiment modes described above.

According to the present invention, by dispersing a photocatalyst substance in an organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate.

Accordingly, since elements can be transferred to various types of substrates, a material for the substrate can be selected from a wider range of materials. In addition, an inexpensive material can be used for the substrate, and a display device can be manufactured at low cost, in addition to having various functions suitable for applications.

According to the present invention, a semiconductor device and a display device can be manufactured using a peeling process, in which a transfer process can be conducted with a good state in which a shape and property of the element before peeling are kept. Therefore, highly reliable semiconductor devices and display devices can be manufactured with high yield without complicating the apparatus and the process for manufacturing.

Embodiment Mode 10

Next, Embodiment Mode 10 will describe a mode in which a driver circuit for driving is mounted on a display panel formed according to the above described embodiment mode.

Figure 27A:
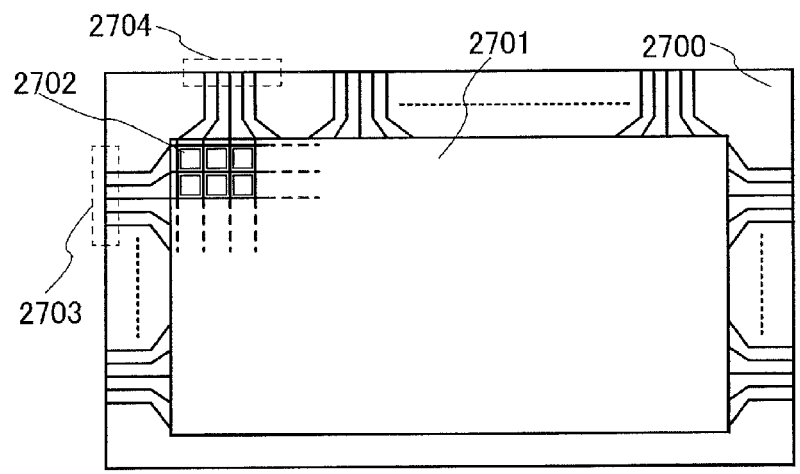
FIGS. 27A to 27C are top views of display devices to which the present invention can be applied.

FIG. 27A is a top view showing a structure of a display panel in accordance with the present invention. A pixel portion 2701 in which pixels 2702 are arranged in matrix, a scan signal input terminal 2703, and a data signal input terminal 2704 are formed over a substrate 2700 having an insulating surface. The number of pixels may be determined in accordance with various standards. In the case of XGA of RGB full color, the number of pixels may be 1024×768×3 (RGB). In the case of UXGA of RGB full color, the number of pixels may be 1600×1200×3 (RGB), and in the case of full-spec high-definition display, it may be 1920×1080×3 (RGB).

The pixels 2702 are formed in matrix by intersections of scan lines extended from the scan signal input terminal 2703 and signal lines extended from the data signal input terminal 2704. Each pixel 2702 in the pixel portion 2701 is provided with a switching element and a pixel electrode layer connected thereto. A typical example of the switching element is a TFT. The gate electrode layer side of the TFT is connected to a scan line, and a source or drain side of the TFT is connected to a signal line, which enables each pixel to be independently controlled by a signal input from outside.

Figure 28A:
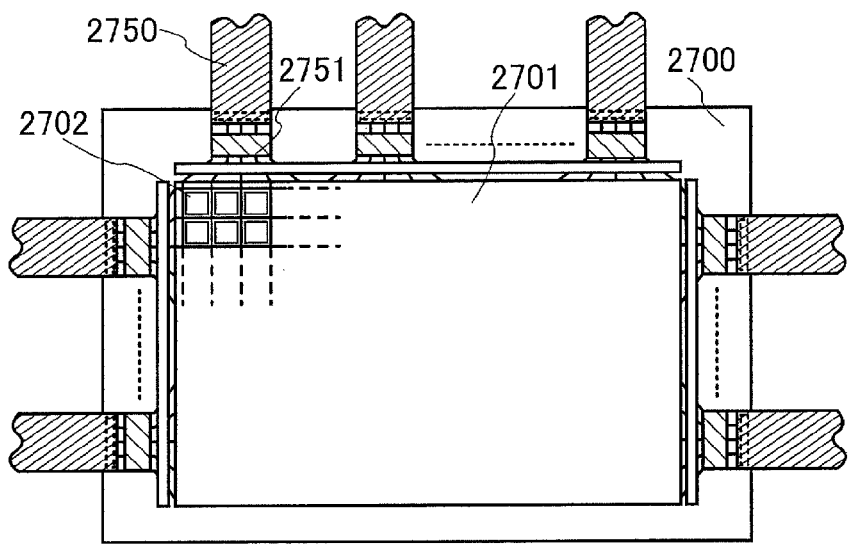
FIGS. 28A and 28B are top views of display devices to which the present invention can be applied.
Figure 28B:
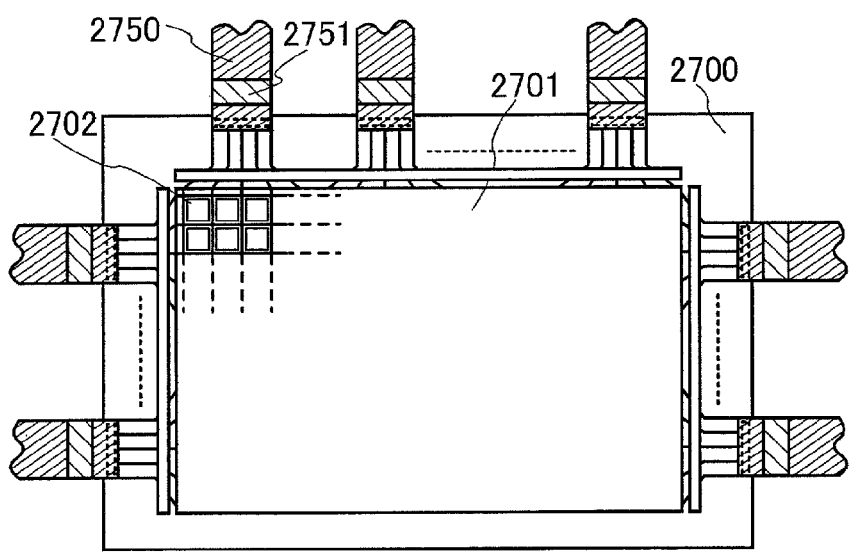

FIG. 27A shows a structure of a display panel in which a signal to be input to a scan line and a signal line is controlled by an external driver circuit. Alternatively, a driver IC 2751 may be mounted on a substrate 2700 by a COG (Chip on Glass) method as shown in FIG. 28A. As another mounting mode, a TAB (Tape Automated Bonding) method may also be used as shown in FIG. 28B. The driver IC may be formed over a single crystal semiconductor substrate or may be formed with a TFT over a glass substrate. In FIGS. 28A and 28B, the driver IC 2751 is connected to an FPC (flexible printed circuit) 2750.

Figure 27B:
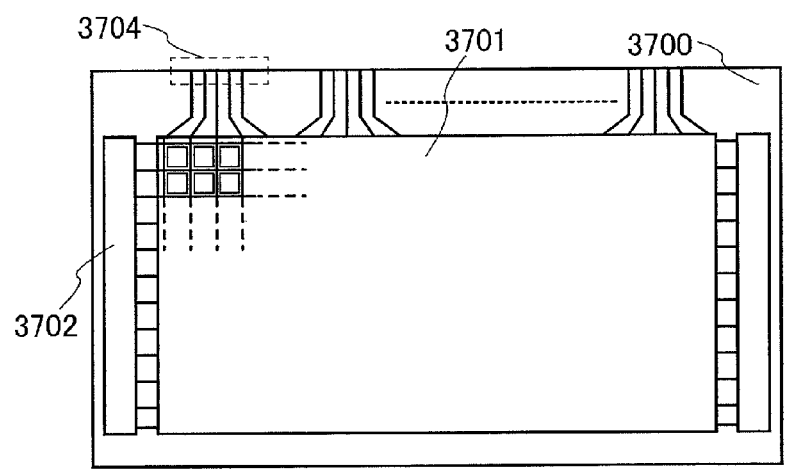
Figure 27C:
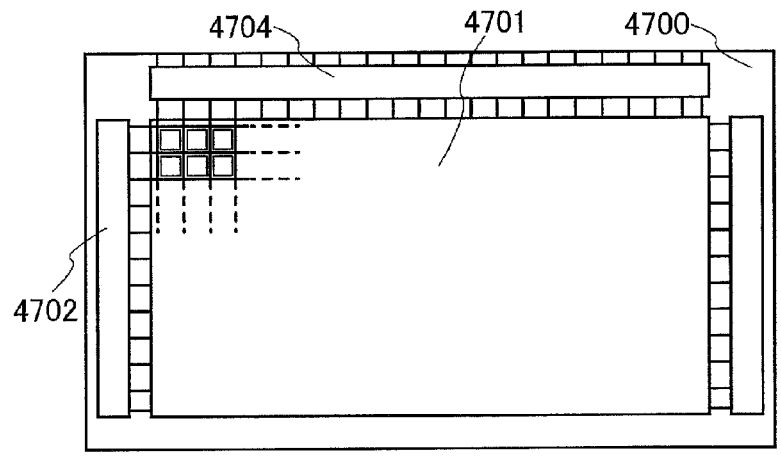

When a TFT provided in a pixel is formed from a semiconductor having crystallinity, a scan line driver circuit 3702 can be formed over a substrate 3700 as shown in FIG. 27B. In FIG. 27B, reference numeral 3701 denotes a pixel portion, and is controlled by an external driver circuit connected to a data signal input terminal 3704 and the scan line driver circuit 3702. When a TFT in a pixel is fondled from a polycrystalline (microcrystalline) semiconductor or a single crystal semiconductor having a high mobility, a pixel portion 4701, a scan line driver circuit 4702 and a signal line driver circuit 4704 can be formed to be integrated over a glass substrate 4700 as shown in FIG. 27C.

First, a display device employing a COG method is explained with reference to FIG. 28A. A pixel portion 2701 for displaying information of characters, images, or the like is provided over a substrate 2700. A substrate provided with a plurality of driver circuits is divided into rectangles, and a driver circuit 2751 after division (also referred to as a driver IC) is mounted on the substrate 2700. FIG. 28A shows a mode of mounting a plurality of driver ICs 2751, and FPCs 2750 on the end of the driver ICs 2751. In addition, the size obtained by division may be made almost the same as the length of a side of the pixel portion on a signal line side, and an FPC may be mounted on the end of the single driver IC.

Alternatively, a TAB method may be employed. In that case, a plurality of tapes may be attached and driver ICs may be mounted on the tapes as shown in FIG. 28B. Similarly to the case of a COG method, a single driver IC may be mounted on a single tape. In this case, a metal piece or the like for fixing the driver IC may be attached together in terms of strength.

A plurality of driver ICs to be mounted on a display panel is preferably formed over a rectangular substrate having a side of 300 mm to 1000 mm or a side longer than 1000 mm for improvement in productivity.

In other words, a plurality of circuit patterns each including a driver circuit portion and an input-output terminal as a unit may be formed over the substrate and may be divided to be used last. In consideration of the side length of the pixel portion or the pixel pitch, the driver IC may be formed to be a rectangle having a long side of 15 mm to 80 mm and a short side of 1 mm to 6 mm. Alternatively, the driver IC may be formed to have the same side length as that of the pixel portion, or that of adding a side length of the pixel portion to a side length of each driver circuit.

An advantage of the external dimension of the driver IC over an IC chip is the length of the long side. When the driver IC having a long side length of 15 mm to 80 mm is used, the number of the driver ICs necessary for being mounted in accordance with the pixel portion is smaller than that in the case of using an IC chip. Therefore, yield in manufacturing can be improved. When a driver IC is fainted over a glass substrate, productivity is not decreased since there is no limitation on the shape of a substrate used as a mother body. This is a great advantage compared with the case of taking IC chips out of a circular silicon wafer.

When a scan line driver circuit 3702 is formed to be integrated over a substrate as shown in FIG. 27B, a driver IC provided with a signal line driver circuit is mounted on a region outside a pixel portion 3701. The driver IC is a signal line driver circuit. In order to fault a pixel portion corresponding to RGB full color, 3072 signal lines are used for an XGA class and 4800 signal lines are used for a UXGA class. The signal lines fainted in such a number are divided into several blocks at the end portion of the pixel portion 3701, and leading lines are formed. The signal lines are gathered corresponding to the pitches of output terminals of the driver ICs.

The driver IC is preferably formed from a crystalline semiconductor formed over a substrate. The crystalline semiconductor is preferably formed by being irradiated with continuous wave laser light. Therefore, a continuous wave solid-state or gas laser is used for an oscillator for generating the laser light. There are few crystal defects when a continuous wave laser is used, and as a result, a transistor can be manufactured by using a polycrystalline semiconductor layer having a large grain size. In addition, high-speed driving is possible since mobility and response speed are favorable, and it is possible to further improve an operating frequency of an element than that of the conventional element. Therefore, high reliability can be obtained since there is little variation in characteristics. Note that the channel-length direction of the transistor and a moving direction of laser light over the substrate are preferably arranged in the same direction in order to further improve the operating frequency. This is because the highest mobility can be obtained when a channel length direction of a transistor and a moving direction of laser light over a substrate are almost parallel to each other (preferably, −30° to 30°) in a step of laser crystallization with a continuous wave laser. Note that the channel length direction corresponds to a current flowing direction, in other words, a direction in which an electric charge moves in a channel formation region. The thus manufactured transistor has an active layer including a polycrystalline semiconductor layer in which crystal grains are extended in the channel length direction, and this means that crystal grain boundaries are formed almost along the channel length direction.

In order to perform laser crystallization, it is preferable to significantly narrow the laser light, and the shape of the laser light (beam spot) preferably has the same width as that of a short side of the driver ICs, approximately 1 mm to 3 mm. In addition, in order to secure an enough and effective energy density for an object to be irradiated, an irradiated region with the laser light preferably has a linear shape. The term "linear" used herein refers to not a line in a strict sense but a rectangle or an oblong with a large aspect ratio. For example, the linear shape refers to a rectangle or an oblong with an aspect ratio of 2 or more (preferably 10 to 10000). Thus, by making a width of the laser light shape (beam spot) the same length as a short side of the driver ICs, a method for manufacturing a display device, of which productivity is improved, can be provided.

As shown in FIGS. 28A and 28B, driver ICs may be mounted as both the scan line driver circuit and the signal line driver circuit. In this case, it is preferable to use the driver ICs having different specifications for the scan line driver circuit and the signal line driver circuit.

In the pixel portion, the signal line and the scan line intersect to form a matrix, and a transistor is arranged at a portion corresponding to each intersection. One feature of the present invention is that TFTs having an amorphous semiconductor or a semiamorphous semiconductor as a channel portion are used as the transistors arranged in the pixel portion. The amorphous semiconductor is formed by a method such as a plasma CVD method or a sputtering method. The semiamorphous semiconductor can be formed by a plasma CVD method at a temperature of 300° C. or lower. A film thickness enough to form the transistor is formed in a short time even in the case of using, for example, a non-alkaline glass substrate having an external size of 550 mm×650 mm. The feature of such a manufacturing technique is effective in manufacturing a large-sized display device. In addition, a semiamorphous TFT can obtain field effect mobility of 2 cm²/V·sec to 10 cm²N·sec by forming a channel formation region using a SAS. When the present invention is applied, a minute wiring can be stably formed without a defect such as a short circuit since a pattern can be formed into a desired shape with high controllability. Accordingly, a TFT having electric characteristics required to operate pixels sufficiently can be formed. Therefore, this TFT can be used as a switching element of the pixel or as an element included in the scan line driver circuit. Thus, a display panel in which system-on-panel is realized can be manufactured.

The scan line driver circuit can also be formed to be integrated over the substrate by using a TFT having a semiconductor layer formed of a SAS. In the case of using a TFT having a semiconductor layer formed with an AS, the driver ICs may be mounted as both the scan line driver circuit and the signal line driver circuit.

In that case, it is preferable to use the driver ICs having different specifications for the scan line driver circuit and the signal line driver circuit. For example, a transistor included in the scan line driver IC is required to withstand a voltage of approximately 30 V; however, a drive frequency is 100 kHz or less, and comparatively high-speed operation is not required. Therefore, it is preferable to set a channel length (L) of the transistor included in the scan line driver sufficiently long. On the other hand, a transistor of the signal line driver IC is required to withstand a voltage of only approximately 12 V; however, a drive frequency is around 65 MHz at 3 V, and high-speed operation is required. Therefore, it is preferable to set a channel length or the like of the transistor included in a driver on a micron rule. By using the present invention, a minute pattern can be formed with high controllability. Therefore, the present invention can handle such a micron rule sufficiently.

A method for mounting the driver IC is not particularly limited, and a COG method, a wire bonding method, or a TAB method can be employed.

When the thicknesses of the driver IC and the counter substrate are set equal to each other, the heights of the driver IC and the counter substrate are almost equal, which contributes to thinning of a display device as a whole. When both substrates are formed from the same material, thermal stress is not generated and characteristics of a circuit formed from a TFT are not damaged even when a temperature change is caused in the display device. Furthermore, the number of the driver ICs to be mounted for one pixel portion can be reduced by mounting driver ICs having a longer side than IC chips as driver circuits as shown in this embodiment mode.

As described above, a driver circuit can be incorporated in a display panel.

Embodiment Mode 11

A structure of a pixel of a display panel shown in this embodiment mode will be explained with reference to equivalent circuit diagrams shown in FIGS. 19A to 19F. This embodiment mode describes an example in which an organic EL element including an organic compound or an organic EL element including an organic compound layer and an inorganic compound layer is used for an electroluminescent layer of a light-emitting element.

Figure 19A:
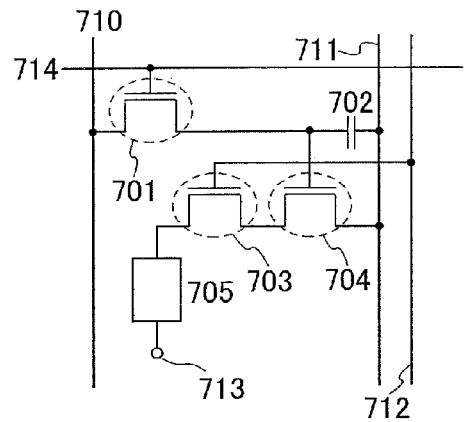
FIGS. 19A to 19F each show a structure of a pixel which can be applied to a display device according to an aspect of the present invention.

In a pixel shown in FIG. 19A, a signal line 710 and power supply lines 711 and 712 are arranged in the column direction, and a scan line 714 is arranged in the row direction. The pixel also includes a TFT 701 as a switching TFT, a TFT 703 as a driver TFT, a TFT 704 as a current control TFT, a capacitor element 702, a light-emitting element 705, and an opposite electrode 713.

Figure 19B:
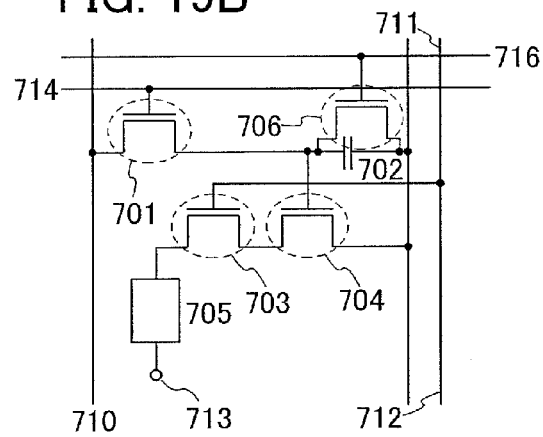
Figure 19C:
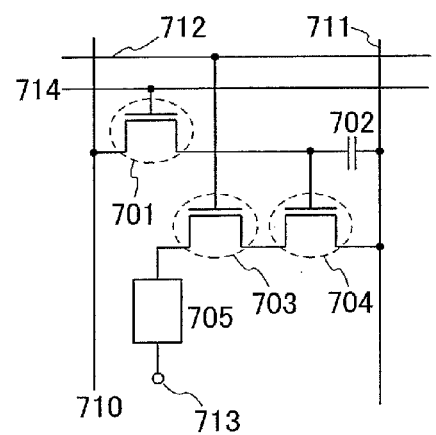
Figure 19D:
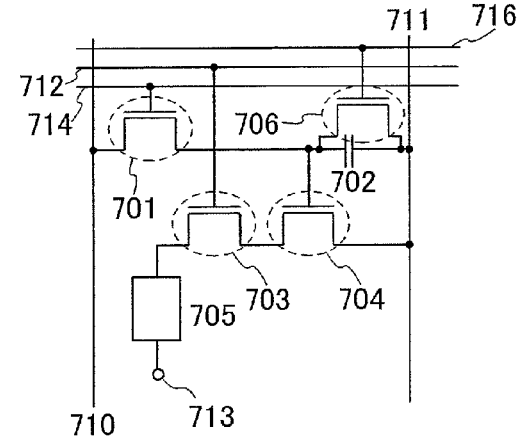

A pixel shown in FIG. 19C has the same structure as that shown in FIG. 19A, except that a gate electrode of the TFT 703 is connected to the power supply line 712 arranged in the row direction. In other words, both pixels shown in FIGS. 19A and 19C show the same equivalent circuit diagrams. However, power supply lines are formed from conductive layers in different levels between the cases where the power supply line 712 is arranged in the column direction (FIG. 19A) and where the power supply line 712 is arranged in the row direction (FIG. 19C). Here, a wiring to which the gate electrode of the TFT 703 is connected is focused and the figures are separately shown in FIGS. 19A and 19C to show that the wirings are formed in different layers.

In the pixels shown in FIGS. 19A and 19C, the TFTs 703 and 704 are connected to each other in series.

Note that the TFT 703 is operated in a saturation region and functions to control the amount of current flowing into the light-emitting element 705, whereas the TFT 704 is operated in a linear region and functions to control current supply to the light-emitting element 705. The TFTs 703 and 704 preferably have the same conductivity in view of the manufacturing process. For the TFT 703, a depletion mode TFT as well as an enhancement mode TFT may be used. In the present invention having the above structure, slight variations in $V_{GS}$ of the TFT 704 does not affect the amount of current flowing into the light-emitting element 705, since the TFT 704 is operated in a linear region. In other words, the amount of current flowing into the light-emitting element 705 is determined by the TFT 703 operated in the saturation region. The present invention having the above structure can provide a display device in which image quality is improved by suppressing variations in luminance of the light-emitting element due to the variation in the TFT characteristics.

The TFT 701 of each of pixels shown in FIGS. 19A to 19D controls a video signal input to the pixel. When the TFT 701 is turned on and a video signal is input to the pixel, the video signal is held by the capacitor element 702. Although FIGS. 19A and 19C show structures in which the capacitor element 702 is provided, the present invention is not limited thereto. When a gate capacitance or the like can serve as a capacitor holding a video signal, the capacitor element 702 is not provided explicitly.

The light-emitting element 705 has a structure in which an electroluminescent layer is interposed between two electrodes. A pixel electrode and a counter electrode (an anode and a cathode) have an electric potential difference therebetween so that a forward bias voltage is applied. The electroluminescent layer is formed from a material selected from a wide range of materials such as an organic material and an inorganic material. The luminescence in the electroluminescent layer includes light emission that is generated in returning from a singlet excited state to a ground state (fluorescence) and light emission that is generated in returning from a triplet exited state to a ground state (phosphorescence).

A pixel shown in FIG. 19B has the same structure as that shown in FIG. 19A, except that a TFT 706 and a scan line 716 are added. Similarly, a pixel shown in FIG. 19D has the same structure as that shown in FIG. 19C, except that a TFT 706 and a scan line 716 are added.

The TFT 706 is controlled to be turned on or off by the newly arranged scan line 716. When the TFT 706 is turned on, electric charges held at the capacitor element 702 are discharged, thereby turning off the TFT 704. In other words, supply of a current to the light-emitting element 705 can be forcibly stopped by providing the TFT 706. Therefore, by employing the structures shown in FIGS. 19B and 19D, a lighting period can start simultaneously with or shortly after a start of a writing period without waiting until signals are written into all the pixels; thus, a duty ratio can be improved.

Figure 19E:
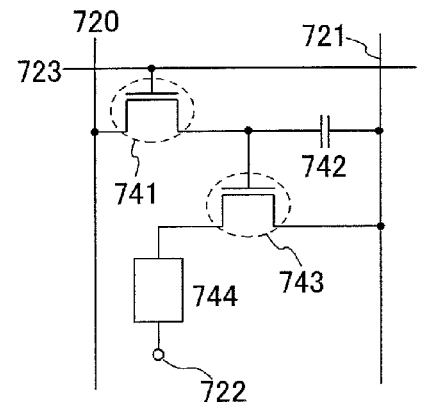
Figure 19F:
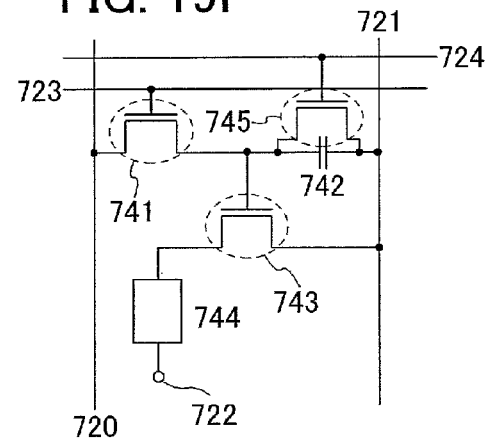

In a pixel shown in FIG. 19E, a signal line 720 and a power supply line 721 are arranged in the column direction, and a scan line 723 is arranged in the row direction. The pixel further includes a TFT 741 as a switching TFT, a TFT 743 as a driver TFT, a capacitor element 742, a light-emitting element 744, and an opposite electrode 722. A pixel shown in FIG. 19F has the same structure as that shown in FIG. 19E, except that a TFT 745 and a scan line 724 are added. The structure of FIG. 19F can also improve a duty ratio by providing the TFT 745.

According to the present invention, a semiconductor device and a display device can be manufactured using a peeling process, in which a transfer process can be conducted with a good state in which a shape and property of the element before peeling are kept. Therefore, more highly reliable display devices can be manufactured with high yield without complicating the apparatus and the process for manufacturing.

Embodiment Mode 12

Figure 22:
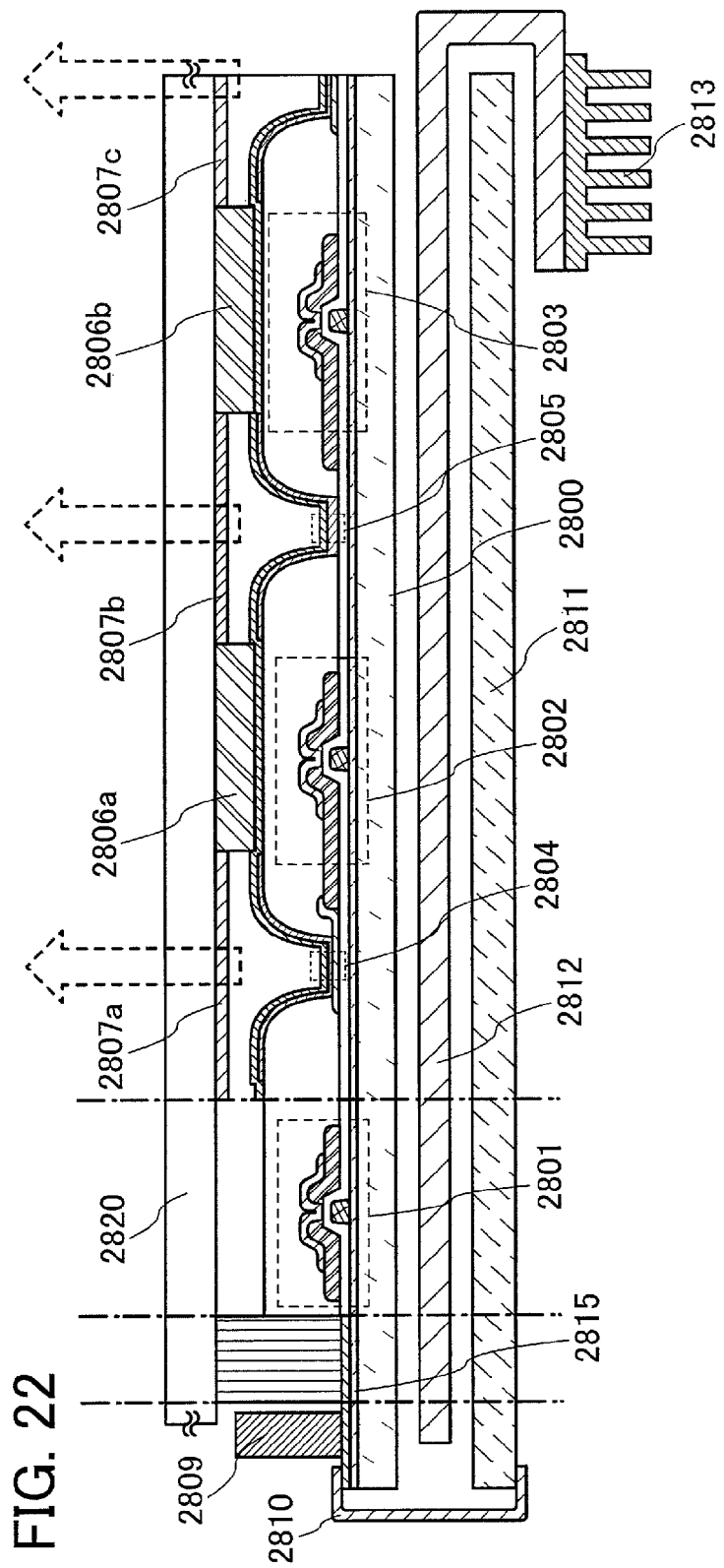
FIG. 22 is a cross-sectional view showing a structural example of an EL display module according to an aspect of the present invention.

FIG. 22 shows an example of forming an EL display module using a substrate 2800 to which an element layer is transferred in accordance with the present invention. In FIG. 22, a pixel portion including pixels is formed over the substrate 2800 to which the element layer is transferred. Flexible substrates are used for the substrate 2800 and a sealing substrate 2820.

In FIG. 22, a protective circuit 2801 using a TFT which has the same structure as that fondled in the pixel is provided between a driver circuit and the pixel, outside the pixel portion. The protective circuit portion 2801 may be configured to operate in the same manner as a diode by connecting a gate to either a source or a drain of the TFT. A driver IC formed from a single crystalline semiconductor, a stick driver IC formed from a polycrystalline semiconductor film over a glass substrate, a driver circuit formed from a SAS, or the like is applied to a driver circuit 2809.

The substrate 2800 to which the element layer is transferred is fixed to the sealing substrate 2820 with spacers 2806a and 2806b formed by a droplet-discharging method interposed therebetween. The spacers are preferably provided to keep a distance between two substrates constant even when the substrate is thin or an area of the pixel portion is enlarged. A space between the substrate 2800 and the sealing substrate 2820 over light-emitting elements 2804 and 2805 connected to TFTs 2802 and 2803, respectively, may be filled with a resin material having a light-transmitting property and the resin material may be solidified. Alternatively, the space may be filled with anhydrous nitrogen or an inert gas.

FIG. 22 shows a case where the light-emitting elements 2804 and 2805 have top emission type structures, which emit light in the direction of arrows shown in the drawing. Multicolor display can be performed by making each pixel to emit light of a different color of red, green, and blue from each other. At this time, color purity of light emitted outside can be improved by forming colored layers 2807a to 2807c corresponding to respective colors on the sealing substrate 2820 side. Moreover, pixels which emit white light may be used and may be combined with the colored layers 2807a to 2807c.

The driver circuit 2809 which is an external circuit is connected to a scan line connection terminal or a signal line connection terminal which is provided at one end of an external wire board 2811 by a wire board 2810. In addition, a heat pipe 2813 which a highly efficient thermal conductive device with a pipe shape and a heat sink 2812, which are used for radiating heat to the outside of the device, may be provided in contact with or adjacent to the substrate 2800 to increase a heat radiation effect.

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate. The remaining layers on the element layer side after peeling the organic compound layer including a photocatalyst substance is an organic compound layer 2815.

Accordingly, since elements can be transferred to various types of substrates, a material for the substrate can be selected from a wider range of materials. In addition, an inexpensive material can be used for the substrate, and a display device can be manufactured at low cost, in addition to having various functions suitable for applications.

Note that FIG. 22 shows the top emission EL module; however, a bottom emission module may be employed by changing the structure of the light-emitting element or the arrangement of the external circuit board. Naturally, a dual emission mode in which light is emitted from both sides of the top and bottom surfaces may be used. In the case of the top emission mode, the insulating layer serving as a partition wall may be colored and used as a black matrix. This partition wall can be formed by a droplet-discharging method and it may be formed by mixing a black resin of a pigment material, carbon black, or the like into a resin material such as polyimide. A stacked layer thereof may also be used.

In addition, reflected light of light entering from outside may be blocked by using a retardation plate or a polarizing plate. An insulating layer serving as a partition wall may be colored and used as a black matrix. This partition wall can be formed by a droplet-discharging method or the like. Carbon black or the like may be mixed into a black resin of a resin material such as polyimide, and a stacked layer thereof may also be used. By a droplet-discharging method, different materials may be discharged to the same region plural times to form the partition wall. A quarter wave plate or a half wave plate may be used as the retardation plate and may be designed to be able to control light. As the structure, the light-emitting element, the sealing substrate (sealing material), the retardation film (quarter wave plate or half wave plate), and the polarizing plate are sequentially faulted over a TFT element substrate, and light emitted from the light-emitting element is transmitted therethrough and emitted outside from the polarizing plate side. The retardation film or polarizing plate may be provided on a side through which light passes or may be provided on both sides in the case of a dual emission display device in which light is emitted from the both surfaces. In addition, an anti-reflection film may be provided on the outer side of the polarizing plate. Accordingly, higher-definition and crisper images can be displayed.

As for the substrate 2800 to which the element layer is transferred, a sealing structure may be formed by attaching a resin film to the side where the pixel portion is formed, with the use of a sealing material or an adhesive resin. Various sealing methods such as resin sealing using a resin, plastic sealing using plastic, and film sealing using a film can be adopted. A gas barrier film which prevents moisture from penetrating the resin film is preferably provided over the surface of the resin film. By employing a film sealing structure, further reduction in thickness and weight can be achieved.

According to the present invention, a semiconductor device and a display device can be manufactured using a peeling process, in which a transfer process can be conducted with a good state in which a shape and property of the element before peeling are kept. Therefore, highly reliable semiconductor devices and display devices can be manufactured with high yield without complicating the apparatus and the process for manufacturing.

Embodiment Mode 13

Figure 23A:
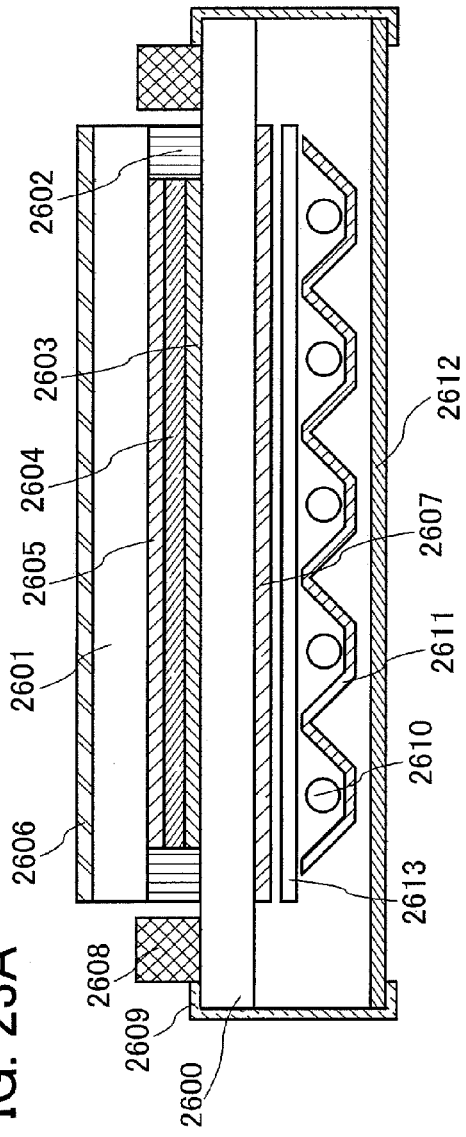
FIGS. 23A and 23B each are a cross-sectional view showing a structural example of a liquid crystal display module according to an aspect of the present invention.
Figure 23B:
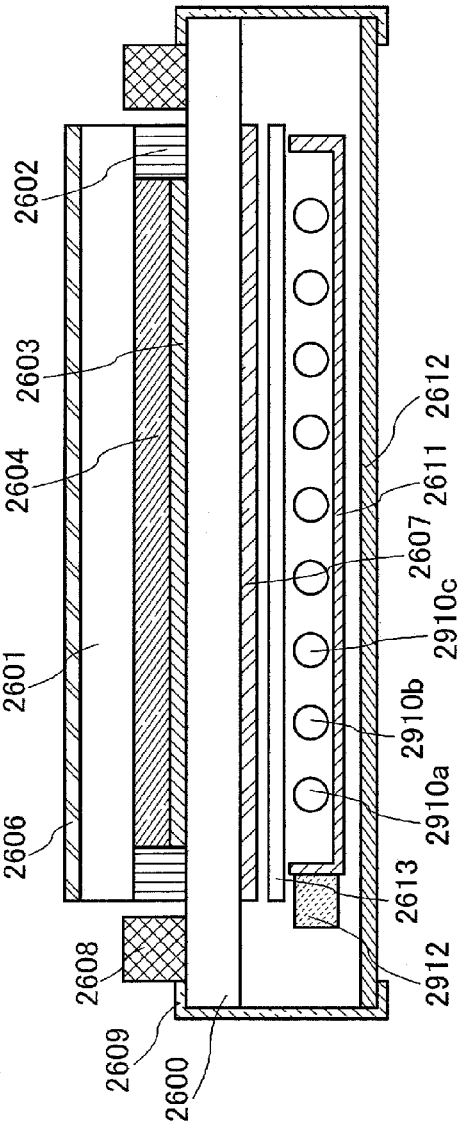

This embodiment mode will be explained with reference to FIGS. 23A and 23B. FIGS. 23A and 23B show an example of forming a display device (a liquid crystal display module) using a TFT substrate 2600 that is manufactured by applying the present invention.

FIG. 23A shows an example of a liquid crystal display module where the TFT substrate 2600 and an counter substrate 2601 are attached with a sealing material 2602, and a pixel portion 2603 including a TFT or the like and a liquid crystal layer 2604 are provided therebetween so as to form a display region. A colored layer 2605 is necessary for color display. In the case of an RGB method, a colored layer corresponding to each color of red, green, and blue is provided to correspond to each pixel. Polarizing plates 2606 and 2607 and a diffuser plate 2613 are provided outside the TFT substrate 2600 and the counter substrate 2601. A light source includes a cold cathode tube 2610 and a reflector plate 2611. A circuit board 2612 is connected to the TFT substrate 2600 and a driver circuit 2608 mounted over the TFT substrate 2600 through a flexible wiring board 2609. External circuits such as a control circuit and a power supply circuit are included in the circuit board 2612. A driver IC formed from a single crystalline semiconductor, a stick driver IC formed from a polycrystalline semiconductor film over a glass substrate, a driver circuit formed from a SAS, or the like is applied to a driver circuit 2608.

In addition, the liquid crystal display module includes a backlight. The backlight can be formed from a light-emitting member, typically, a ray cathode tube, an LED, an EL light-emitting device or the like can be used. The backlight used in this embodiment mode preferably has flexibility. Further, a reflector plate and an optical film may be provided for the backlight.

The polarizing plates 2607 and 2606 are attached to the TFT substrate 2600 and the counter substrate 2601, respectively. A stacked structure may be employed, in which a retardation plate is included between the substrate and the polarizing plate. Further, if necessary, an antireflection treatment may be performed on the polarizing plate 2606 on the viewer's side.

For the liquid crystal display module, a TN (Twisted Nematic) mode, an IPS (In-Plane-Switching) mode, an FFS (Fringe Field Switching) mode, an MVA (Multi-domain Vertical Alignment) mode, an PVA (Patterned Vertical Alignment) mode, an ASM (Axially Symmetric aligned Microcell) mode, an OCB (Optical Compensated Birefringence) mode, an FLC (Ferroelectric Liquid Crystal) mode, or the like can be used.

FIG. 23B shows an example of an FS-LCD (Field Sequential-LCD) in which an FS (Field Sequential) method is applied to the liquid crystal display module of FIG. 23A. The FS-LCD emits red light, green light, and blue light during one frame period and can perform color display by combining images using time division. Since each light is emitted by a light-emitting diode, a cold cathode tube, or the like, a color filter is not necessary. Thus, it is not necessary to arrange color filters of three primary colors and restrict the display region of each color, and thus, color display of all three colors can be performed in any regions. On the other hand, since three colors of light are emitted during one frame period, high-speed response is required for a liquid crystal. By employing an FS method with an FLC mode liquid crystal layer, an OCB mode liquid crystal layer or the like to a display device of the present invention, a display device or a liquid crystal television device with high performance and high image quality can be completed.

A liquid crystal layer in the OCB mode has a so-called π-cell structure. In the π-cell structure, liquid crystal molecules are oriented so that their pretilt angles are plane-symmetric along a center plane between an active matrix substrate and a counter substrate. An orientation state of a liquid crystal of a π-cell structure is initially splayed orientation while a voltage is not applied between the substrates, and then shifts to bend orientation when a voltage is applied therebetween. In this bend orientation state, when a voltage is not applied between the substrates, light can be transmitted and white display is obtained. When a voltage is applied further, liquid crystal molecules of bend orientation get orientated perpendicular to the both substrates so that light can be not transmitted. With the OCB mode, response with about 10 times higher speed than a conventional TN mode can be achieved.

Moreover, as a mode corresponding to the FS method, an HV (Half-V)-FLC or an SS (Surface stabilized)-FLC using a ferroelectric liquid crystal (FLC) capable of high-speed operation, or the like can also be used. The OCB mode uses a nematic liquid crystal having relatively low viscosity, while the HV-FLC or the SS-FLC uses a smectic liquid crystal having a ferroelectric phase.

Moreover, optical response speed of a liquid crystal display module gets higher by narrowing the cell gap of the liquid crystal display module. In addition, the optical response speed can also get higher by decreasing the viscosity of the liquid crystal material. The increase in response speed is particularly advantageous when a pixel pitch in a pixel portion of a liquid crystal display module is 30 μm or less. Also, further increase in response speed is possible by an overdrive method in which applied voltage is increased (or decreased) for a moment.

FIG. 23B shows a transmissive liquid crystal display module, in which a red light source 2910a, a green light source 2910b, and a blue light source 2910c are provided as light sources. The light sources are provided with a control portion 2912 in order to switch on or off the red light source 2910a, the green light source 2910b, and the blue light source 2910c. The control portion 2912 controls light emission of each color, so that light enters the liquid crystal to combine images by time division, thereby performing color display.

This embodiment mode can be freely combined with the embodiment modes described above.

According to the present invention, by dispersing the photocatalyst substance in the organic compound layer, and using a photocatalyst function of the photocatalyst substance, the organic compound is decomposed (broken) to make the layer rough and the element layer is peeled from the substrate. Therefore, since it is unnecessary to apply a large amount of power to the element layer in order to peel it, the element is not broken during the peeling process and an element with good shape can be transferred to various types of substrates as appropriate.

Accordingly, since elements can be transferred to various types of substrates, a material for the substrate can be selected from a wider range of materials. In addition, an inexpensive material can be used for the substrate, and a display device can be manufactured at low cost, in addition to having various functions suitable for applications.

According to the present invention, a semiconductor device and a display device can be manufactured using a peeling process, in which a transfer process can be conducted with a good state in which a shape and property of the element before peeling are kept. Therefore, more highly reliable semiconductor devices and display devices can be manufactured with high yield without complicating the apparatus and the process for manufacturing.

Embodiment Mode 14

A backlight which can be used as a light source of a transmissive type liquid crystal display device manufactured by a transfer process of the present invention will be described with reference to FIG. 30A to FIG. 36.

Figure 30A:
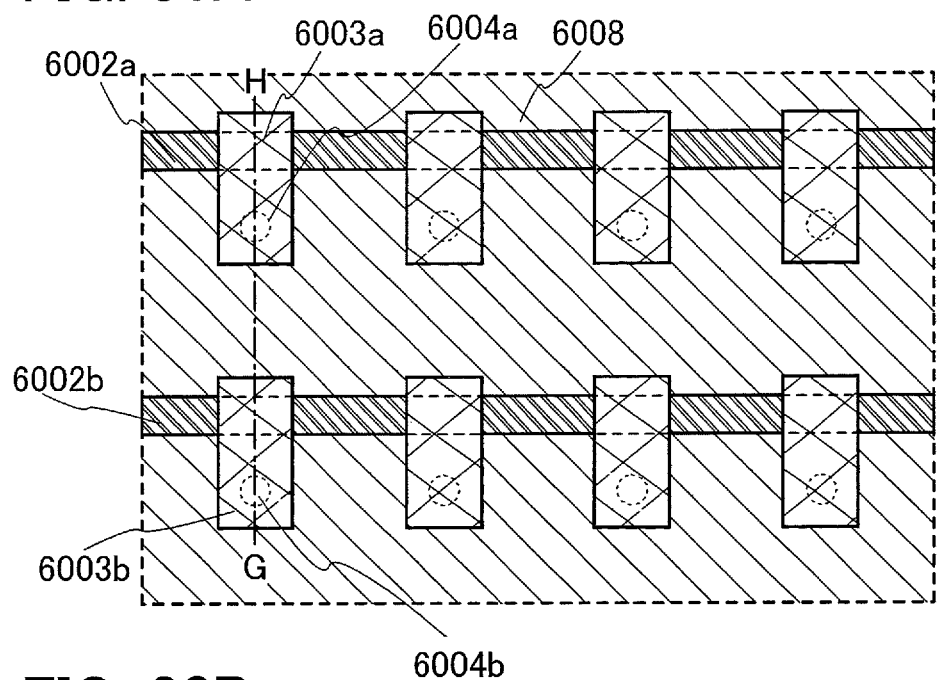
FIGS. 30A and 30B show a backlight which can be applied to the present invention.
Figure 30B:
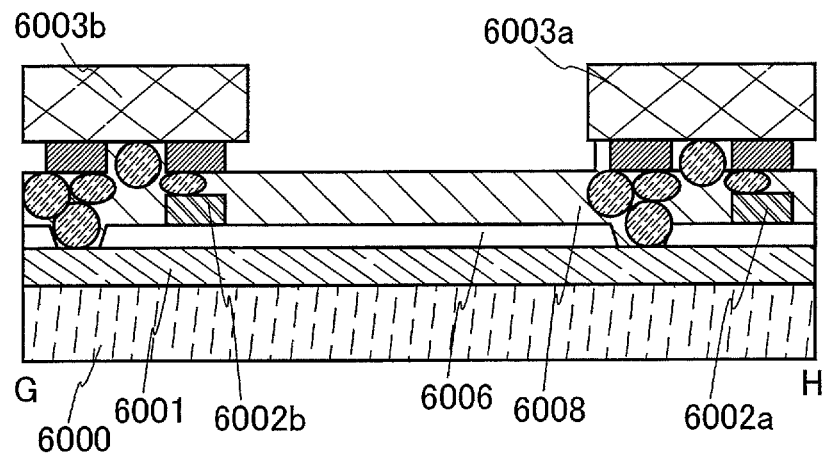

FIG. 30A is a top view of a backlight and FIG. 30B is a cross-sectional view taken along the line H-G. In FIGS. 30A and 30B, a common electrode layer 6001 having a reflective property is provided over a substrate 6000 having flexibility, and a wiring layer 6002a and a wiring layer 6002b which function as an anode are formed over an insulating layer 6006. A light-emitting diode 6003a and a light-emitting diode 6003b are provided over the wiring layer 6002a and the wiring layer 6002b respectively. The light-emitting diode 6003a is electrically connected to the wiring layer 6002a with an anisotropic conductive layer 6008. In addition, the light-emitting diode 6003a is electrically connected to the common electrode layer 6001 at an opening (a contact hole) 6004a which is formed in the insulating layer 6006. Similarly, the light-emitting diode 6003b is electrically connected to the wiring layer 6002b with the anisotropic conductive layer 6008, and the light-emitting diode 6003b is electrically connected to the common electrode layer 6001 at an opening (a contact hole) 6004b formed in the insulating layer 6006.

The common electrode layer 6001 also serves as a reflecting electrode which reflects incident light. In addition, the anisotropic conductive layer 6008 may be provided entirely, or may be provided selectively for a connection portion of the light-emitting diode.

Figure 31A:
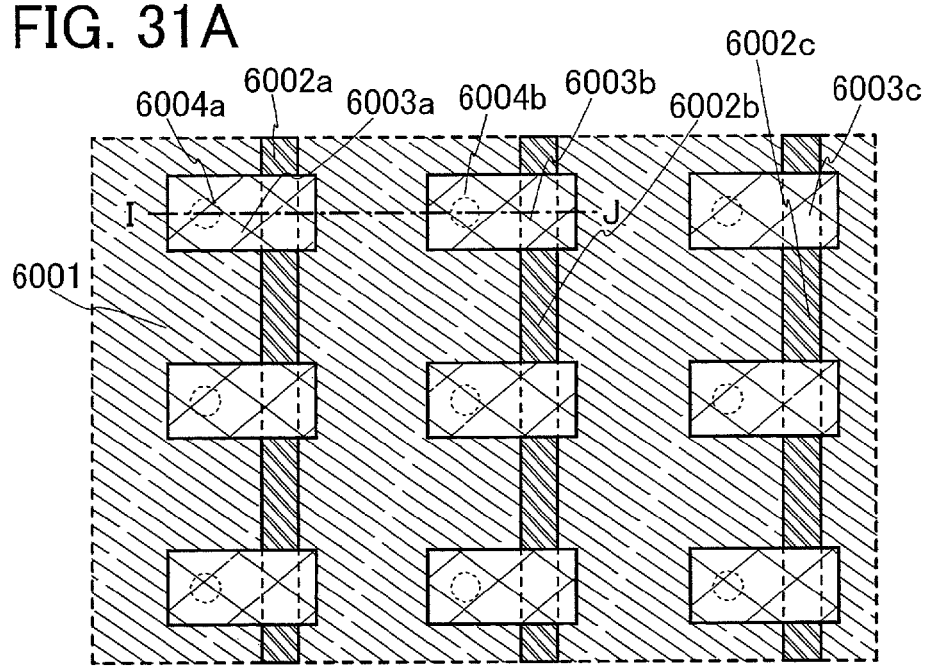
FIGS. 31A and 31B show a backlight which can be applied to the present invention.
Figure 31B:
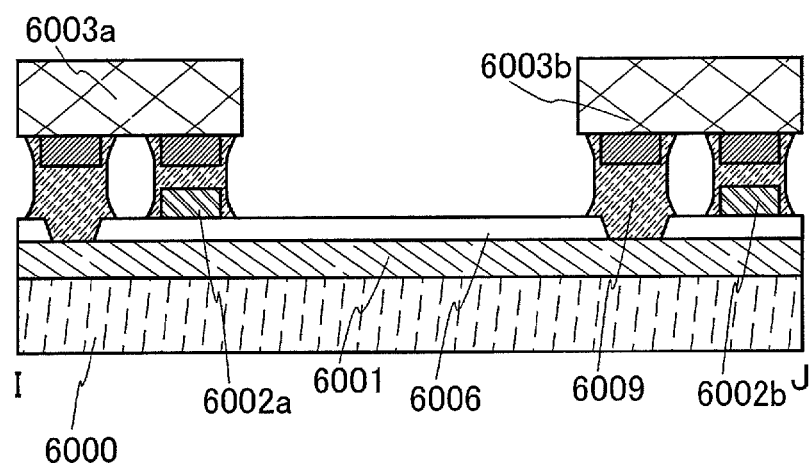

FIG. 31A is a top view of a backlight, and FIG. 31B is a cross-sectional view taken along a line I-J of FIG. 30A. The backlight of FIGS. 31A and 31B is an example in which connections between a light-emitting diode, and a common electrode layer and a wiring layer are made by a bump or a conductive metal paste (e.g., a silver (Ag) paste). In FIG. 31A, the wiring layer 6002a, the wiring layer 6002b, and a wiring layer 6002c extending in the column direction are formed. A voltage to be applied to the wiring layer is easily controlled when light-emitting diodes of the same color are arranged for each wiring layer, such that light-emitting diodes (the light-emitting diode 6003a or the like) which are connected to the wiring layer 6002a are red light-emitting diodes (R), light-emitting diodes (the light-emitting diode 6003b or the like) which are connected to the wiring layer 6002b are green light-emitting diodes (G), and light-emitting diodes (a light-emitting diode 6003c or the like) which are connected to the wiring layer 6002c are blue light emission diodes (B). The light-emitting diode 6003a is electrically connected to the common electrode layer 6001 and the wiring layer 6002a with a conductive paste 6009, and the light-emitting diode 6003b is electrically connected to the common electrode layer 6001 and the wiring layer 6002b with the conductive paste 6009.

Figure 32A:
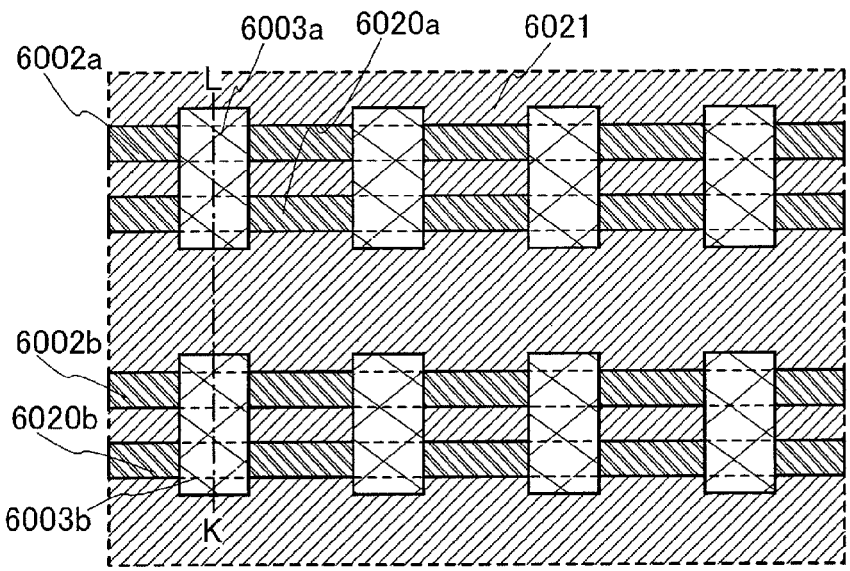
FIGS. 32A to 32C show a backlight which can be applied to the present invention.
Figure 32B:
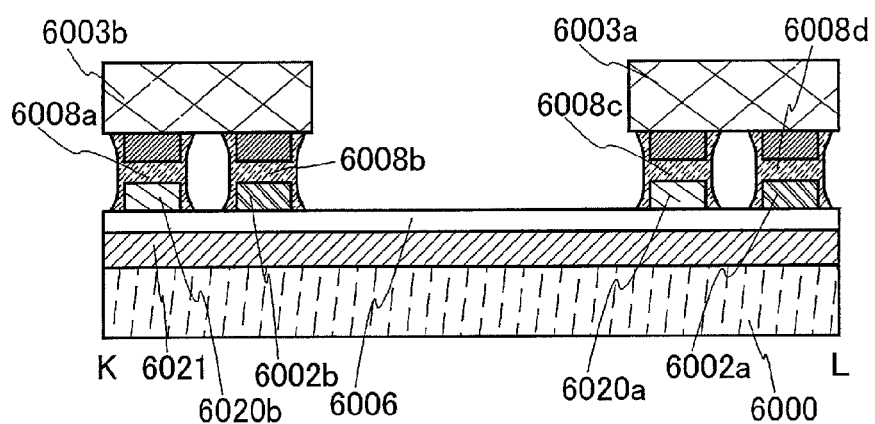
Figure 32C:
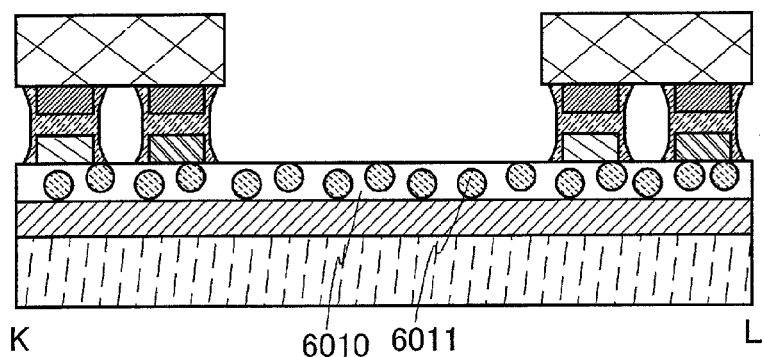

FIG. 32A is a top view of a backlight, and FIGS. 32B and 32C are cross-sectional views along a line K-L of FIG. 32A. The backlight of FIGS. 32A to 32C has a structure in which a reflective electrode layer and a common electrode layer are divided. In FIG. 32B, a reflective electrode layer 6021 is formed over the substrate 6000 having flexibility (also referred to as a flexible substrate), and the light-emitting diode 6003a is provided over the wiring layer 6002a and the common electrode layer 6020a. Further, the light-emitting diode 6003b is provided over the wiring layer 6002b and the common electrode layer 6020b. The light-emitting diode 6003a is electrically connected to the wiring layer 6020a by a conductive paste 6008c, and the light-emitting diode 6003a is electrically connected to the wiring layer 6002a by a conductive paste 6008d. The light-emitting diode 6003b is electricity connected to the common electrode layer 6020b by a conductive paste 6008a, and the light-emitting diode 6003b is electrically connected to the wiring layer 6002b by a conductive paste 6008b.

FIG. 32C shows a structure in which an insulating layer 6010 including a light scattering particle 6011 is provided over the reflective electrode layer 6021. The light scattering particle 6011 includes an effect of scattering incident light and light reflected on the reflective electrode layer 6021. In this embodiment mode, the reflective electrode layer may perform specular reflection as a mirror surface state. Further, a reflective electrode layer which has unevenness on its surface and is whitened may be used to perform diffuse reflection.

Figure 33A:
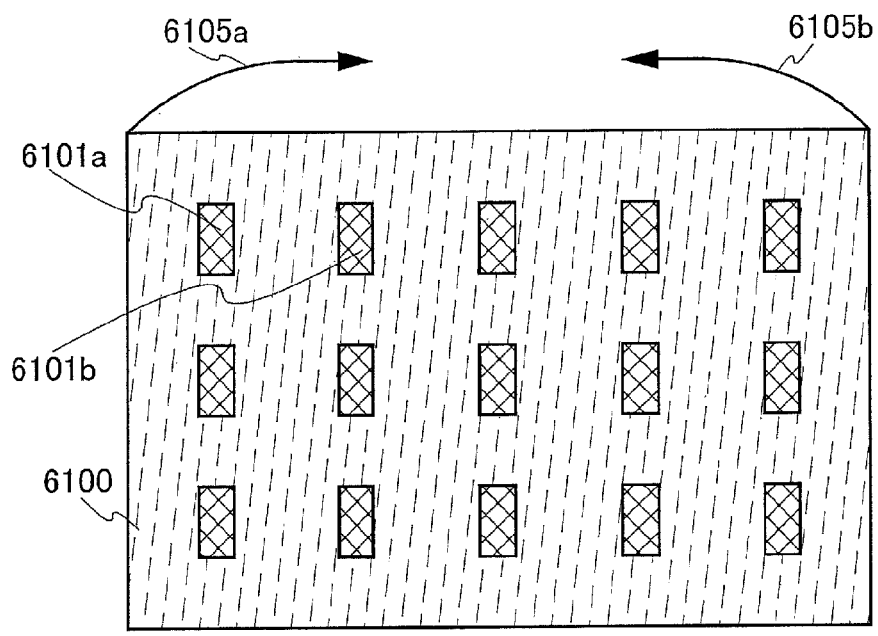
FIGS. 33A and 33B show a backlight which can be applied to the present invention.

An example in which a plurality of light-emitting diodes are provided over a flexible substrate 6100 is described with reference to FIGS. 33A and 33B. When a backlight having flexibility is used, there is a direction where frequency of bending is high depending on a product provided with the backlight. The backlight in FIG. 33A is a horizontally long rectangle in the top view, if frequency of bending the product in the directions of arrows 6105a and 6105b on the long side is high, the plurality of light-emitting diodes provided over the flexible substrate 6100 are rectangular in the top view. Light-emitting diodes 6101a and 6101b are arranged such that short sides of the light-emitting diodes 6101a and 6101b are parallel to a side of the flexible substrate 6100 whose frequency of being bent is high.

Figure 33B:
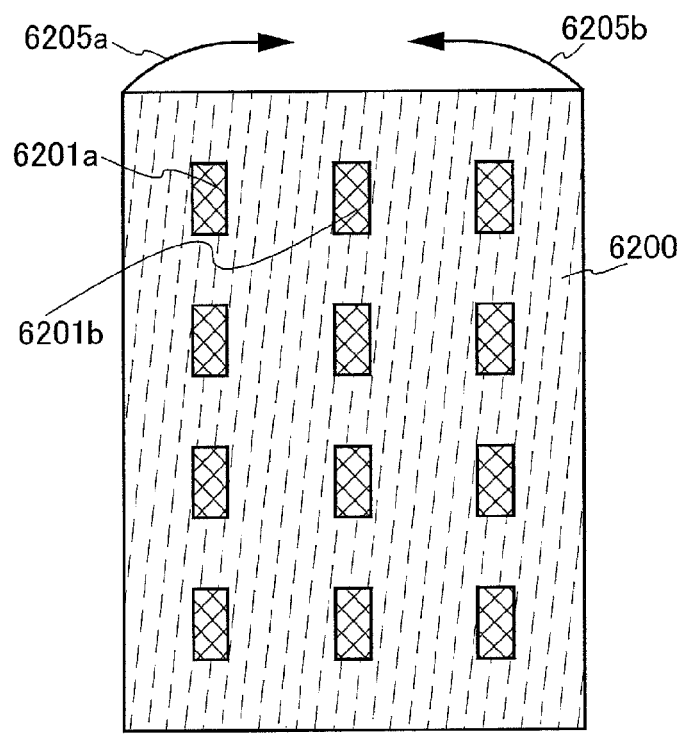

The backlight shown in FIG. 33B uses a vertically long flexible substrate 6200, and frequency of bending in directions of arrows 6205a and 6205b is high. In this case, a plurality of light-emitting diodes provided over the vertical flexible substrate 6200 are rectangular in the top view. Light-emitting diodes 6201a and 6201b are arranged such that short sides of the light-emitting diodes 6201a and 6201b are parallel to a side of the flexible substrate 6200 whose frequency of being bent is high. In the case where frequency of bending is different (i.e., the frequency is high or low) depending on an intended purpose and a shape of a display device to be equipped, as just described, when a side to be bent and the short side of the light-emitting diode are arranged to be parallel in advance for easily bending, and thus, the display device is hard to be damaged. Therefore, reliability can be increased.

Figure 34A:
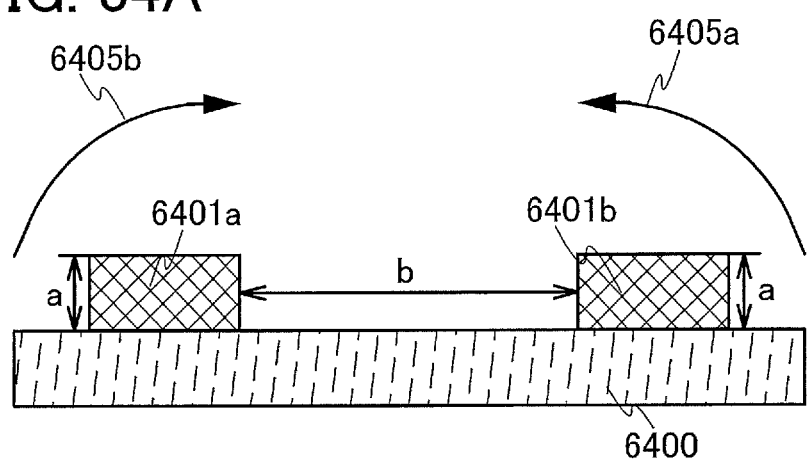
FIGS. 34A and 34B show a backlight which can be applied to the present invention.
Figure 34B:
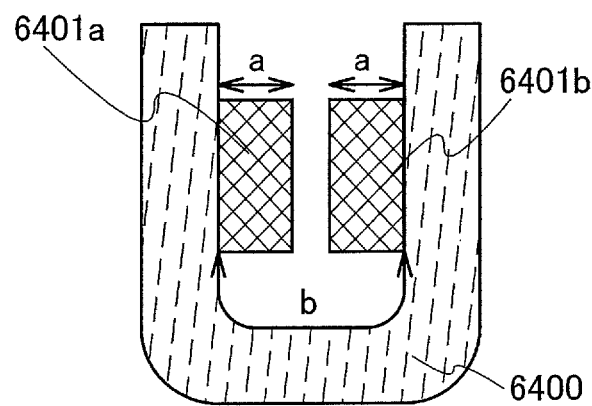

FIGS. 34A and 34B show a light-emitting diode 6401a and a light-emitting diode 6401b adjacently provided with an interval b over a substrate 6400 having flexibility (also referred to as flexible substrate). The light-emitting diode 6401a and the light-emitting diode 6401b each have a thickness a. FIG. 34B is a diagram in which the flexible substrate 6400 which is provided with the light-emitting diode 6401a and the light-emitting diode 6401b is bent in directions of an arrow 6405a and an arrow 6405b. As in FIGS. 34A and 34B, when the width of the interval b between the adjacent light-emitting diodes is more than twice as large as the thickness a, that is, when b>2a is satisfied, the flexible substrate 6400 can be bent easily without the light-emitting diode 6401a and the light-emitting diode 6401b coming into contact with each other.

Figure 35A:
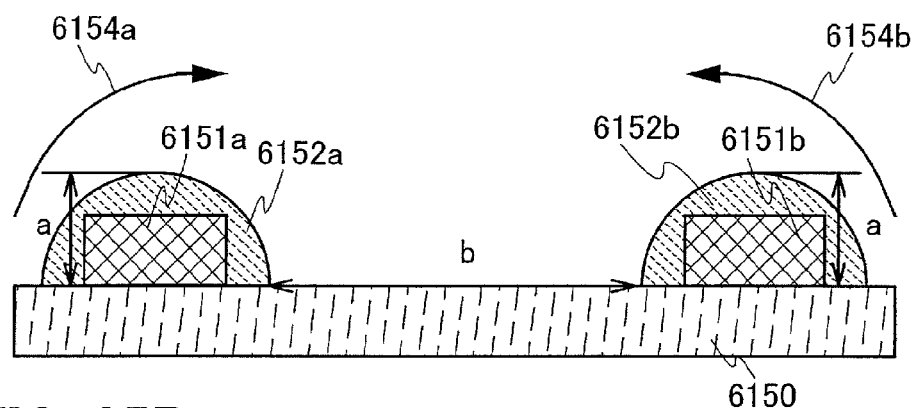
FIGS. 35A and 35B show a backlight which can be applied to the present invention.
Figure 35B:
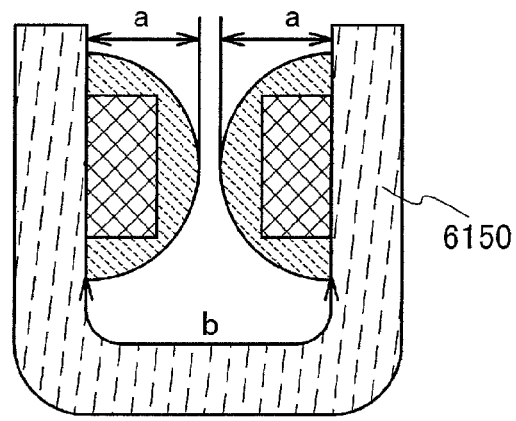

FIGS. 35A and 35B show an example of a structure in which a light-emitting diode is covered with a resin layer. As shown in FIG. 35A, a light-emitting diode 6151a covered with a resin layer 6152a and a light-emitting diode 6151b covered with a resin layer 6152b are formed over a flexible substrate 6150 with an interval b therebetween. Each of maximum thicknesses of the resin layer 6152a and the resin layer 6152b is a thickness a. FIG. 35B shows a state in which the flexible substrate 6150 which is provided with the light-emitting diode 6151a, the resin layer 6152a, the light-emitting diode 6151b, and the resin layer 6152b is bent in directions of the arrow 6154a and the arrow 6154b. As in FIGS. 35A and 35B, when the width of the interval b between the adjacent resin layers or light-emitting diodes covered with the resin layers is more than twice as large as the maximum thickness a of the resin layers covering the light-emitting diodes, that is, when b>2a is satisfied, the flexible substrate 6150 can be bent easily without the light-emitting diode 6151a covered with the resin layer 6152a and the light-emitting diode 6151b covered with the resin layer 6152b coming into contact with each other.

Figure 36:
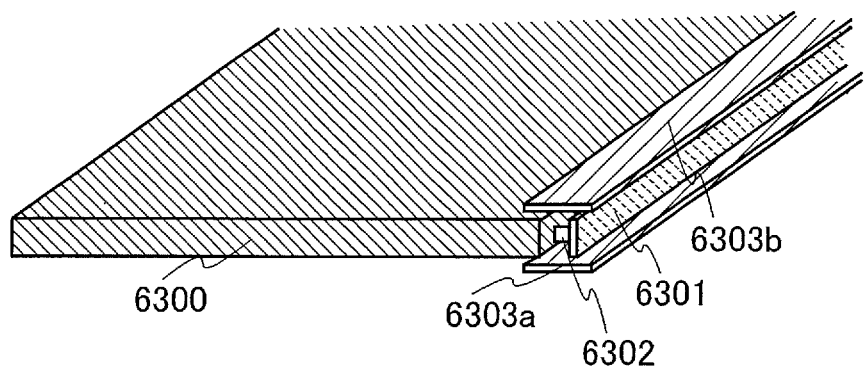
FIG. 36 shows a backlight which can be applied to the present invention.

A sidelight type backlight having flexibility shown in FIG. 36 includes a light guide plate 6300 having flexibility, a light-emitting diode 6302 provided on a flexible substrate 6301, and reflective sheets 6303a and 6303b which reflect light emitted from the light-emitting diode 6302. The reflective sheets 6303a and 6303b are provided so that light is efficiently led to the light guide plate. If the reflective sheet is bent into a cylinder shape, the backlight itself is not easy to bend. However, the reflective sheets 6303a and 6303b having a shape which is not fixed in a cylinder shape in FIG. 36 as shown in this embodiment mode can be easily bent. The arrangement of the light-emitting diode 6303 over the flexible substrate 6301 and connection state of the reflective electrode layer, the common electrode layer and the wiring layer with the light-emitting diode, and the like can employ the modes shown in FIGS. 30A to 34B.

When a backlight having flexibility with the above structure is used for a display device having flexibility which is formed using a transfer process of the present invention, an electronic device having flexibility can be farmed. In addition, an inexpensive material can be used for the substrate, and a semiconductor device can be manufactured at low cost, in addition to having various functions suitable for applications.

Note that the above described structure of the backlight can be used for other liquid crystal display panels than the display devices shown in the present invention.

Embodiment Mode 15

A backlight which can be used as a light source of a transmissive type liquid crystal display device manufactured by a transfer process of the present invention will be described with reference to FIG. 39.

Figure 39:
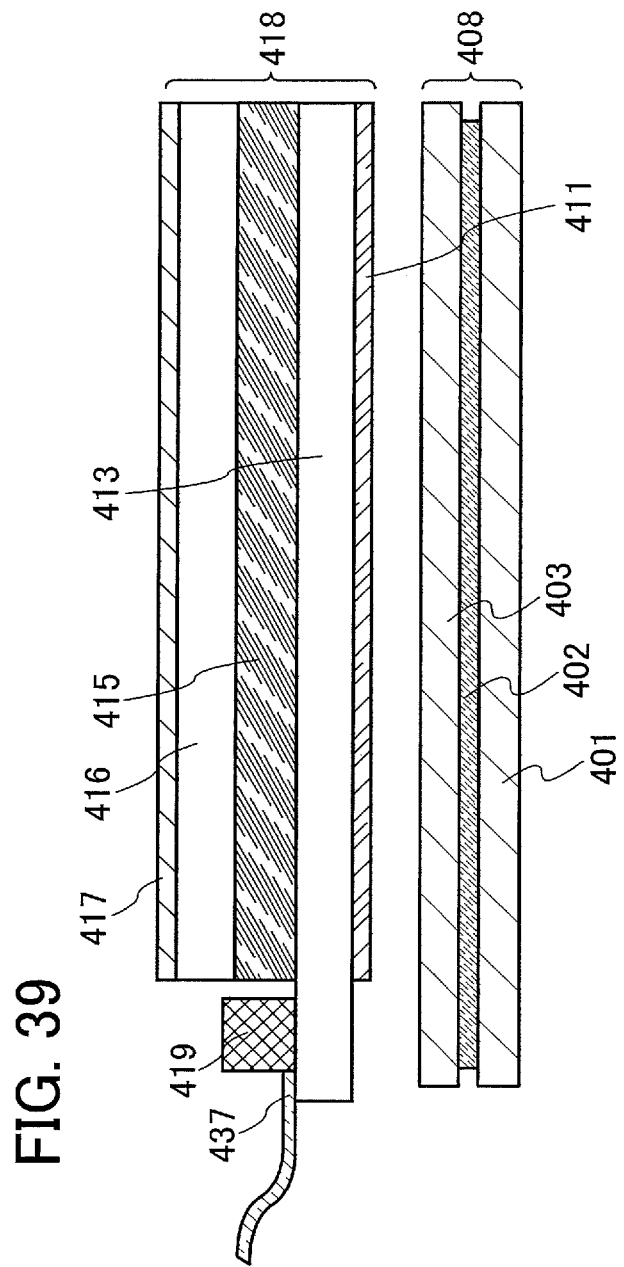
FIG. 39 is a cross-sectional view of a display device according to an aspect of the present invention.

FIG. 39 shows a display device portion 418 including a flexible substrate 413, an element layer 415 including a liquid crystal element or the like, a flexible counter substrate 416, a polarizing plate 417, a polarizing plate 411, a driver circuit 419, and an FPC 437, and a backlight 408 including a flexible substrate 401, a layer 402 including a light-emitting element formed from a first conductive layer, an electroluminescent layer, and a second conductive layer, and a flexible substrate 403.

As the backlight 408 shown in FIG. 39, a light-emitting device having one or both of the organic EL element and the inorganic EL element in the above-described embodiment mode can be used. Alternatively, without using the present invention, the layer 402 including a light-emitting element in which a first conductive layer, a light-emitting layer, and a second conductive layer are formed, is formed over the flexible substrate 401, and is sealed with the flexible substrate 403 to obtain an EL display device (light-emitting device). The EL display device (light-emitting device) can also be used. Note that the light-emitting element can be formed in such a way that the first conductive layer, the light-emitting layer, and the second conductive layer are formed by a droplet-discharging method (such as an inkjet (LT) method), an evaporation method, a sputtering method, a printing method, or the like, as appropriate.

Note that as the flexible substrate 403 of the light-emitting device which can be used for the backlight 408, the polarizing plate 411 shown in FIG. 39 may be used. In this case, a layer having a light-emitting element is formed over the flexible substrate 401, and the flexible substrate 401 and the layer 402 having a light-emitting element are sealed with the polarizing plate 411. Then, the polarizing plate 411 and the flexible substrate 413 can be attached to each other with an adhesive having light transmitting property. Accordingly, the number of flexible substrates forming the backlight can be reduced.

After the layer 402 having a light-emitting element is formed over the flexible substrate 401, the layer 402 having a light-emitting element and the flexible substrate 401 can be attached to the polarizing plate 411 provided on the flexible substrate 413 with an adhesive. Accordingly, the number of flexible substrates forming the backlight can be reduced.

After the layer 402 having a light-emitting element is formed in one surface of the polarizing plate 411, the flexible substrate 401 is attached on one surface of the layer 402 having a light-emitting element and the polarizing plate 411 using an adhesive, and then the other surface of the polarizing plate 411 and the flexible substrate 401 may be attached to each other using an adhesive. Further, after the layer 402 having a light-emitting element is formed on one surface of the polarizing plate 411, the other surface of the polarizing plate 411 and the flexible substrate 413 are attached to each other using an adhesive, and then the flexible substrate 401 may be attached to one surface of the polarizing plate 411 using an adhesive. Accordingly, the number of flexible substrates forming the backlight can be reduced.

Furthermore, the polarizing plate 411 may be used instead of the flexible substrate 401. That is, the polarizing plate 411 which seals the flexible substrate 413 and the layer 402 having a light-emitting element may be attached to the element layer 415, using an adhesive. Accordingly, the number of flexible substrates forming the liquid crystal display panel can be reduced.

A light-emitting element with a large area which covers a pixel portion can be formed as a light-emitting element formed in the layer 402 having a light-emitting element of this embodiment mode. An element which emits white light is preferably used as such a light-emitting element.

In addition, a linear light-emitting element may be formed as a light-emitting element formed in the layer 402 having a light-emitting element. An element which emits white light can be used as the light-emitting element. Further, light-emitting elements are preferably arranged such that a blue light-emitting element, a red light-emitting element, and a green light-emitting element are provided in each pixel. In this case, a colored layer is not necessarily provided. Note that when a colored layer is provided, color purity is increased and a liquid crystal display panel capable of performing crisp and vivid display is provided.

In addition, as a light-emitting element formed in the layer 402 having a light-emitting element, an element which emits white light can be used in each pixel. Further, a sub-pixel including a blue light-emitting element, a sub-pixel including a red light-emitting element, and a sub-pixel including a green light-emitting element may be provided in each pixel. Accordingly, a liquid crystal display panel capable of high-definition display can be provided.

When a backlight having flexibility with the above structure is used for a display device having flexibility which is formed using a transfer process of the present invention, an electronic device having flexibility can be formed. In addition, an inexpensive material can be used for the substrate, and a semiconductor device can be manufactured at low cost, in addition to having various functions suitable for applications.

Note that a structure of the backlight can be used for other liquid crystal display panels than the display panels shown in the present invention.

Embodiment Mode 16

Figure 24:
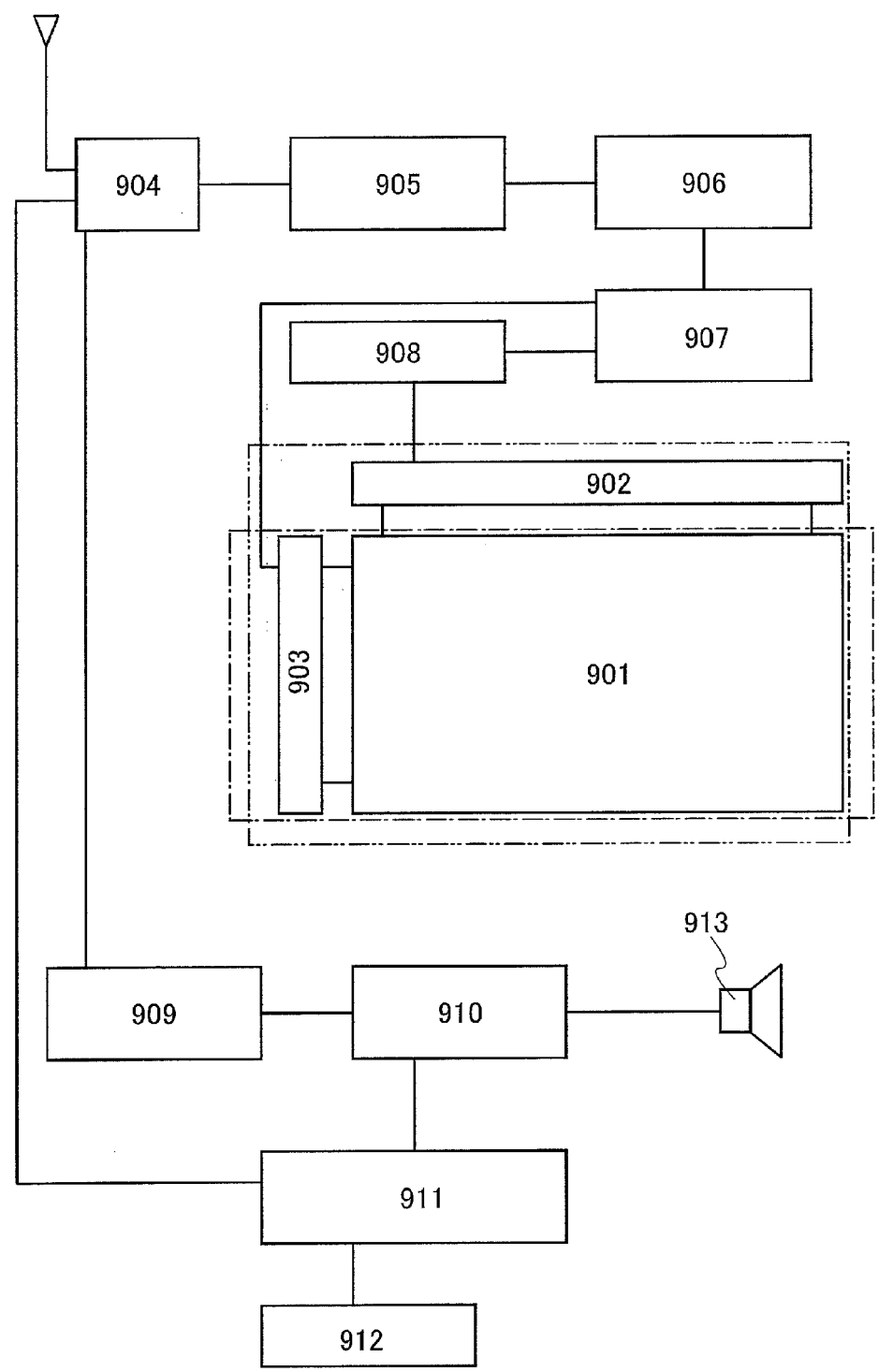
FIG. 24 is a block diagram having a main structure of an electronic device to which the present invention can be applied.

By a display device formed by the present invention, a television device (also, referred to as a television simply or a television receiver) can be completed. FIG. 24 shows a block diagram of a main structure of a television device. As for a display panel, any modes of the following may be employed: as the structure shown in FIG. 27A, a case where only a pixel portion 901 is formed and a scan line driver circuit 903 and a signal line driver circuit 902 are mounted by a TAB method as shown in FIG. 28B; a case where only the pixel portion 901 is formed and the scan line driver circuit 903 and the signal line driver circuit 902 are mounted by a COG method as shown in FIG. 28A; a case where a TFT is formed as shown in FIG. 27B, the pixel portion 901 and the scan line driver circuit 903 are formed over a substrate, and the signal line driver circuit 902 is independently mounted as a driver IC; a case where the pixel portion 901, the signal line driver circuit 902, and the scan line driver circuit 903 are formed over the same substrate as shown in FIG. 28C; and the like.

In addition, as another structure of an external circuit, a video signal amplifier circuit 905 that amplifies a video signal among signals received by a tuner 904, a video signal processing circuit 906 that converts the signals output from the video signal amplifier circuit 905 into chrominance signals corresponding to each colors of red, green, and blue, a control circuit 907 that converts the video signal so as to be input to a driver IC, and the like are provided on an input side of the video signal. The control circuit 907 outputs signals to both a scan line side and a signal line side. In the case of digital driving, a signal dividing circuit 908 may be provided on the signal line side and an input digital signal may be divided into m pieces to be supplied.

An audio signal among signals received by the tuner 904 is transmitted to an audio signal amplifier circuit 909 and is supplied to a speaker 913 through an audio signal processing circuit 910. A control circuit 911 receives control information of a receiving station (reception frequency) or sound volume from an input portion 912 and transmits signals to the tuner 904 or the audio signal processing circuit 910.

Figure 25A:
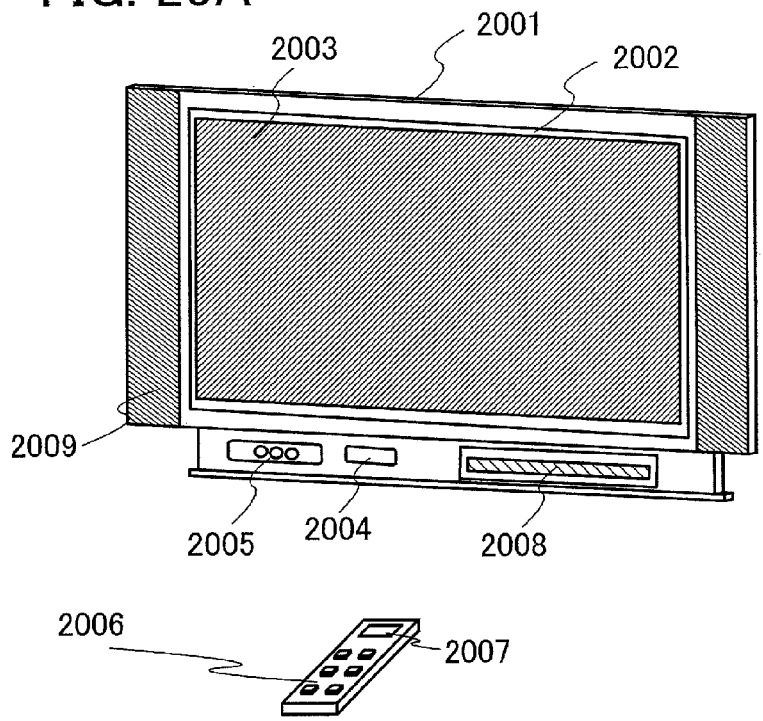
FIGS. 25A and 25B show an electronic device to which the present invention can be applied.
Figure 25B:
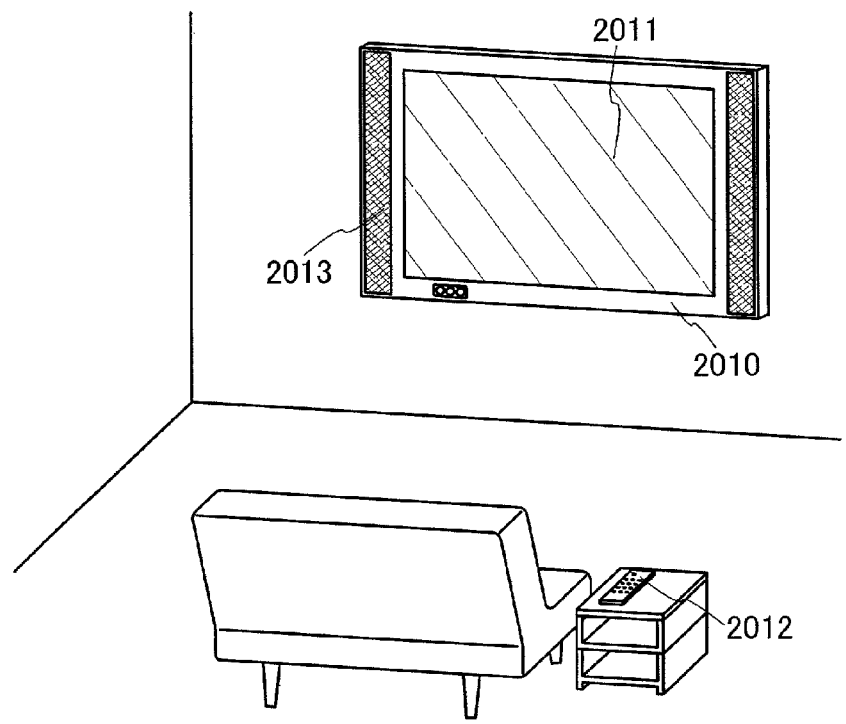

Such display modules are incorporated into each casing as shown in FIGS. 25A and 25B, thereby a television device can be completed. When an EL display module shown in FIG. 22 is used, an EL television device can be completed. When a liquid crystal display module shown in FIG. 23 is used, a liquid crystal television device can be completed. In FIG. 25A, a main screen 2003 is formed by a display module, and a speaker portion 2009, an operation switch, and the like are provided as accessory equipment. In such a manner, a television device can be completed according to the present invention.

A display panel 2002 is incorporated in a casing 2001, and general TV broadcast can be received by a receiver 2005. Further, by connecting to a communication network by wired or wireless connections via a modem 2004, one-way (from a sender to a receiver) or two-way (between a sender and a receiver or between receivers) information communication can be carried out. The television device can be operated by using a switch built in the casing or a remote control unit 2006. A display portion 2007 for displaying output information may also be provided in the remote control unit 2006.

Further, the television device may include a sub-screen 2008 formed using a second display panel to display channels, volume, or the like, in addition to the main screen 2003. In this structure, the main screen 2003 and the sub-screen 2008 can be faulted using a liquid crystal display panel of the present invention. The main screen 2003 may be formed using an EL display panel having a superior viewing angle, and the sub-screen 2008 may be formed using a liquid crystal display panel capable of displaying sub-images with lower power consumption. In order to reduce the power consumption preferentially, the main screen 2003 may be formed using a liquid crystal display panel, and the sub-screen 2008 may be formed using an EL display panel such that the sub-screen can flash on and off. By using the present invention, even when with a large-sized substrate is used and many TFTs and electronic parts are used, a highly reliable display device can be formed.

FIG. 25B shows a television device having a large display portion with a size of, for example, 20 to 80 inches. The television device includes a casing 2010, a display portion 2011, a keyboard portion 2012 that is an operation portion, a speaker portion 2013, and the like. The present invention is applied to the manufacturing of the display portion 2011.

According to the present invention, by dispersing the photocatalyst substance in the organic compound layer, and using a photocatalyst function of the photocatalyst substance, an organic compound is decomposed (broken) to make the layer rough and an element layer is peeled from the substrate. Therefore, since it is unnecessary to apply a large amount of power to the element layer in order to peel it, the element is not broken during the peeling process and an element with good shape can be transferred to various types of substrates as appropriate.

According to the present invention, a semiconductor device and a display device can be manufactured using a peeling process, in which a transfer process can be conducted with a good state in which a shape and property of the element before peeling are kept. Therefore, highly reliable semiconductor devices and display devices, and further, television device equipped with such devices cam be manufactured with high yield without complicating the apparatus and the process for manufacturing.

As a matter of course, the present invention is not limited to the television device. The present invention can be applied to various applications such as monitors of personal computers, particularly large-sized display media typified by information display boards at train stations, airports, or the like, and advertising display boards on the street.

Embodiment Mode 17

Electronic devices of the present invention includes: television devices (also simply referred to as TVs or television receivers), cameras such as digital cameras and digital video cameras, mobile phone sets (also simply referred to as cellular phone sets or cellular phones), portable information terminals such as a PDA, portable game machines, monitors for computers, computers, audio reproducing devices such as car audio sets, image reproducing devices provided with a recording medium such as home-use game machines, and the like. Specific examples thereof will be explained with reference to FIGS. 26A to 26E.

Figure 26A:
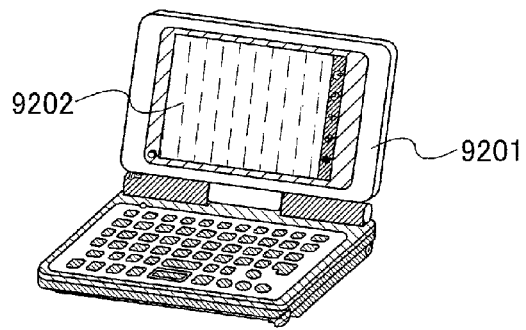
FIGS. 26A to 26E each show an electronic device to which the present invention can be applied.

A portable information terminal shown in FIG. 26A includes a main body 9201, a display portion 9202, and the like. The display device of the present invention can be applied to the display portion 9202. Thus, a portable information terminal which is light weight, thin, and highly reliable can be provided.

Figure 26B:
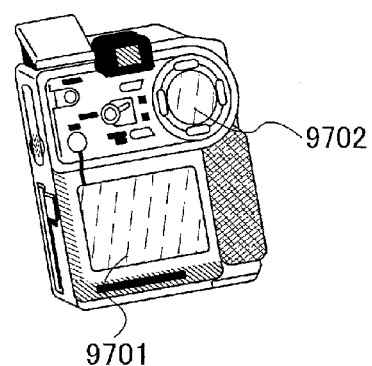

A digital video camera shown in FIG. 26B includes a display portion 9701, a display portion 9702, and the like. The display device of the present invention can be applied to the display portion 9701. Thus, a digital video camera which is light weight, thin, and highly reliable can be provided.

Figure 26C:
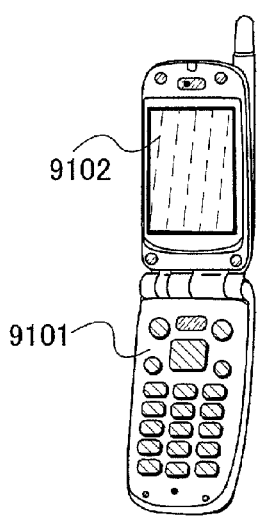

A cellular phone set shown in FIG. 26C includes a main body 9101, a display portion 9102, and the like. The display device of the present invention can be applied to the display portion 9102. Thus, a cellular phone set which is light weight, thin, and highly reliable can be provided.

Figure 26D:
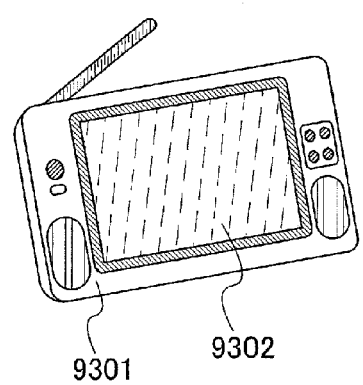

A portable television set shown in FIG. 26D includes a main body 9301, a display portion 9302, and the like. The display device of the present invention can be applied to the display portion 9302. Thus, a portable television set which is light weight, thin, and highly reliable can be provided. The display device of the present invention can be applied to various types of television sets including a small-sized television mounted on a portable terminal such as a cellular phone set, a medium-sized television that is portable, and a large-sized television (for example, 40 inches in size or more).

Figure 26E:
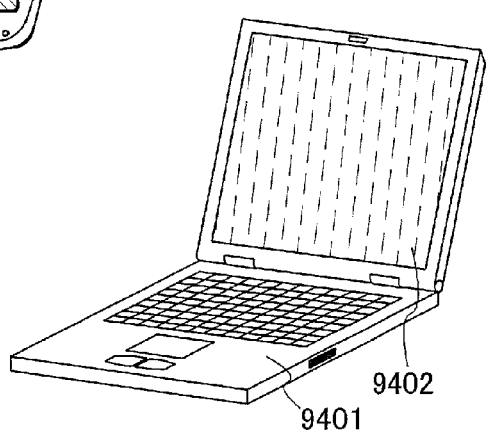

A portable computer shown in FIG. 26E includes a main body 9401, a display portion 9402, and the like. The display device of the present invention can be applied to the display portion 9402. Thus, a portable computer which is light weight, thin, and highly reliable can be provided.

By the display device of the present invention, electronic devices which are light weight, thin, and highly reliable can be provided.

Embodiment Mode 18

Figure 21A:
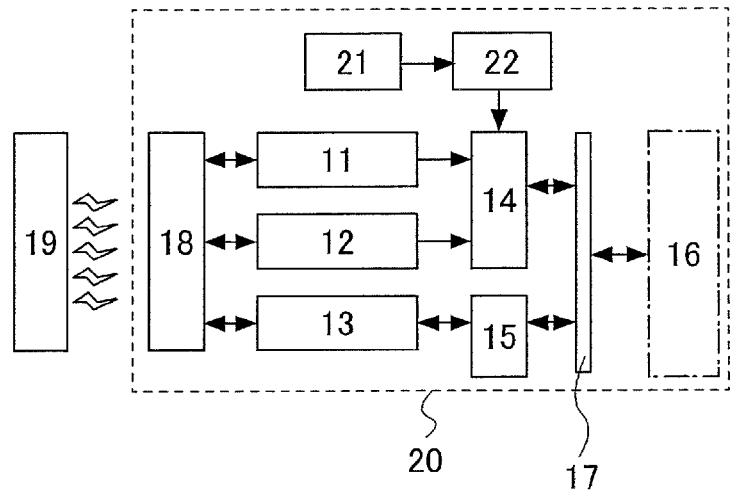
FIGS. 21A and 21B show an electronic device to which the present invention can be applied.

Structure of a semiconductor device of this embodiment mode will be described using FIG. 21A. As shown in FIG. 21A, a semiconductor device 20 of the present invention has a function of communicating data in a non-contact manner, which includes a power supply circuit 11, a clock generating circuit 12, a data modulating-demodulating circuit 13, a controlling circuit 14 for controlling another circuit, an interface circuit 15, a memory circuit 16, a data bus 17, and an antenna (an antenna coil) 18, a sensor 21, and a sensor circuit 22.

The power supply circuit 11 is a circuit generating various power supplies to be supplied to each circuit in the semiconductor device 20 based on an alternating signal input from the antenna 18. The clock generating circuit 12 is a circuit generating various clock signals to be supplied to each circuit in the semiconductor device 20 based on an alternating signal input from the antenna 18. The data modulating-demodulating circuit 13 has a function of modulating and demodulating data to be communicated with a reader-writer 19. The controlling circuit 14 has a function of controlling the memory circuit 16. The antenna 18 has a function of transmitting and receiving an electromagnetic wave or an electric wave. The reader-writer 19 communicates with the semiconductor device, controls the semiconductor device, and controls processing of the data thereof. The semiconductor device is not limited to the above structure; for example, another element such as a limiter circuit of power supply voltage or hardware dedicated for code processing may be added.

The memory circuit 16 includes a memory element in which an organic compound layer or a phase-change layer is sandwiched between a pair of conductive layers. Note that the memory circuit 16 may include only the memory element in which an organic compound layer or a phase-change layer is sandwiched between a pair of conductive layers or include a memory circuit having another structure. The memory circuit having another structure corresponds, for example, to one or a plurality of a DRAM, an SRAM, a FeRAM, a mask ROM, a PROM, an EPROM, an EEPROM, and a flash memory.

The sensor 21 is formed from a semiconductor circuit such as a resistor element, a capacitive coupling element, an inductive coupling element, a photovoltaic element, a photoelectric conversion element, a thermoelectric conversion element, a transistor, a thermistor, or a diode. By the sensor circuit 22, a change of impedance, reactance, inductance, voltage, or current, is detected and is subjected to analog-digital conversion (A/D conversion), so that a signal is output to the controlling circuit 14.

Embodiment Mode 19

According to the present invention, a semiconductor device functioning as a chip having a processor circuit (hereinafter also called a processor chip, a wireless chip, a wireless processor, a wireless memory, a wireless tag or an RFID tag) can be formed. The application range of the semiconductor device of the present invention is wide. For example, the semiconductor device of the present invention can be used by providing for an object such as paper money, coins, securities, certificates, bearer bonds, packing containers, books, recording media, personal belongings, vehicles, food, clothing, health products, commodities, medicine, electronic devices, and the like.

The semiconductor device having a memory element using the present invention has good adhesion inside the memory element; therefore, a peeling and transfer process can be performed with a good state. Therefore, an element can be transferred can be freely performed to various types of substrates, and therefore, an inexpensive material can also be selected for a substrate, so that the semiconductor device can be manufactured at low cost as well as a wide function in accordance with the intended purpose can be given. Therefore, the chip having a processor circuit has also such features as low-cost, small and thin size, and light-weight according to the present invention, and thus is suitable for currency, coins circulating widely, or books, personal belongings, clothing, or the like which tend to be carried.

Figure 29A:
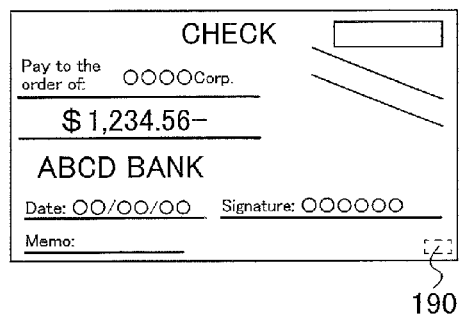
FIGS. 29A to 29G each show a semiconductor device to which the present invention can be applied.
Figure 29B:
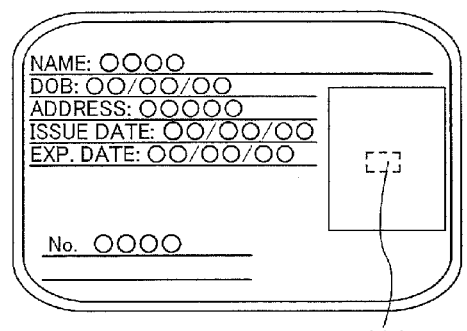
Figure 29C:
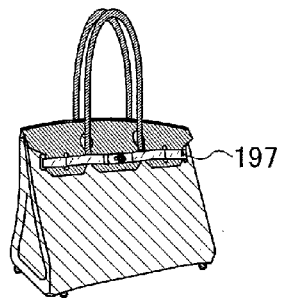
Figure 29D:
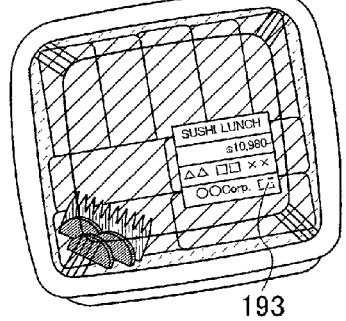
Figure 29E:
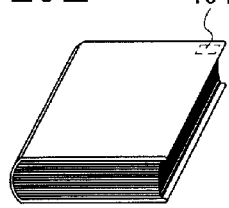
Figure 29F:
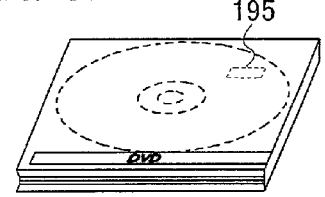
Figure 29G:
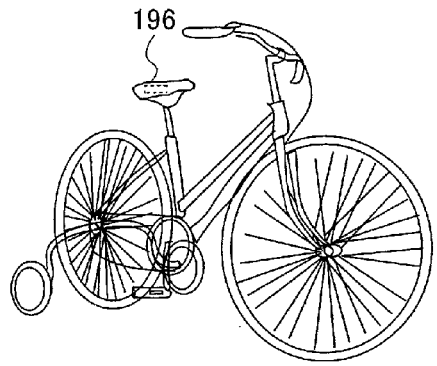

Paper money and coins are money circulated in the market and include in its category ones (cash vouchers) valid in a certain area similarly to currency, memorial coins, and the like. Securities refer to checks, certificates, promissory notes, and the like, and can be provided with a chip 190 having a processor circuit (FIG. 29A). Certificates refer to driver's licenses, certificates of residence, and the like, and can be provided with a chip 191 having a processor circuit (FIG. 29B). Personal belongings refer to bags, glasses, and the like, and can be provided with a chip 197 having a processor circuit (FIG. 29C). Bearer bonds refer to stamps, rice coupons, various gift certificates, and the like. Packing containers refer to wrapping paper for food containers and the like, plastic bottles, and the like, and can be provided with a chip 193 having a processor circuit (FIG. 29D). Books refer to hardbacks, paperbacks, and the like, and can be provided with a chip 194 having a processor circuit (FIG. 29E). Recording media refer to DVD software, video tapes, and the like, and can be provided with a chip 195 having a processor circuit (FIG. 29F). Vehicles refer to wheeled vehicles such as bicycles, ships, and the like, and can be provided with a chip 196 having a processor circuit (FIG. 29G). Food refers to food articles, drink, and the like. Clothing refers to clothes, footwear, and the like. Health products refer to medical instruments, health instruments, and the like. Commodities refer to furniture, lighting equipment, and the like. Medicine refers to medical products, pesticides, and the like. Electronic devices refer to liquid crystal display devices, EL display devices, television devices (TV sets and thin TV sets), cellular phones, and the like.

The semiconductor device of the present invention is fixed on such an article by being mounted onto a printed-circuit board, by being attached to a surface thereof, or by being embedded therein. For example, in the case of a book, the semiconductor device may be embedded in paper thereof; in the case of a package made from an organic resin, the semiconductor device may be embedded in the organic resin. The semiconductor device of the present invention which can realize small and thin size and light weight does not damage the design of an article itself even after being fixed on the article. Further, by providing the semiconductor device of the present invention for paper money, coins, securities, certificates, bearer bonds, or the like, an identification function can be provided, and forgery can be prevented by utilizing the identification function. Further, efficiency of a system such as an inspection system can be improved by providing the semiconductor device of the present invention for packing containers, recording media, personal belongings, food, clothing, commodities, electronic devices, or the like.

Figure 21B:
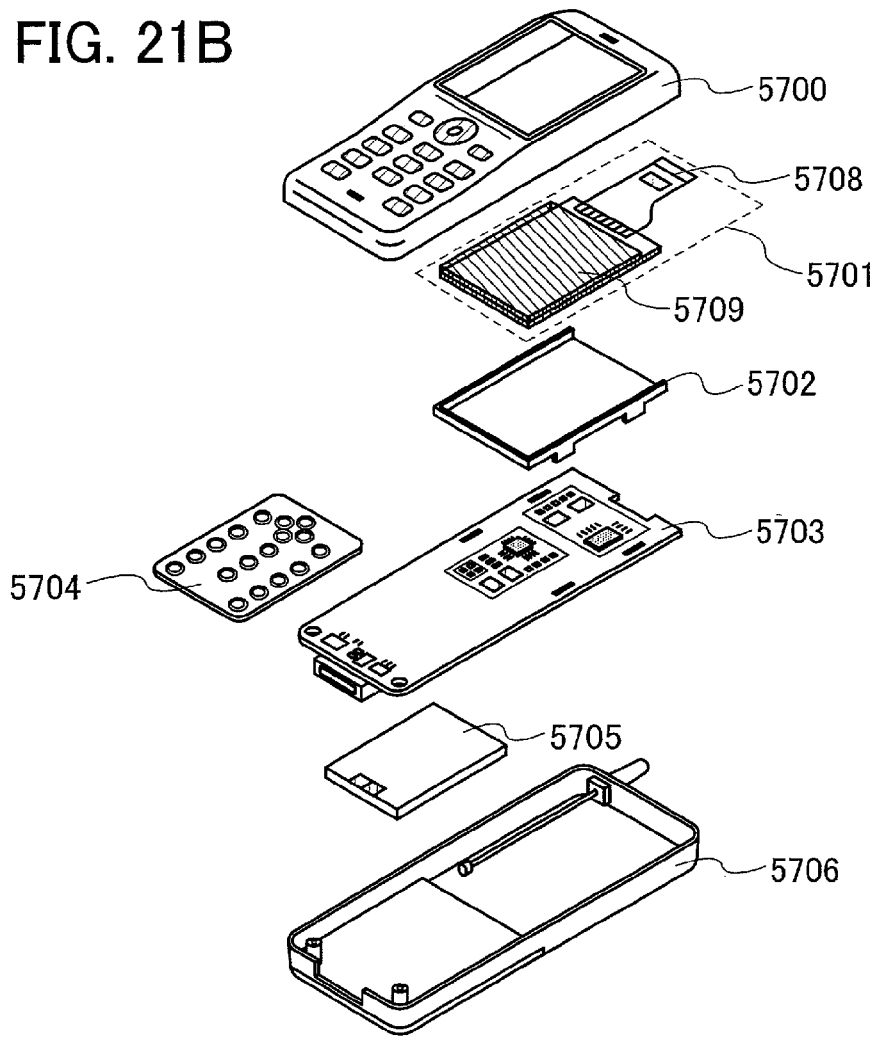

Next, one mode of the electronic device on which the semiconductor device of the present invention has been mounted will be described with reference to the drawing. The electronic device exemplified here is a cellular phone, which includes casings 5700 and 5706, a panel 5701, a housing 5702, a printed-wiring board 5703, operation buttons 5704, and a battery 5705 (FIG. 21B). The panel 5701 is detachably incorporated in the housing 5702, and the housing 5702 is fitted into the printed-wiring board 5703. The shape and size of the housing 5702 is changed appropriately in accordance with the electronic device into which the panel 5701 is incorporated. On the printed-wiring board 5703, a plurality of packaged semiconductor devices are mounted; the semiconductor device of the present invention can be used as one of the packaged semiconductor devices. The plurality of semiconductor devices mounted on the printed-wiring board 5703 have any function of a controller, a central processing unit (CPU), a memory, a power supply circuit, an audio processing circuit, a sending/receiving circuit, and the like.

The panel 5701 is connected to the printed-wiring board 5703 via a connection film 5708. The above-described panel 5701, housing 5702, and printed-wiring board 5703 are contained together with the operation buttons 5704 and the battery 5705, inside the casings 5700 and 5706. A pixel portion 5709 in the panel 5701 is provided so as to be viewed through an opening window provided in the casing 5700.

As described above, the semiconductor device of the present invention has features of small and thin size, and light-weight. The features make it possible to efficiently use the limited space inside the casings 5700 and 5706 of the electronic device.

It is to be noted that the shapes of the casings 5700 and 5706 are just an example of exterior shape of the cellular phone; the electronic devices of this embodiment mode can be changed into various modes in accordance with the function or application This application is based on Japanese Patent Application serial no. 2006-058513 filed in Japan Patent Office on Mar. 3, 2006 the entire contents of which are hereby incorporated by reference.

What is claimed is:

1. A backlight module comprising:
   a substrate;
   a first light-emitting diode provided over the substrate;
   a second light-emitting diode provided over the substrate;
   a common conductive layer over the substrate, the common conductive layer being light-reflective;
   an insulating layer over the common conductive layer; and
   a wiring layer over the insulating layer and the common conductive layer, wherein a first terminal of the first light-emitting diode and a first terminal of the second light-emitting diode are electrically connected to the common conductive layer through openings provided in the insulating layer, wherein a second terminal of the first light-emitting diode is electrically connected to a second terminal of the second light-emitting diode through the wiring layer, and wherein the first light-emitting diode and the second light-emitting diode are configured to emit light of a same color.

2. The backlight module according to claim 1,
wherein the first terminal of the first light-emitting diode is electrically connected to the common conductive layer through a first anisotropic conductive layer, and
wherein the second terminal of the first light-emitting diode is electrically connected to the wiring layer through a second anisotropic conductive layer.

3. The backlight module according to claim 1,
wherein the first terminal of the first light-emitting diode is electrically connected to the common conductive layer through a first conductive paste, and
wherein the second terminal of the first light-emitting diode is electrically connected to the wiring layer through a second conductive paste.

4. The backlight module according to claim 1,
wherein the first light-emitting diode and the second light-emitting diode are provided over the wiring layer.

5. The backlight module according to claim 1,
wherein the substrate is a flexible substrate.

6. The backlight module according to claim 1,
wherein the backlight module is a sidelight type backlight module.

7. A liquid crystal display device including the backlight module according to claim 1.

8. The backlight module according to claim 1,
wherein the first light-emitting diode and the second light-emitting diode are adjacent diodes in a column of a matrix of diodes provided over the substrate.

9. A backlight module comprising:
a substrate;
a first light-emitting diode provided over the substrate;
a second light-emitting diode provided over the substrate;
a common conductive layer over the substrate, the common conductive layer being light-reflective;
an insulating layer over the common conductive layer; and
a wiring layer over the insulating layer and the common conductive layer,
wherein a first terminal of the first light-emitting diode and a first terminal of the second light-emitting diode are electrically connected to the common conductive layer through openings provided in the insulating layer,
wherein a second terminal of the first light-emitting diode is electrically connected to a second terminal of the second light-emitting diode through the wiring layer,
wherein the first light-emitting diode and the second light-emitting diode are configured to emit light of a same color, and
wherein an interval between the first light-emitting diode and the second light-emitting diode is more than twice as large as a thickness of each of the first light-emitting diode and the second light-emitting diode.

10. The backlight module according to claim 9,
wherein the first terminal of the first light-emitting diode is electrically connected to the common conductive layer through a first anisotropic conductive layer, and
wherein the second terminal of the first light-emitting diode is electrically connected to the wiring layer through a second anisotropic conductive layer.

11. The backlight module according to claim 9,
wherein the first terminal of the first light-emitting diode is electrically connected to the common conductive layer through a first conductive paste, and
wherein the second terminal of the first light-emitting diode is electrically connected to the wiring layer through a second conductive paste.

12. The backlight module according to claim 9,
wherein the first light-emitting diode and the second light-emitting diode are provided over the wiring layer.

13. The backlight module according to claim 9,
wherein the substrate is a flexible substrate.

14. The backlight module according to claim 9,
wherein the backlight module is a sidelight type backlight module.

15. A liquid crystal display device including the backlight module according to claim 9.

16. The backlight module according to claim 9,
wherein the first light-emitting diode and the second light-emitting diode are adjacent diodes in a column of a matrix of diodes provided over the substrate.

17. A backlight module comprising:
a substrate;
a first light-emitting diode provided over the substrate;
a second light-emitting diode provided over the substrate;
a common conductive layer over the substrate, the common conductive layer being light-reflective;
an insulating layer over the common conductive layer;
a wiring layer over the insulating layer and the common conductive layer;
a first resin layer covering the first light-emitting diode; and
a second resin layer covering the second light-emitting diode,
wherein a first terminal of the first light-emitting diode and a first terminal of the second light-emitting diode are electrically connected to the common conductive layer through openings provided in the insulating layer,
wherein a second terminal of the first light-emitting diode is electrically connected to a second terminal of the second light-emitting diode through the wiring layer,
wherein the first light-emitting diode and the second light-emitting diode are configured to emit light of a same color, and
wherein an interval between the first resin layer and the second resin layer is more than twice as large as a maximum thickness of each of the first resin layer and the second resin layer.

18. The backlight module according to claim 17,
wherein the first terminal of the first light-emitting diode is electrically connected to the common conductive layer through a first anisotropic conductive layer, and
wherein the second terminal of the first light-emitting diode is electrically connected to the wiring layer through a second anisotropic conductive layer.

19. The backlight module according to claim 17,
wherein the first terminal of the first light-emitting diode is electrically connected to the common conductive layer through a first conductive paste, and
wherein the second terminal of the first light-emitting diode is electrically connected to the wiring layer through a second conductive paste.

20. The backlight module according to claim 17,
wherein the first light-emitting diode and the second light-emitting diode are provided over the wiring layer.

21. The backlight module according to claim 17,
wherein the backlight module is a sidelight type backlight module.

22. A liquid crystal display device including the backlight module according to claim 17.

23. The backlight module according to claim 17,
wherein the first light-emitting diode and the second light-emitting diode are adjacent diodes in a column of a matrix of diodes provided over the substrate.

24. A backlight module comprising:
a flexible substrate;
a first light-emitting diode provided over the flexible substrate;
a second light-emitting diode provided over the flexible substrate;
a common conductive layer over the flexible substrate, the common conductive layer being light-reflective;
an insulating layer over the common conductive layer;
a wiring layer over the insulating layer and the common conductive layer;
a first resin layer covering the first light-emitting diode; and
a second resin layer covering the second light-emitting diode,
wherein the first light-emitting diode and the second light-emitting diode are configured to emit light of a same color,
wherein a first terminal of the first light-emitting diode and a first terminal of the second light-emitting diode are electrically connected to the common conductive layer through openings provided in the insulating layer,
wherein a second terminal of the first light-emitting diode is electrically connected to a second terminal of the second light-emitting diode through the wiring layer, and
wherein an interval between the first resin layer and the second resin layer is more than twice as large as a maximum thickness of each of the first resin layer and the second resin layer.

25. The backlight module according to claim 24,
wherein the first terminal of the first light-emitting diode is electrically connected to the common conductive layer through a first anisotropic conductive layer, and
wherein the second terminal of the first light-emitting diode is electrically connected to the wiring layer through a second anisotropic conductive layer.

26. The backlight module according to claim 24,
wherein the first terminal of the first light-emitting diode is electrically connected to the common conductive layer through a first conductive paste, and
wherein the second terminal of the first light-emitting diode is electrically connected to the wiring layer through a second conductive paste.

27. The backlight module according to claim 24,
wherein the first light-emitting diode and the second light-emitting diode are provided over the wiring layer.

28. The backlight module according to claim 24,
wherein the backlight module is a sidelight type backlight module.

29. A liquid crystal display device including the backlight module according to claim 24.

30. The backlight module according to claim 24,
wherein the first light-emitting diode and the second light-emitting diode are adjacent diodes in a column of a matrix of diodes provided over the flexible substrate.

\* \* \* \* \*

UNITED STATES PATENT AND TRADEMARK OFFICE
CERTIFICATE OF CORRECTION

PATENT NO. : 8,823,023 B2
APPLICATION NO. : 13/542693
DATED : September 2, 2014
INVENTOR(S) : Yasuhiro Jinbo et al.

It is certified that error appears in the above-identified patent and that said Letters Patent is hereby corrected as shown below:

IN THE SPECIFICATION:

At column 1, line 66, "feinted" should be --formed--;

At column 3, line 4, "TED" should be --LED--;

At column 8, line 24, "minor," should be --mirror,--;

At column 9, line 24, "faulted" should be --formed--;

At column 11, line 65, "(TiO$_7$)," should be --(TiO$_2$),--;

At column 18, line 62, "farmed." should be --formed.--;

At column 20, line 26, "fixated" should be --formed--;

At column 25, line 33, "200µ" should be --20µ--;

At column 42, line 39, "funned" should be --formed--;

At column 43, line 9, "ANA" should be --Alq$_3$),--;

At column 43, line 13, "bis[2-(T-hydroxyphenyl)" should be --bis[2-(2'-hydroxyphenyl)--;

At column 44, line 6, "1BP)," should be --TBP),--;

At column 44, line 10, "etheny]-4H-pyran" should be --ethenyl]-4H-pyran--;

At column 44, line 41, "Ruined" should be --formed--;

At column 49, line 62, "pedal" should be --perform--;

At column 53, line 49, "fondled" should be --formed--;

At column 54, line 27, "fainted" should be --formed--;

At column 54, line 36, "fault" should be --form--;

At column 54, line 39, "fainted" should be --formed--;

At column 55, line 3, "farmed" should be --formed--;

At column 55, line 40, "cm$^2$N·sec" should be --cm$^2$/V·sec--;

At column 58, line 5, "fondled" should be --formed--;

Signed and Sealed this
Tenth Day of February, 2015

Michelle K. Lee
*Deputy Director of the United States Patent and Trademark Office*

CERTIFICATE OF CORRECTION (continued)
U.S. Pat. No. 8,823,023 B2

At column 59, line 22, "faulted" should be --formed--;

At column 60, line 58, "splayed" should be --sprayed--;

At column 64, line 23, "farmed." should be --formed.--;

At column 64, like 60, "(LT)" should be --(IJ)--;

At column 66, line 66, "faulted" should be --formed--.